(12) United States Patent
Hirano

(10) Patent No.: US 7,642,583 B2
(45) Date of Patent: Jan. 5, 2010

(54) FERROELECTRIC MEMORY DEVICE

(75) Inventor: Hiroshige Hirano, Nara (JP)

(73) Assignee: Panasonic Corporation, Osaka (JP)

( * ) Notice: Subject to any disclaimer, the term of this patent is extended or adjusted under 35 U.S.C. 154(b) by 274 days.

(21) Appl. No.: 10/554,541

(22) PCT Filed: Apr. 26, 2004

(86) PCT No.: PCT/JP2004/005991

§ 371 (c)(1),
(2), (4) Date: Oct. 25, 2005

(87) PCT Pub. No.: WO2004/097939

PCT Pub. Date: Nov. 11, 2004

(65) Prior Publication Data

US 2006/0208295 A1    Sep. 21, 2006

(30) Foreign Application Priority Data

Apr. 25, 2003   (JP) ............... 2003-121194

(51) Int. Cl.
*H01L 29/76* (2006.01)
*H01L 29/94* (2006.01)

(52) U.S. Cl. ............... 257/295; 257/296; 257/E27.084; 257/E27.098; 365/145; 365/149; 365/200; 365/203; 365/205

(58) Field of Classification Search ......... 257/295, 257/296, E27.084, E27.098; 365/145, 149, 365/200, 203, 205

See application file for complete search history.

(56) References Cited

U.S. PATENT DOCUMENTS

| 5,923,062 | A | * | 7/1999 | Ohno ................ 257/298 |
|---|---|---|---|---|
| 6,100,200 | A | * | 8/2000 | Van Buskirk et al. ....... 438/697 |
| 6,339,008 | B1 | | 1/2002 | Takenaka |
| 6,353,550 | B1 | | 3/2002 | Hirano |
| 6,548,844 | B1 | | 4/2003 | Fukuzumi et al. |
| 2001/0025976 | A1 | * | 10/2001 | Lee ........................ 257/296 |
| 2002/0070400 | A1 | * | 6/2002 | Shibuya et al. ............. 257/296 |
| 2002/0089870 | A1 | | 7/2002 | Honda |
| 2002/0096771 | A1 | * | 7/2002 | Yamada et al. ............. 257/758 |

(Continued)

FOREIGN PATENT DOCUMENTS

JP    2000-138349    5/2000

(Continued)

*Primary Examiner*—Kenneth A Parker
*Assistant Examiner*—Joseph Nguyen
(74) *Attorney, Agent, or Firm*—Wenderoth, Lind & Ponack, L.L.P.

(57) ABSTRACT

A ferroelectric memory device having plural memory cells, each composed of a memory cell transistor and a memory cell capacitor including a lower electrode that is independent for each memory cell capacitor, a ferroelectric layer formed on the lower electrode, and an upper electrode layer formed on the ferroelectric layer. A plurality of the upper electrode layers are connected together and constitute a plate electrode, and the width of the upper electrode is narrower than the width of the ferroelectric layer. Accordingly, by making the width of the upper electrode narrower than the width of the ferroelectric layer, it is possible to prevent current leakage between the upper electrode and the lower electrode, which reduces the placement interval of the memory cell capacitors without causing current leakage between the upper electrode and the lower electrode, and results in a smaller memory cell size.

10 Claims, 26 Drawing Sheets

U.S. PATENT DOCUMENTS

2002/0125523 A1 9/2002 Oh
2003/0057464 A1* 3/2003 Nam .......................... 257/295

FOREIGN PATENT DOCUMENTS

| JP | 2000-294743 | 10/2000 |
| JP | 2000-349248 | 12/2000 |
| JP | 2001-7303 | 1/2001 |
| JP | 2001-85632 | 3/2001 |
| JP | 2001-168292 | 6/2001 |
| JP | 2002-170935 | 6/2002 |
| JP | 2002-198494 | 7/2002 |

* cited by examiner

FERROELECTRIC MEMORY DEVICE

BACKGROUND OF THE INVENTION

1. Field of the Invention

The present invention relates to ferroelectric memory devices and, more particularly, to structures of memory cell capacitors in the ferroelectric memory devices.

2. Description of the Related Art

A ferroelectric memory has a memory cell structure that is composed of a ferroelectric capacitor (herein after, also referred to as a memory cell capacitor) which holds a polarity of an applied voltage as data, and an access transistor (herein after, also referred to as a memory cell transistor) which executes data access to the memory cell capacitor. As a method of processing this memory cell structure, Japanese Published Patent Application No. 2002-198494 discloses a method by which an upper electrode of the memory cell capacitor and a ferroelectric layer thereof are processed using the same mask, as an example.

FIG. 25($a$) is a diagram for explaining a conventional ferroelectric memory device, and shows a layout of electrodes of ferroelectric capacitors which constitute memory cells. FIG. 25($b$) is a cross-sectional view along the line XXVa-XXVa of FIG. 25($a$), and illustrates a cross-sectional structure of the ferroelectric capacitor.

The conventional ferroelectric memory device 100 has plural memory cells each composed of a memory cell capacitor 100$a$ and a memory cell transistor (not shown). The ferroelectric capacitor 100$a$ is composed of a lower electrode 12 formed on the substrate (not shown), a ferroelectric layer 13 formed on the lower electrode 12, and an upper electrode formed on the ferroelectric layer 13.

The lower electrodes 12 of the respective memory cell capacitors are independent of the respective memory cell capacitors. The lower electrodes 12 of the respective memory capacitors are arranged in a matrix on a memory cell array (not shown) of the ferroelectric memory device 100 along a first direction (herein after, also referred to as "a horizontal direction") D1 and a second direction (herein after, also referred to as "a vertical direction") D2.

The ferroelectric layer 13 is common to a certain number of memory cells which are arranged along the vertical direction D2, and it extends in the vertical direction D2 across the plural lower electrodes 12 which are arranged along the vertical direction D2.

The upper electrode 14 is common to a certain number of memory cells which are arranged along the vertical direction D2, like the ferroelectric layer 13. This upper electrode extends in the vertical direction D2 across the plural lower electrodes 12 which are arranged along the vertical direction D2, and it constitutes a plate electrode corresponding to each of the lower electrode arrays along the vertical direction D2.

Next, the step of processing the memory cell structure will be briefly described.

Initially, after an insulating film (not shown) is formed on a semiconductor substrate (not shown) on which memory cell transistors are formed, a contact 1 is formed in the insulating film, and then a lower electrode layer is formed on the entire surface. Then, the lower electrode layer is processed so as to be separated into lower electrodes 12 of the respective memory cell capacitors. Thereafter, a ferroelectric layer and an upper electrode layer are successively formed thereon, and these layers are processed using the same mask, thereby forming plate electrodes each comprising the ferroelectric layer 13 and the upper electrode 14.

In this conventional memory cell structure processing method, since the upper electrode and the ferroelectric layer are processed using the same mask, it is required that the upper electrode 14 should be processed to have a larger width than that of the lower electrode 12, as shown in FIG. 25($a$), so as not to cause current leakage between the upper electrode and the lower electrode. This also becomes an obstruction to reduction of the memory cell.

That is, as the upper electrodes 14 are each disposed on an uneven ground plane due to the thickness of the lower electrode 12, the minimum placement interval of the upper electrodes 14 needs to be larger than the minimum placement interval of the lower electrodes 12 which are placed on an even ground plane, depending on conditions in processing the upper electrodes 14. In such cases, the interval of memory cell capacitors, i.e., the interval d12 between areas at which the upper electrode 14 and the lower electrode 12 are overlapped with each other has a dimension that is obtained by summing the minimum placement interval d14 of the upper electrodes and the distance 2·Δd by which the right or left edge of the upper electrode protrude from the right or left edge of the lower electrode. This placement interval d12 (=d14+2·Δd) would be quite larger than the minimum placement interval of the lower electrodes 12.

Further, the structure of the memory cell capacitor is not limited to the above-mentioned planar type structure that is formed by successively laminating a lower electrode, a ferroelectric layer, and an upper electrode on a substrate, but the memory cell capacitor may have a three-dimensional type structure, i.e., a three-dimensional structure that is formed by laminating a lower electrode, a ferroelectric layer, and an upper electrode in a recessed portion having a rectangular opening that is formed in an insulating layer.

FIG. 26($a$) is a diagram for explaining a conventional ferroelectric memory device in which memory cell capacitors have three-dimensional structures, and shows a layout of electrodes of ferroelectric capacitors that constitute memory cells. FIG. 26($b$) and FIG. 26($c$) are a cross-sectional view along the line XXVIa-XXVIa and a cross-sectional view along the line XXVIb-XXVIb of FIG. 26($a$), respectively, and show cross-sectional structures of the ferroelectric capacitors.

This ferroelectric memory device 200 has plural memory cells each composed of a memory cell capacitor 200$a$ having a three-dimensional structure and a memory cell transistor (not shown).

The memory cell capacitor 200$a$ of such three-dimensional structure is produced by creating a through hole having a rectangular opening and reaching the lower electrode in an inter layer insulating film on the lower electrode, and successively forming a base electrode layer, a ferroelectric layer, and an upper electrode layer on the inter layer insulating film in such a manner that these layers are laminated on inner walls of the through hole and limb portions of the through hole opening.

That is, the memory cell capacitor 200$a$ of three-dimensional structure is composed of a lower electrode 22 formed on a substrate (not shown), a base electrode layer 25 formed in a through hole of an inter layer insulating film (not shown) and on limb portions on the lower electrode 22, a ferroelectric layer 23 formed on the base electrode layer 25, and an upper electrode 24 formed on the ferroelectric layer 23. In this figure, reference numeral 200$b$ denotes a recessed portion that is formed on the surface of the memory cell capacitor 200$a$ having the three-dimensional structure.

In the case of the memory cell capacitor having such a three-dimensional structure, however, when the size of the through hole opening formed on the inter layer insulating film is reduced to reduce the memory cell size, it becomes difficult to thinly produce the electrode layers or the ferroelectric layer on the through hole inner walls by the typical film formation process such as sputtering or vapor deposition, and consequently, the capacitance of the memory cell capacitor has become unfavorably greatly reduced. This also has become an obstruction to the reduction of the memory cell size.

The present invention is made to solve the above-mentioned problems, and has for its object to provide a ferroelectric memory device that can reduce the placement interval of the memory cell capacitors and realize a reduced memory size, without occurring current leakages between the upper electrode and the lower electrode in a memory cell capacitor having a planer structure, or characteristics deterioration in a the memory cell capacitor having a three-dimensional structure.

BRIEF DISCLOSURE OF THE INVENTION

According to a first aspect of the present invention, there is provided a ferroelectric memory device having plural memory cells each composed of a memory cell transistor and a memory cell capacitor, in which the respective memory cell capacitor comprises: a lower electrode that is connected to a bit line via the memory cell transistor; a ferroelectric layer that is formed on an upper surface of the lower electrode with a width direction that is equal to the width direction of the lower electrode; and an upper electrode that is formed on an upper surface of the ferroelectric layer with a width direction that is equal to the width direction of the lower electrode, the lower electrode of the respective memory cell capacitor is an electrode independent for each memory cell capacitor, the upper electrode for the respective memory cell capacitors constitutes a plate electrode that is common for the plural memory cell capacitors, and the width of the upper electrode is smaller than the width of the ferroelectric layer.

According to the first aspect of the invention, since the width of the upper electrode of the memory cell capacitor is smaller than the width of the ferroelectric layer, it is possible to suppress leakage currents from occurring between the upper electrode and the lower electrode in the memory cell capacitor. Thereby, it is possible to reduce the placement intervals between the memory cell capacitors with suppressing leakage currents between the upper electrode and the lower electrode, thereby resulting in a small memory cell size.

According to a second aspect of the present invention, in the ferroelectric memory device as defined in the first aspect, the width of the lower electrode is smaller than the width of the ferroelectric layer.

According to the second aspect, since the width of the lower electrode of the memory cell capacitor is made smaller than the width of the ferroelectric layer in the memory cell capacitor, it is possible to further suppress occurrences of leakage currents between the upper electrode and the lower electrode in the memory cell capacitor.

According to a third aspect of the present invention, in the ferroelectric memory device as defined in the second aspect, the upper electrode and the lower electrode have approximately same widths, and the upper electrode and the lower electrode are located at approximately aligned positions with each other.

According to the third aspect, since the upper electrode and the lower electrode of the memory cell capacitor have approximately the same widths and the upper electrode and the lower electrode are located approximately overlapped with each other, it is possible to reduce unused area on the memory cell array, which would not operate as a capacitance element of a memory cell capacitor.

According to a fourth aspect of the present invention, in the ferroelectric memory device as defined in the second aspect, the upper electrode and the lower electrode have approximately the same widths, and the upper electrode and the lower electrode are located respectively at different positions in their width directions.

According to the fourth aspect, since the upper electrode and the lower electrode have the same widths and are located shifted with each other, it is possible to adjust the capacitance of the memory cell capacitor by the shift amount shifting between the upper electrode and the lower electrode.

According to a fifth aspect of the present invention, there is provided a ferroelectric memory device having plural memory cells each composed of a memory cell transistor and a memory cell capacitor, in which the respective memory cell capacitor comprises: a lower electrode that is connected to a bit line via the memory cell transistor; a ferroelectric layer that is formed on an upper surface of the lower electrode; and an upper electrode that is formed on an upper surface of the ferroelectric layer, and the lower electrode of the respective memory cell capacitor is an electrode independent for each memory cell capacitor, the upper electrode of the respective memory cell capacitor constitutes a plate electrode that is common for the plural memory cell capacitors, one edge of the upper electrode approximately aligns with an edge of the ferroelectric layer, and the other edge of the upper electrode is innerly located, with respect to the ferroelectric layer.

According to the fifth aspect, since the lower electrode of the memory cell capacitor is placed so that the edge thereof is innerly located with respect to the ferroelectric layer, it is possible to suppress occurrences of leakage currents between the upper electrode and the lower electrode.

According to a sixth aspect of the present invention, in the ferroelectric memory device as defined in the fifth aspect of the invention, one edge of the lower electrode approximately aligns with one edge of the upper electrode.

According to the sixth aspect, since the position of one edge of the lower electrode of the memory cell capacitor approximately aligns with one edge of the upper electrode. Therefore, it is possible to reduce the memory cell size by matching the placement intervals between the upper electrodes with the placement intervals between the lower electrodes.

According to a seventh aspect of the present invention, there is provided a ferroelectric memory device having plural memory cells each composed of a memory cell transistor and a memory cell capacitor, in which each of the respective memory cell capacitors comprises: a lower electrode that is connected to a bit line via the memory cell transistor; a ferroelectric layer that is formed on an upper surface of the lower electrode; and an upper electrode that is formed on an upper surface of the ferroelectric layer, and the lower electrode of the respective memory cell capacitor is an electrode that is independent for each memory cell capacitor, the upper electrode of the respective memory cell capacitor constitutes a plate electrode that is commonly used for the plural memory cell capacitors, one edge of the upper electrode approximately aligns with an edge of the ferroelectric layer, the other edge of the upper electrode is innerly located with respect to the ferroelectric layer, and the other edge of the lower electrode is innerly located with respect to the ferroelectric layer, and the other edge of the lower electrode approximately aligns with the edge of the ferroelectric layer.

According to the seventh aspect, one edge of the upper electrode is innerly located inner with respect to the ferroelectric layer while one edge of the lower electrode is innerly located inner with respect to the ferroelectric layer, and further one edge of the ferroelectric layer aligns with the other edge of the upper electrode while the other edge of the ferroelectric layer aligns with the other edge of the lower electrode. Therefore, a circumference distance from one edge of the upper electrode to one edge of the lower electrode becomes the largest, thereby it is possible to further suppress occurrences of the leakage currents.

According to an eighth aspect of the present invention, in the ferroelectric memory device as defined in the first aspect, the lower electrode has a groove-type structure.

According to the eighth aspect, since the lower electrode of the memory cell capacitor has a groove-type structure, it is possible to increase the capacitance of the memory cell capacitor without increasing an area on the memory cell arrays that is occupied by the memory cell capacitors.

Further, the three-dimensional structure of the memory cell capacitor as a groove-type structure makes it easy to carry out the processing for forming a recessed portion in an inter layer insulating film relative to the conventional hole-type three-dimensional structure memory cell capacitor as well as enables producing a ferroelectric layer on this recessed portion to be thin. As a result, it is possible to achieve a memory cell capacitor of three-dimensional structure that can be easily processed and can have an increased capacitance.

According to a ninth aspect of the present invention, in the ferroelectric memory device as defined in the eighth aspect, the groove formed in the lower electrode extends along a direction that is parallel to a direction along which the upper electrode extends.

According to the ninth aspect, a groove formed in the lower electrode in the memory cell capacitor extends in a direction that is parallel to the direction along which the upper electrode extends. Therefore, the edges of the upper electrode do not extend over the groove, thereby greatly easing the processing of the upper electrode.

According to a tenth aspect of the present invention, in the ferroelectric memory device as defined in the eighth as aspect, the groove formed in the lower electrode extends along a direction that is perpendicular to a direction along which the upper electrode extends.

According to the tenth aspect, a groove formed in the lower electrode in the memory cell capacitor extends along a direction that is perpendicular to the direction along which the upper electrode extends. Therefore, by making an area in which the upper electrode and the lower electrode oppose each other in a plane shape that is longer in a direction perpendicular to the direction along which the upper electrode extends, the capacitance of the capacitor can be effectively increased.

According to an eleventh aspect of the present invention, there is provided a ferroelectric memory device having plural memory cells each composed of a memory cell transistor and a memory cell capacitor, in which each memory cell capacitor comprises: a lower electrode that is connected to a bit line via the memory cell transistor; a ferroelectric layer that is formed on an upper surface of the lower electrode; and an upper electrode that is formed on an upper surface of the ferroelectric layer, wherein the lower electrode of the respective memory cell capacitor is an electrode having a groove-type structure that is independent for each memory cell capacitor, and wherein the upper electrode of the respective memory cell capacitor constitutes a plate electrode that is commonly used for the plural memory cell capacitors.

According to the eleventh aspect, since the lower electrode of the memory cell capacitor has a groove-type structure, it is possible to increase the capacitance of the memory cell capacitor without increasing an area on the memory cell arrays that is occupied by the memory cell capacitors.

Further, the three-dimensional structure of the memory cell capacitor as a groove-type structure makes it easy to carry out the processing for forming a recessed portion in an inter layer insulating film relative to the conventional hole-type three-dimensional structure memory cell capacitor as well as enables producing a ferroelectric layer on this recessed portion to be thin. As a result, it is possible to achieve a memory cell capacitor of three-dimensional structure that can be easily processed and can have an increased capacitance.

According to a twelfth aspect of the present invention, in the ferroelectric memory device as defined in the eleventh aspect, a groove formed in the lower electrode extends along a direction that is parallel to a direction along which the upper electrode extends.

According to the twelfth aspect, a groove formed in the lower electrode of the memory cell capacitor extends along a direction that is parallel to the direction along which the upper electrode extends. Therefore, the edges of the upper electrode do not extend over the groove, thereby easing the processing of the upper electrode.

According to a thirteenth aspect of the present invention, in the ferroelectric memory device as defined in the eleventh aspect, the groove formed in the lower electrode extends along a direction that is perpendicular to a direction along which the upper electrode extends.

According to the thirteenth aspect, a groove formed in the lower electrode of the memory cell capacitor extends in a direction that is perpendicular to the direction along which the upper electrode extends. Therefore, by making an area in which the upper electrode and the lower electrode oppose each other in a plane shape that is longer in a direction perpendicular to the direction along which the upper electrode extends, the capacitance of the memory cell capacitor can be effectively increased.

According to a fourteenth aspect of the present invention, in the ferroelectric memory device as defined in the eleventh aspect, the lower electrode having the groove-type structure comprises: a first lower electrode section in a planar shape that constitutes a bottom part of the groove, and a second lower electrode section that constitutes side surface parts and opening circumference parts of the groove.

According to the fourteenth aspect, since the lower electrode that has the groove-type structure, comprises a first lower electrode section in a planar shape that constitutes the bottom part of the groove, and a second lower electrode section which constitutes the side surface parts and opening circumference parts of the groove, it is possible to form the electrode portions under the same conditions on the bottom part, the side surface parts, and the opening limb parts of the groove, thereby enabling to make uniform the thickness and the characteristics of the conductive film that constitutes the electrode portions.

According to a fifteenth aspect of the present invention, in the ferroelectric memory device as defined in the eleventh aspect, the lower electrode having the groove-type structure comprises: a first lower electrode section that constitutes a bottom part of the groove; and a second lower electrode section that constitutes only side surface parts of the groove.

According to the fifteenth aspect, since the lower electrode having the groove-type structure comprises a first lower electrode section that constitutes the bottom part of the groove, and a second lower electrode section that constitutes only the side surface parts of the groove, it is possible to reduce a part of the lower electrode section, the part being a part that unfavorably comes into contact with the upper electrode when the upper electrode layer is patterned and would cause leakage currents.

BRIEF DESCRIPTION OF THE DRAWINGS

FIG. 1(b) is a cross-sectional view along the line Ia-Ia of FIG. 1(a), and shows a cross-sectional structure of the ferroelectric capacitor 101a.

FIG. 2(b) is a cross-sectional view along the line IIa-IIa of FIG. 2(a), and shows a cross-sectional structure of the ferroelectric capacitor 102a.

FIG. 3(b) is a cross-sectional view along the line IIIa-IIIa of FIG. 3(a), and shows a cross-sectional structure of the ferroelectric capacitor 103a.

FIG. 4(b) is a cross-sectional view along the line IVa-IVa of FIG. 4(a), and shows a cross-sectional structure of the ferroelectric capacitor 104a.

FIG. 5(b) is a cross-sectional view along the line Va-Va of FIG. 5(a), and shows a cross-sectional structure of the ferroelectric capacitor 105a.

FIG. 6(b) is a cross-sectional view along the line VIa-VIa of FIG. 6(a), and shows a cross-sectional structure of the ferroelectric capacitor 106a.

FIG. 7(b) is a cross-sectional view along the line VIIa-VIIa of FIG. 7(a), and shows a cross-sectional structure of the ferroelectric capacitor 107a.

FIG. 8(b) is a cross-sectional view along the line VIIIa-VIIIa of FIG. 8(a), and shows a cross-sectional structure of the ferroelectric capacitor 108a.

FIG. 9(b) is a cross-sectional view along the line IXa-IXa of FIG. 9(a), and shows a cross-sectional structure of the ferroelectric capacitor 109a.

FIG. 10(b) is a cross-sectional view along the line Xa-Xa of FIG. 10(a), and shows a cross-sectional structure of the ferroelectric capacitor 110a.

FIG. 11(b) is a cross-sectional view along the line XIa-XIa of FIG. 11(a), and shows a cross-sectional structure of the ferroelectric capacitor 111a.

FIG. 12(b) is a cross-sectional view along the line XIIa-XIIa of FIG. 12(a), and shows a cross-sectional structure of the ferroelectric capacitor 112a.

FIG. 13(b) and FIG. 13(c) are a cross-sectional view along the line XIIIa-XIIIa of FIG. 13(a) and a cross-sectional view along the line XIIIb-XIIIb of FIG. 13(a), respectively, and show cross-sectional structures of the ferroelectric capacitor 113a.

FIG. 14(b) and FIG. 14(c) are a cross-sectional view along the line XIVa-XIVa of FIG. 14(a), and a cross-sectional view along the line XIVb-XIVb of FIG. 14(a), respectively, and show cross-sectional structures of the ferroelectric capacitor 114a.

FIG. 15(b) and FIG. 15(c) are a cross-sectional view along the line XVa-XVa of FIG. 15(a), and a cross-sectional view along the line XVb-XVb of FIG. 15(a), respectively, and show cross-sectional structures of the ferroelectric capacitor 115a.

FIG. 16(b) and FIG. 16(c) are a cross-sectional view along the line XVIa-XVIa of FIG. 16(a), and a cross-sectional view along the line XVIb-XVIb of FIG. 16(a), respectively, and show cross-sectional structures of the ferroelectric capacitor 116a.

FIG. 17(b) and FIG. 17(c) are a cross-sectional view along the line XVIIa-XVIIa of FIG. 17(a), and a cross-sectional view along the line XVIIb-XVIIb of FIG. 17(a), respectively, and show cross-sectional structures of the ferroelectric capacitor 117a.

FIG. 18(b) and FIG. 18(c) are a cross-sectional view along the line XVIIIa-XVIIIa of FIG. 18(a) and a cross-sectional view along the line XVIIIb-XVIIIb of FIG. 18(a), respectively, and show cross-sectional structures of the ferroelectric capacitor 118a.

FIG. 19(b) and FIG. 19(c) are a cross-sectional view along the line XIXa-XIXa of FIG. 19(a) and a cross-sectional view along the line XIXb-XIXb of FIG. 19(a), respectively, and show cross-sectional structures of the ferroelectric capacitor 119a.

FIG. 20(b) and FIG. 20(c) are a cross-sectional view along the line XXa-XXa of FIG. 20(a) and a cross-sectional view along the line XXb-XXb of FIG. 20(a), respectively, and show cross-sectional structures of the ferroelectric capacitor 120a.

FIG. 21(a) is a diagram for explaining a ferroelectric memory device 121 according to a twenty-first embodiment of the present invention, and shows a layout of electrodes of ferroelectric capacitors 121a that constitute memory cells.

FIG. 21(b) and FIG. 21(c) are a cross-sectional view along the line XXIa-XXIa of FIG. 21(a) and a cross-sectional view along the line XXIb-XXIb of FIG. 21(a), respectively, and show cross-sectional structures of the ferroelectric capacitor 121a.

FIG. 22(b) and FIG. 22(c) are a cross-sectional view along the line XXIIa-XXIIa of FIG. 22(a) and a cross-sectional view along the line XXIIb-XXIIb of FIG. 22(a), respectively, and show cross-sectional structures of the ferroelectric capacitor 122a.

FIG. 23(b) and FIG. 23(c) are a cross-sectional view along the line XXIIIa-XXIIIa of FIG. 23(a) and a cross-sectional view along the line XXIIIb-XXIIIb of FIG. 23(a), respectively, and show cross-sectional structures of the ferroelectric capacitor 123a.

FIG. 24(b) and FIG. 24(c) are a cross-sectional view along the line XXIVa-XXIVa of FIG. 24(a) and a cross-sectional view along the line XXIVb-XXIVb of FIG. 24(a), respectively, and show cross-sectional structures of the ferroelectric capacitor 124a.

FIG. 25(b) is a cross-sectional view along the line XXVa-XXVa of FIG. 25(a), and shows a cross-sectional structure of the ferroelectric capacitor 100a.

FIG. 26(b) and FIG. 26(c) are a cross-sectional view along the line XXVIa-XXVIa of FIG. 26(a) and a cross-sectional view along the line XXVIb-XXVIb of FIG. 26(a), respectively, and show cross-sectional structures of the ferroelectric capacitor 200a.

DETAILED DESCRIPTION OF THE INVENTION

Hereinafter, embodiments of the present invention will be described with reference to figures.

Embodiment 1

Figure 1A:
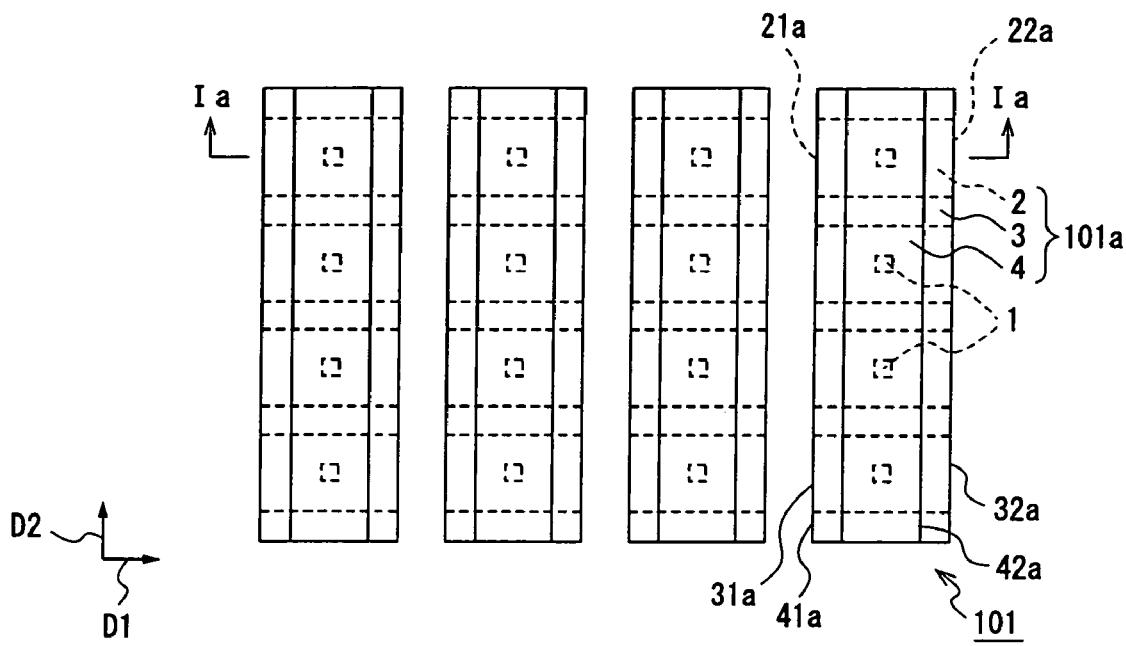
FIG. 1(a) is a diagram for explaining a ferroelectric memory device 101 according to a first embodiment of the present invention, and shows a layout of electrodes of ferroelectric capacitors 101a that constitute memory cells.
Figure 1B:
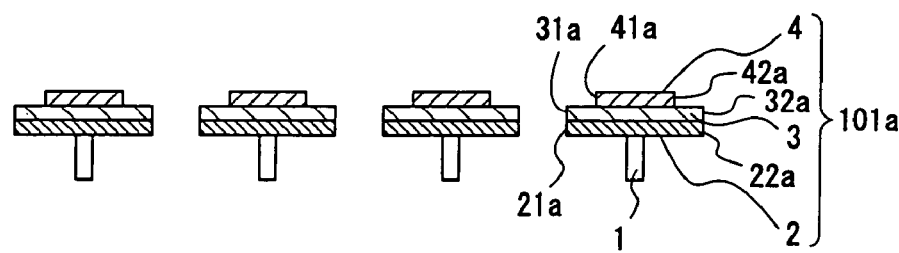

FIG. 1(a) is a diagram for explaining a ferroelectric memory device according to a first embodiment of the present invention, and shows a layout of electrodes in ferroelectric capacitors that constitute memory cells. FIG. 1(b) is a cross-sectional view along the line Ia-Ia of FIG. 1(a), and shows a cross-sectional structure of the ferroelectric capacitor.

A ferroelectric memory device 101 according to the first embodiment has (i) a memory cell array in which memory cells each composed of a memory cell transistor and a memory cell capacitor are arranged, and (ii) a memory cell structure in which edges of the upper electrode of the memory cell capacitor are located at inner positions relative to edges of the ferroelectric layer as a constituent of the memory cell capacitor.

More specifically, on the memory cell array (not shown) of the ferroelectric memory device 101, memory cells (not shown) are arranged in a matrix along a first direction (horizontal direction) D1 and a second direction (vertical direction) D2. A memory cell capacitor 101a, as a constituent of the respective memory cell, consists of a lower electrode 2 that is formed on a substrate (not shown) via an insulating film (not shown), a ferroelectric layer 3 that is formed on the lower electrode 2, and an upper electrode 4 that is formed on the ferroelectric layer 3.

In this case, the lower electrode 2, as a constituent of the memory cell capacitor 101a, is independent for each of the memory cell capacitors. That is, the lower electrodes 2 are arranged in a matrix on the memory cell array, and each of the lower electrodes of the respective memory cell capacitors is connected to an active area (not shown) of the corresponding memory cell transistor which is formed on the substrate, through a contact 1 passing through the insulating film. The contact 1 comprises a conductive material in a contact hole formed in the insulating film.

The ferroelectric layer 3 is common to a certain number of memory cells which are arranged along the second direction D2, and it extends along the second direction D2 covering the plural lower electrodes 2 which are arranged along the second direction D2. The left and right edges 31a and 32a of the ferroelectric layer 3, which are parallel to the second direction D2, are at the same position or substantially the same position as the left and right edges 21a and 22a, which are parallel to the second direction D2, of the plural lower electrodes 2 located under the ferroelectric layer 3.

The upper electrode 4 is common to the certain number of memory cells which are arranged along the second direction D2, like the ferroelectric layer 3, and constitutes a plate electrode extending in the second direction D2 covering the plural lower electrodes 2 which are arranged along the second direction D2. The left and right edges 41a and 42a of the upper electrode 4, parallel to the second direction D2, are located at inner positions relative to the left and right edges 31a and 32 of the ferroelectric layer 3, respectively.

Next, a method of processing the lower electrode 2, the ferroelectric layer 3, and the upper electrode 4 of the memory cell capacitor 101a will be briefly described.

After a memory cell transistor, as a constituent of a memory cell, is formed on a substrate and an insulating film is formed on the entire surface, a contact hole is formed on the insulating film at a part corresponding to an active area of the respective memory cell transistor, and then a conductive material is filled in the contact hole, thereby forming a contact 1.

Next, a lower electrode layer is formed on the entire surface, and the lower electrode layer is processed so as to form a lower electrode 2 of the respective memory cell capacitor. When the lower electrode layer is processed in this case, it is also possible to process the lower electrode layer so as to have a stripe shape parallel to the first direction D1 that is perpendicular to the second direction D2 along which the upper electrode 4 extends, and then pattern the respective lower electrodes 2 so as to have a stripe shape extending over the plural contacts 1 which are arranged along the first direction D1.

A ferroelectric layer and an upper electrode layer are successively formed thereon, and these layers are processed by different masks, respectively. At this time, the upper electrode layer is processed by a mask having a narrower width than that of a mask which is used to process the ferroelectric layer. That is, the width of the mask that is used in processing the upper electrode layer, i.e., the dimension of the electrode processing mask in the first direction D1 is smaller than the width of the mask that is used in processing the ferroelectric layer, i.e., the dimension of the ferroelectric processing mask in the first direction D1.

Regarding the practicability of manufacturing, the processing of the ferroelectric layer and the upper electrode layer can be performed in various manners.

For example, when processing the ferroelectric layer and the upper electrode layer, it is possible to employ a method (first processing method) of, after forming the ferroelectric layer and the upper electrode layer, processing the upper electrode layer using an electrode processing mask to form the upper electrode, and then processing the ferroelectric layer using a ferroelectric processing mask, thereby forming the ferroelectric layer 3 in a stripe shape extending over the plural lower electrodes 2.

In addition, in processing the ferroelectric layer and the upper electrode layer, it is possible to employ a method (second processing method) of processing the ferroelectric layer and the upper electrode layer using a ferroelectric processing mask, thereby forming the ferroelectric layer 3 and an upper electrode layer having the same planar pattern as the ferroelectric layer 3, and thereafter processing the upper electrode layer using an electrode processing mask, thereby forming the upper electrode.

Further, in processing the ferroelectric layer and the upper electrode layer, it is also possible to employ a method (third processing method) of processing the previously processed lower electrode layer, for example, of a stripe shape using the ferroelectric processing mask when processing the ferroelectric layer using the ferroelectric processing mask, thereby forming the lower electrode corresponding to the respective memory cell.

As described above, according to the first embodiment, the memory cell is configured to have a memory cell structure in which the edges of the upper electrode of the memory cell capacitor are located at the inner positions relative to the edges of the ferroelectric layer. Therefore, it is possible to reduce or prevent current leakage between the upper electrode and the lower electrode.

Further, when the previously processed lower electrode, for example, of a stripe shape is also processed when the ferroelectric layer is processed with a mask, it is possible to perform separation of the lower electrodes using the same mask as in the processing of the ferroelectric layer. That is, the memory cell structure that ensures the size of the lower electrodes can be realized without being affected by mask deviation between the lower electrode processing mask and the ferroelectric processing mask.

Embodiment 2

Figure 2A:
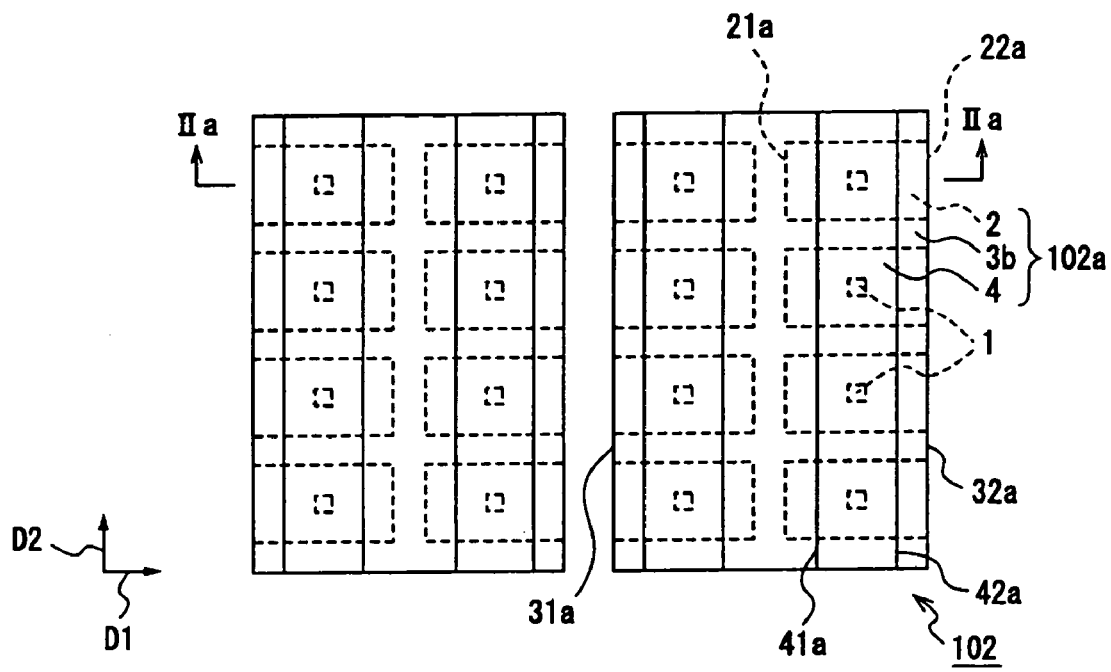
FIG. 2(a) is a diagram for explaining a ferroelectric memory device 102 according to a second embodiment of the present invention, and shows a layout of electrodes of ferroelectric capacitors 102a that constitute memory cells.
Figure 2B:
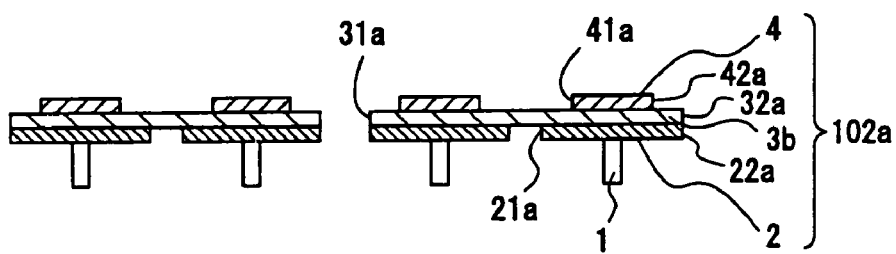

FIG. 2(a) is a diagram for explaining a ferroelectric memory device according to a second embodiment of the present invention, and shows a layout of electrodes in ferroelectric capacitors that constitute memory cells. FIG. 2(b) is a cross-sectional view along the line IIa-IIa of FIG. 2(a), and shows a cross-sectional structure of the ferroelectric capacitor.

This second embodiment is a variation of the first embodiment in which one ferroelectric layer is made to correspond to two adjacent plate electrodes in the first embodiment. The ferroelectric layers, which are arranged for the respective lower electrode columns that are arranged along the second direction D2 in the first embodiment, are replaced by a ferroelectric layer 3b that is common to two adjacent lower electrodes arranged along the second direction D2. Therefore, in the memory cell structure according to the second embodiment, the left and right edges 41a and 42a of the upper electrode 4 along the vertical direction (second direction) D2 are located at inner positions relative to the left and right edges 31a and 32a of the ferroelectric layer 3b along the vertical direction D2.

In this second embodiment, one of the opposed edges along the vertical direction of the lower electrode 2 of the respective memory cell capacitor is not processed at the processing of the lower electrode layer, but the edge of the lower electrode, which has not been processed at the processing of the lower electrode layer, is processed at the processing of the ferroelectric layer. Accordingly, it is possible to reduce the arrangement interval of the memory cell capacitors in apart in which the ferroelectric material layer is not processed, thereby reducing the memory cell area.

More specifically, on a memory cell array (not shown) of a ferroelectric memory device 102 according to the second embodiment, memory cells (not shown) are arranged in a matrix along the first direction D1 and the second direction D2. A memory cell capacitor 102a, as a constituent of the respective memory cell, consists of a lower electrode 2 that is formed on a substrate (not shown) via an insulating film (not shown), a ferroelectric layer 3b that is formed on the lower electrode 2, and an upper electrode 4 that is formed on the ferroelectric layer 3b.

Herein, the lower electrode 2 is connected to an active area (not shown) of the memory cell transistor through a contact 1 similarly as in the first embodiment.

The ferroelectric layer 3b is common to two adjacent memory cell columns along the second direction D2, and has a shape extending over two adjacent columns of the lower electrodes arranged along the second direction D2. The left edge 31a of the ferroelectric layer 3b, which is parallel to the second direction D2 is at the same position or substantially the same position as the left edge 21a of the lower electrode 2, parallel to the second direction D2, of the left one of two columns of the lower electrodes which are opposed under the ferroelectric layer 3b. The right edge 32a of the ferroelectric layer 3b, which is parallel to the second direction D2 is at the same position or substantially the same position as the right edge 22a of the lower electrode 2, parallel to the second direction D2, of the right one of the two columns of the lower electrodes which are opposed under the ferroelectric layer 3b.

The upper electrode 4 is the same as that in the first embodiment. The left and right edges 41a and 42a of the upper electrode 4, parallel to the second direction D2, are located at inner positions relative to the left and right edges 31a and 32a of the ferroelectric layer 3b, respectively.

Next, the method of processing the lower electrode 2, the ferroelectric layer 3b, and the upper electrode 4 of the memory cell capacitor 102a will be briefly described.

Initially, memory cell transistors, insulating films, and contacts 1 are formed in the same manner as the first embodiment.

Next, a lower electrode layer is formed on the entire surface, and the lower electrode layer is processed so as to form the lower electrode 2 of the respective memory cell capacitor. At this time, the lower electrode layer is processed so as to be separated into parts each extending over two adjacent contacts along the first direction D1.

Thereafter, a ferroelectric layer and an upper electrode layer are successively formed on the entire surface, and the ferroelectric layer and the upper electrode layer are processed using different masks, respectively.

At this time, the processing of the upper electrode layer is performed using a mask having the width that is narrower than the width of the mask which is used at the processing of the ferroelectric layer.

Regarding the practicability of manufacturing, the processing of the ferroelectric layer and the upper electric layer can be performed in various manners.

For example, in processing the ferroelectric layer and the upper electrode layer, it is possible to employ a method (first processing method) of, after forming the ferroelectric layer and the upper electrode layer, processing the upper electrode layer using an electrode processing mask, thereby forming the upper electrode, and thereafter processing the ferroelectric layer using a ferroelectric processing mask, thereby forming a stripe-shaped ferroelectric layer 3b having a wider width, which extends over two columns of the lower electrodes 2 along the vertical direction D2.

In order to process the ferroelectric layer and the upper electrode layer, it is also possible to employ a method (second processing method) of processing the ferroelectric layer and the upper electrode layer using the ferroelectric processing mask, thereby forming the ferroelectric layer 3b and an upper electrode layer having the same planar pattern as the ferroelectric layer 3b, and thereafter processing the upper electrode layer using the electrode processing mask, thereby forming the upper electrode.

Further, to process the ferroelectric layer and the upper electrode layer, it is also possible to employ a method (third processing method) of processing the previously-processed lower electrode layer, for example, of a stripe shape extending over two adjacent contacts 1, using the ferroelectric processing mask, when the ferroelectric layer is processed using the ferroelectric processing mask, thereby forming the lower electrode corresponding to the respective memory cell.

As described above, according to the second embodiment, the memory cell is constructed to have a memory cell structure in which the opposed edges of the upper electrode 4 in the memory cell capacitor are located at inner positions relative to the edges of the ferroelectric layer 3b, like in the first embodiment. Therefore, it is possible to reduce or prevent current leakage between the upper electrode and the lower electrode.

Further, when the previously-processed lower electrode layer, for example, of a stripe shape is also processed at the mask processing of the ferroelectric layer, separation of the lower electrodes can be performed using the same mask as is used at the processing of the ferroelectric layer.

Further, in this second embodiment, the ferroelectric layer has a stripe shape of a wider width extending over two adjacent columns of the lower electrodes. Therefore, processing for separating the ferroelectric layer is not performed between these two columns of the lower electrodes. Accordingly, it is possible to make the memory cell area smaller than in the first embodiment.

In this second embodiment, the ferroelectric layer is processed so as to extend over two plate lines, while the ferroelectric layer may be processed so as to extend over three or more plate lines.

Embodiment 3

Figure 3A:
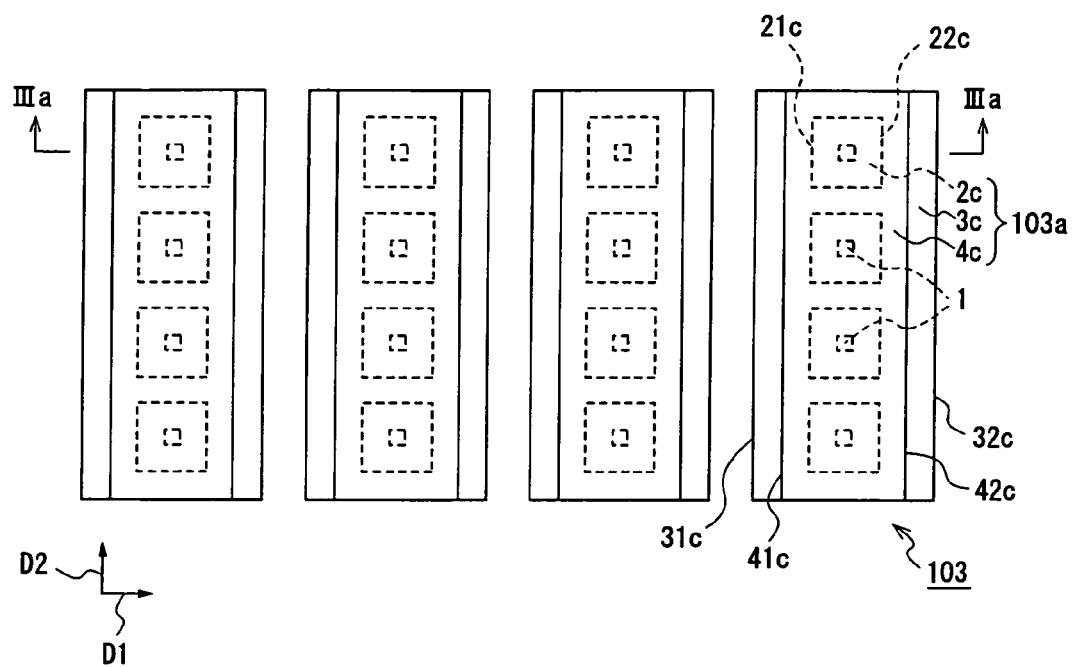
FIG. 3(a) is a diagram for explaining a ferroelectric memory device 103 according to a third embodiment of the present invention, and shows a layout of electrodes of ferroelectric capacitors 103a that constitute memory cells.
Figure 3B:
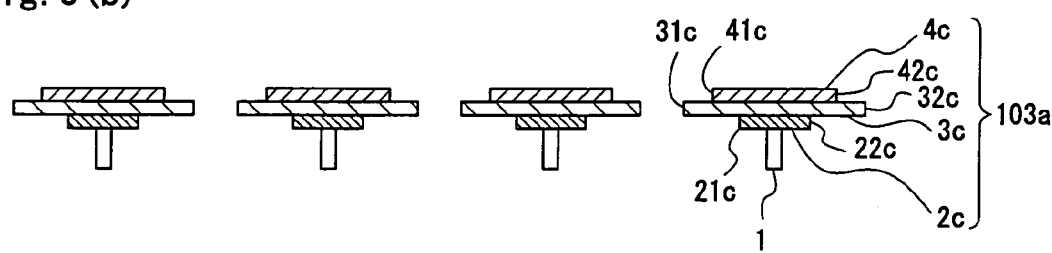

FIG. 3(*a*) is a diagram for explaining a ferroelectric memory device according to a third embodiment of the present invention, and shows a layout of electrodes in ferroelectric capacitors that constitute memory cells. FIG. 3(*b*) is a cross-sectional view along the line IIIa-IIIa of FIG. 3(*a*), and shows a cross-sectional structure of the ferroelectric capacitor.

A ferroelectric memory device 103 according to the third embodiment has a memory cell array in which memory cells each composed of a memory cell transistor and a memory cell capacitor are arranged, and has a memory cell structure in which edges of the upper electrode of the memory cell capacitor are located at inner positions relative to edges of the ferroelectric layer of the memory cell capacitor, and edges of the lower electrode layer of the memory cell capacitor are also located at inner positions relative to the edges of the ferroelectric layer.

To be more specific, on the memory cell array (not shown) of the ferroelectric memory device 103, memory cells (not shown) are arranged in a matrix along a first direction D1 and a second direction D2. A memory cell capacitor 103a, as a constituent of the respective memory cell, is composed of a lower electrode 2c that is formed on a substrate (not shown) via an insulating film (not shown), a ferroelectric layer 3c that is formed on the lower electrode 2c, and an upper electrode 4c that is formed on the ferroelectric layer 3c.

The lower electrode 2c is provided as an independent lower electrode for each of the memory cell capacitors. That is, the lower electrodes 2c are arranged in a matrix on the memory cell array, and each of the lower electrodes 2c is connected to an active area (not shown) of the corresponding memory cell transistor formed on the substrate, through a contact 1 passing through the insulating film. The contact 1 comprises a conductive material in a contact hole that is formed in the insulating film, like in the first embodiment.

The ferroelectric layer 3c is common to a certain number of memory cells which are arranged along the second direction D2, and extends in the second direction D2 across the plural lower electrodes 2c arranged along the second direction D2. The left and right edges 31c and 32c of the ferroelectric layer 3c parallel to the second direction D2 are located at outer position relative to the left and right edges 21c and 22c, parallel to the second direction D2, of the plural lower electrodes 2c which are located under the ferroelectric layer 3c.

The upper electrode 4c is common to the certain number of memory cells which are arranged along the second direction D2, like the ferroelectric layer 3c, and constitutes a plate electrode extending in the second direction D2 across the plural lower electrodes 2 which are arranged along the second direction D2. The left and right edges of 41c and 42c of the upper electrode 4c, parallel to the second direction D2, are located at inner positions relative to the left and right edges 31c and 32c of the ferroelectric layer 3c and at outer positions relative to the left and right edges 21c and 22c of the lower electrode 2c, respectively.

Next, a method of processing the lower electrode 2c, the ferroelectric layer 3c, and the upper electrode 4c of the memory cell capacitor 103a will be briefly described.

Initially, a memory cell transistor, an insulating film, and a contact are formed in the same manner as in the first embodiment.

Then, a lower electrode layer is formed over the entire surface, and the lower electrode layer is processed to form the lower electrode 2c that is independent for each of the memory cell capacitors.

Thereafter, a ferroelectric layer and an upper electrode layer are successively formed over the entire surface, and the ferroelectric layer and the upper electrode layer are processed using different masks, respectively.

At this time, the upper electrode layer is processed using a mask having a width that is narrower than that of a mask used at the processing of the ferroelectric layer.

Regarding the practicability of manufacturing, the ferroelectric layer can be processed after the upper electrode is processed, or the upper electrode can be processed after the ferroelectric layer is processed.

That is, to process the ferroelectric layer and the upper electrode layer, it is possible to employ a method (first processing method) of, after forming the ferroelectric layer and the upper electrode layer, processing the upper electrode layer using the electrode processing mask, thereby forming the upper electrode 4c, and thereafter processing the ferroelectric layer using the ferroelectric processing mask, thereby forming the stripe-shaped ferroelectric layer 3c extending over the plural lower electrodes 2c.

In addition, at the processing of the ferroelectric layer and the upper electrode layer, it is also possible to employ a method (second processing method) of processing the ferroelectric layer and the upper electrode layer using the ferroelectric processing mask, thereby forming the ferroelectric layer 3c and an upper electrode layer having the same planar pattern as the ferroelectric layer 3c, and thereafter processing the upper electrode layer using the electrode processing mask, thereby forming the upper electrode 4c.

As described above, in this third embodiment, the memory cell is constructed to have a memory cell structure in which the edges 41c and 42c of the upper electrode 4c are located at inner positions relative to the edges 31c and 32c of the ferroelectric layer 3c, like in the first embodiment. Therefore, it is possible to make current leakage between the upper electrode and the lower electrode hard to occur.

Further, according to the third embodiment, unlike the first embodiment, the edges 21c and 22c of the lower electrode 2c are located at inner positions relative to the edges 31c and 32c of the ferroelectric layer 3c. Therefore, it is possible to make the current leakage between the lower electrode and the upper electrode harder to occur.

Embodiment 4

Figure 4A:
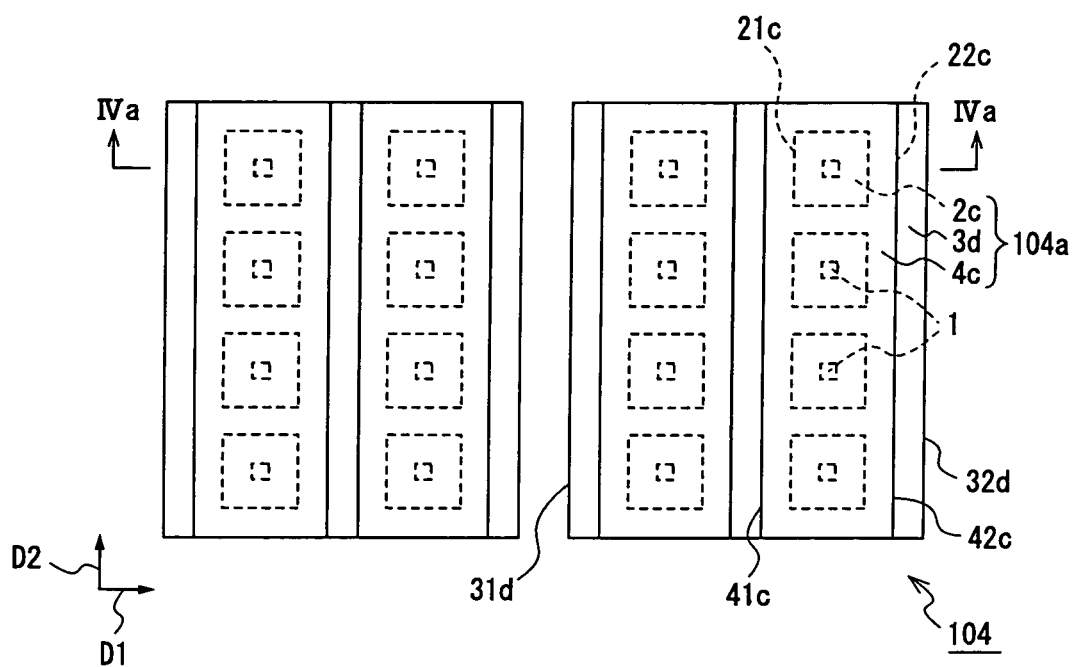
FIG. 4(a) is a diagram for explaining a ferroelectric memory device 104 according to a fourth embodiment of the present invention, and shows a layout of electrodes of ferroelectric capacitors 104a that constitute memory cells.
Figure 4B:
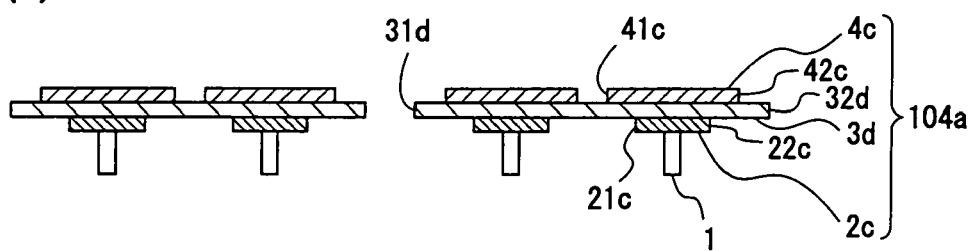

FIG. 4(a) is a diagram for explaining a ferroelectric memory device according to a fourth embodiment of the present invention, and shows a layout of electrodes in ferroelectric capacitors that constitute memory cells. FIG. 4(b) is a cross-sectional view along the line IVa-IVa of FIG. 4(a), and shows a cross-sectional structure of the ferroelectric capacitor.

The fourth embodiment of the present invention is a variation of the third embodiment, in which one ferroelectric layer is made to correspond to two adjacent plate electrodes in the third embodiment. The ferroelectric layers that are placed for the respective lower electrode columns which are arranged along the second direction D2 in the third embodiment is replaced with a ferroelectric layer 3d that is common to adjacent two columns of lower electrodes which are arranged along the second direction D2. Therefore, in the memory cell structure according to the fourth embodiment, left and right edges 41c and 42c of an upper electrode 4c, along the vertical direction (second direction) D2 are located at inner positions relative to left and right edges 31d and 32d of the ferroelectric layer 3d, along the vertical direction D2, and left and right edges 21c and 22c of a lower electrode 2c, along the vertical direction (second direction) D2, are located at inner positions relative to the left and right edges 31d and 32d of the ferroelectric layer 3d, along the vertical direction D2.

To be more specific, on a memory cell array (not shown) of a ferroelectric memory device 104 according to the fourth embodiment, memory cells are arranged in a matrix along the first direction D1 and the second direction D2. A memory cell capacitor 104a, as a constituent of the respective memory cell, consists of a lower electrode 2c that is formed on a substrate (not shown) via an insulating film (not shown), a ferroelectric layer 3d that is formed on the lower electrode 2c, and an upper electrode 4c that is formed on the ferroelectric layer 3d.

Herein, the lower electrode 2c is connected to an active area (not shown) of a memory cell transistor through a contact 1 similarly as in third embodiment.

The ferroelectric layer 3d is common to two adjacent memory cell columns along the second direction D2, and it has a shape extending over two adjacent columns of the lower electrodes which are arranged along the second direction D2. The left and right edges 21c and 22c parallel to the second direction D2 of these two adjacent columns of lower electrodes are located at inner positions relative to the left and right edges 31d and 32d parallel to the second direction D2 of the ferroelectric layer 3d.

The upper electrode 4c is the same as that in the third embodiment. The left and right edges 41c and 42c parallel to the second direction D2 of the upper electrode 4c are located at inner positions relative to the left and right edges 31c and 32c of the ferroelectric layer 3d, respectively.

Next, a method of processing the lower electrode 2c, the ferroelectric layer 3d, and the upper electrode 4c of the memory cell capacitor 104a will be briefly described.

Initially, memory cell transistors, insulating films, and contacts 1 are formed in the same manner as in the third embodiment.

Then, a lower electrode layer is formed on the entire surface, and the lower electrode layer is processed to form the lower electrode 2c of the respective memory cell capacitors.

Thereafter, a ferroelectric layer and an upper electrode layer are successively formed on the entire surface, and the ferroelectric layer and the upper electrode layer are processed using different masks, respectively.

At this time, the upper electrode layer is processed using a mask having a width that is narrower than that of a mask used in the processing of the ferroelectric layer.

Regarding the practicability of manufacturing, the ferroelectric layer can be processed after the upper electrode is processed, and the upper electrode can be processed after the ferroelectric layer is processed.

That is, at the processing of the ferroelectric layer and the upper electrode layer, it is possible to employ a method (first processing method) of, after forming the ferroelectric layer and the upper electrode layer, processing the upper electrode layer using the electrode processing mask, thereby forming the upper electrode 4c, and thereafter processing the ferroelectric layer using the ferroelectric processing mask, thereby forming a stripe-shaped ferroelectric layer 3d having a wider width extending over two columns of the lower electrodes 2c which are arranged along the vertical direction D2.

In addition, at the processing of the ferroelectric layer and the upper electrode layer, it is also possible to employ a method (second processing method) of processing the ferroelectric layer and the upper electrode layer using the ferroelectric processing mask, thereby forming the ferroelectric layer 3d and an upper electrode layer having the same planar pattern as that of the ferroelectric layer 3d, and thereafter processing the upper electrode layer using the electrode processing mask, thereby forming the upper electrode 4c.

As described above, according to the fourth embodiment, the memory cell is constructed to have a memory cell structure in which the left and right edges of the upper electrode 4c of the memory cell capacitor are located at inner positions relative to the edges of the ferroelectric layer 3d. Therefore, it is possible to reduce or prevent current leakage between the upper electrode and the lower electrode.

In addition, in this fourth embodiment, the edges 21c and 22c of the lower electrode 2c are located at inner positions relative to the edges 31d and 32d of the ferroelectric layer 3d, unlike the first embodiment. Therefore, it is possible to make the current leakage between the lower electrode and the upper electrode harder to occur.

Further, in this fourth embodiment, since the ferroelectric layer has a wide-stripe shape extending over two adjacent columns of the lower electrodes, processing to separate the ferroelectric layer is not performed between these two lower electrode columns. Therefore, it is possible to reduce the memory cell area as compared to the third embodiment.

Embodiment 5

Figure 5A:
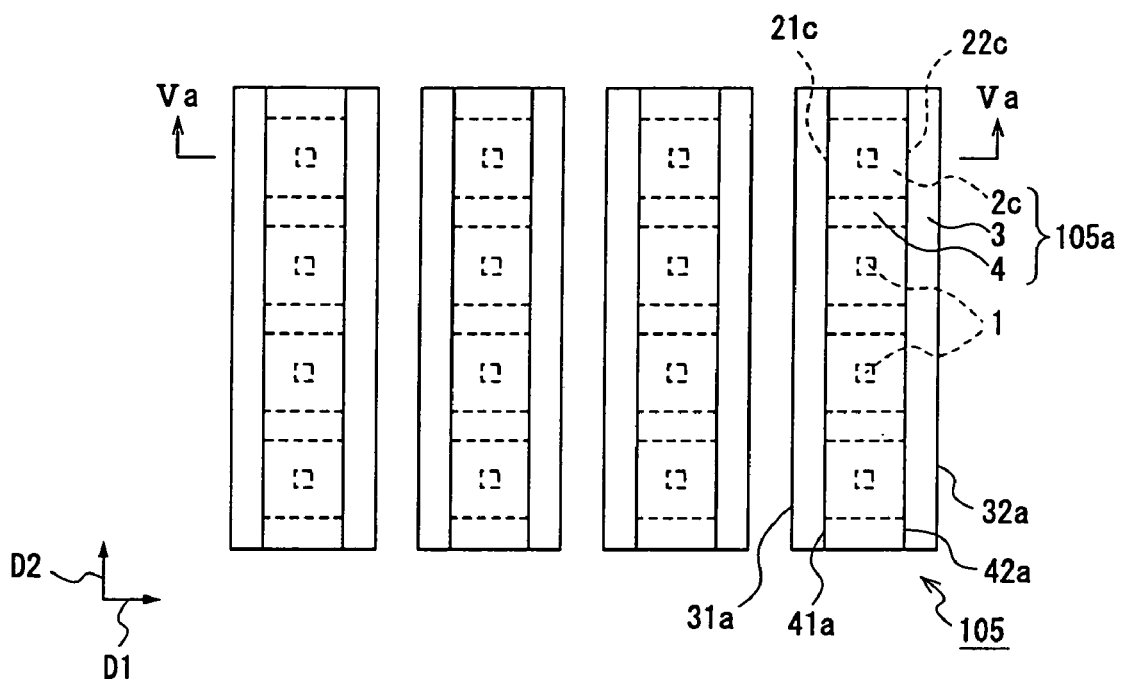
FIG. 5(a) is a diagram for explaining a ferroelectric memory device 105 according to a fifth embodiment of the present invention, and shows a layout of electrodes of ferroelectric capacitors 105a that constitute memory cells.
Figure 5B:
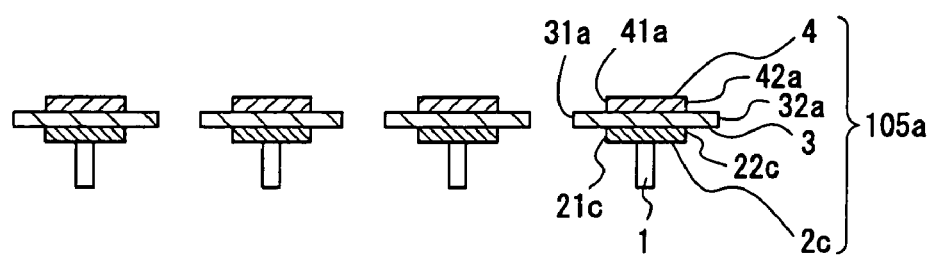

FIG. 5(a) is a diagram for explaining a ferroelectric memory device according to a fifth embodiment of the present invention, and shows a layout of electrodes in ferroelectric capacitors that constitute memory cells. FIG. 5(b) is a cross-sectional view along the line Va-Va of FIG. 5(a), and shows a cross-sectional structure of the ferroelectric capacitor.

A ferroelectric memory device 105 according to the fifth embodiment has a memory cell array in which memory cells each composed of a memory cell transistor and a memory cell capacitor are arranged, and it has a memory cell structure in which edges of an upper electrode of the memory cell capacitor are located at inner positions relative to edges of a ferroelectric layer, edges of a lower electrode are also located at inner positions relative to the edges of the ferroelectric layer, widths of the upper electrode and the lower electrode are the same or substantially the same, and the upper electrode and the lower electrode are placed at the same position so as to overlap one another.

More specifically, on the memory cell array (not shown) of the ferroelectric memory device 105, the memory cells (not shown) are arranged in a matrix along the first direction D1 and the second direction D2. A memory cell capacitor 105a, as a constituent of the respective memory cell, consists of a lower electrode 2c that is formed on a substrate (not shown) via an insulating film (not shown), a ferroelectric layer 3 that is formed on the lower electrode 2c, and an upper electrode 4 that is formed on the ferroelectric layer 3.

The lower electrode 2c is the same as that in the third embodiment, and the lower electrode 2c is connected to an active area (not shown) of the corresponding memory cell transistor formed on the substrate, through a contact 1, like in the third embodiment. In addition, the ferroelectric layer 3 and the upper electrode 4 are the same as those in the first embodiment. The left and right edges 31a and 32a parallel to the second direction D2 of the ferroelectric layer 3 are located at outer positions relative to the left and right edges 21a and 22a parallel to the second direction D2 of the plural lower electrodes 2 under the ferroelectric layer 3.

The left and right edges 41a and 42a of the upper electrode 4 parallel to the second direction D2 are located at inner positions relative to the left and right edges 31a and 32a of the ferroelectric layer 3, and are located at the same or substantially the same position as those of the left and right edges 21c and 22c of the upper electrode 2c, respectively.

Next, a method of processing the lower electrode 2c, the ferroelectric layer 3, and the upper electrode 4 of the memory cell capacitor 105a will be briefly described.

Initially, a memory cell transistor, an insulating film, and a contact are formed in the same manner as in the first embodiment.

Next, a lower electrode layer is formed on the entire surface, and the lower electrode layer is processed to form the lower electrode 2c that is independent for each of the memory cell capacitors.

Thereafter, a ferroelectric layer and an upper electrode layer are successively formed on the entire surface, and these ferroelectric and upper electrode layers are processed using different masks, respectively.

At this time, the upper electrode is processed using a mask having a width that is smaller than that of the ferroelectric layer processing mask, but is the same or substantially the same as that of a lower electrode processing mask.

Regarding the practicability of manufacturing, like in the third embodiment, the ferroelectric layer can be processed after the upper electrode is processed, and the upper electrode can be processed after the ferroelectric layer is processed.

As described above, according to the fifth embodiment, since the edges of the upper electrode are located at inner positions relative to the edges of the ferroelectric layer, and the edges of the lower electrode are located at inner positions relative to the edges of the ferroelectric layer, no current leakage occurs between the upper electrode and the lower electrode. Further, because the widths of the upper electrode and the lower electrode are substantially the same, and these electrodes are placed at the same position, it is possible to construct the memory cell having a structure that ensures a large capacitor effective area in a small memory cell area.

Embodiment 6

Figure 6A:
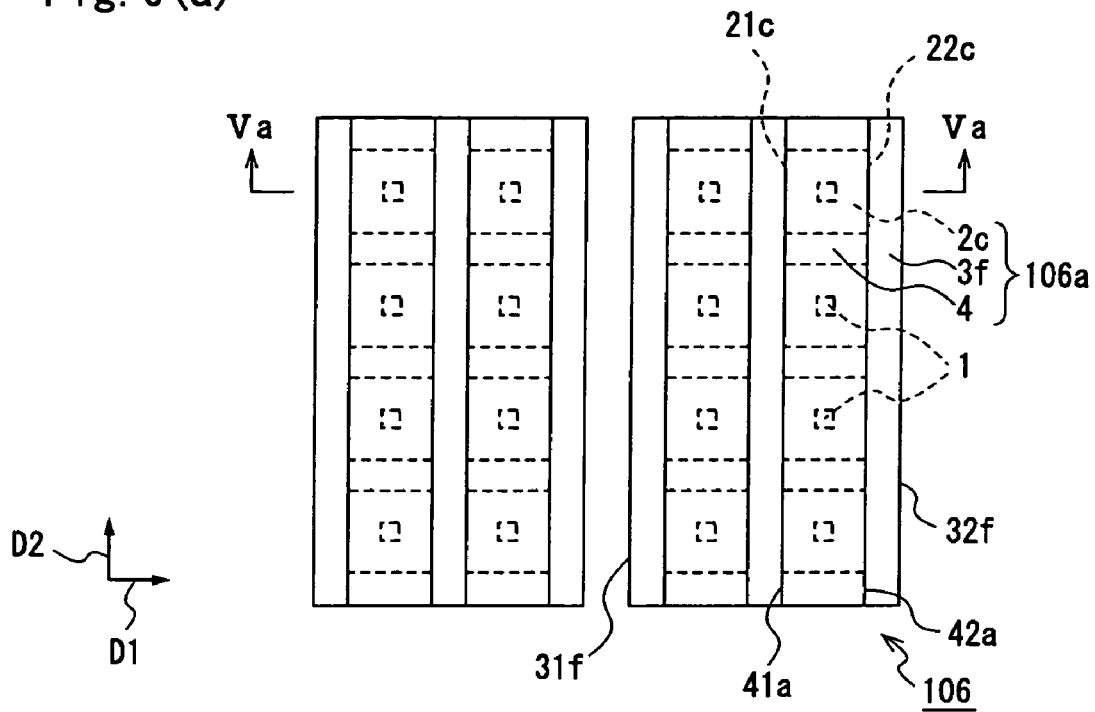
FIG. 6(a) is a diagram for explaining a ferroelectric memory device 106 according to a sixth embodiment of the present invention, and shows a layout of electrodes of ferroelectric capacitors 106a that constitute memory cells.
Figure 6B:
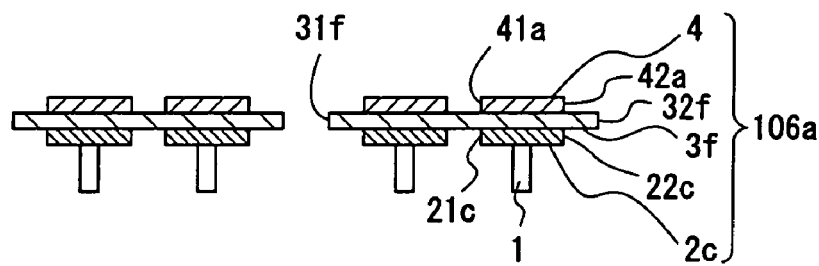

FIG. 6(a) is a diagram for explaining a ferroelectric memory device according to a sixth embodiment of the present invention, and shows a layout of electrodes in ferroelectric capacitors that constitute memory cells. FIG. 6(b) is a cross-sectional view along the line VIa-VIa of FIG. 6(a), and shows a cross-sectional structure of the ferroelectric capacitor.

The sixth embodiment is a variation of the fifth embodiment in which one ferroelectric layer is made to correspond to two adjacent plate electrodes (upper electrodes) in the fifth embodiment. The ferroelectric layer 3 that is placed for each of lower electrodes which are arranged along the second direction D2 in the fifth embodiment is replaced with a ferroelectric layer 3f that is common to two adjacent columns of lower electrodes which are arranged along the second direction D2.

Therefore, in this case, the memory cell capacitor 106a consists of the upper electrode 4, and ferroelectric layer 3f, and the lower electrode 2c. In the memory cell structure according to the sixth embodiment, the left and right edges 41a and 42a along the vertical direction (second direction) D2 of the upper electrode 4 are located at inner positions relative to the left and right edges 31f and 32f which are arranged along the vertical direction D2 of the ferroelectric layer 3f, and the left and right edges 21c and 22c along the vertical direction (second direction) D2 of the lower electrode 2c are located at inner positions relative to the left and right edges 31f and 32f which are arranged along the vertical direction D2 of the ferroelectric layer 3f, respectively. Further, the widths of the upper electrode and the lower electrode are substantially the same, and the positions of the upper electrode and the lower electrode on the memory cell array in the first direction D1 are the same.

Next, a method of processing the lower electrode 2c, the ferroelectric layer 3f, and the upper electrode 4 of the memory cell capacitor 106a will be briefly described.

Initially, memory cell transistors, insulating films, and contacts 1 are formed in the same manner as in the fifth embodiment.

Then, a lower electrode layer is formed on the entire surface, and the lower electrode layer is processed to form the lower electrode 2c of the respective memory cell capacitor.

Thereafter, a ferroelectric layer and an upper electrode layer are successively formed on the entire surface, and these ferroelectric and upper electrode layers are processed using different masks, respectively.

At this time, the upper electrode layer is processed using a mask having a width that is narrower than that of a mask used in the processing of the ferroelectric layer.

Regarding the practicality of manufacturing, like in the fourth embodiment, the ferroelectric layer can be processed after the upper electrode is processed, and the upper electrode can be processed after the ferroelectric layer is processed.

As described above, according to this sixth embodiment, the left and right edges of the upper electrode 4 are located at inner positions relative to the left and right edges of the ferroelectric layer 3f, and the left and right edges of the lower electrode 2c are located at inner positions relative to the left and right edges of the ferroelectric layer 3f in the memory cell. Therefore, no leakage occurs between the upper electrode and the lower electrode.

Further, since the widths of the upper electrode and the lower electrode are substantially the same, and these electrodes are placed at the same position, it is possible to construct the memory cell having a structure that ensures a large effective capacitor area in a small memory cell area.

Further, in this sixth embodiment, because the ferroelectric layer 3f has a wide-stripe shape extending over two adjacent columns of the lower electrodes 2c, processing to separate the ferroelectric layer is not performed between these two lower electrode columns. Therefore, the memory cell area can be reduced as compared to the fifth embodiment.

Embodiment 7

Figure 7A:
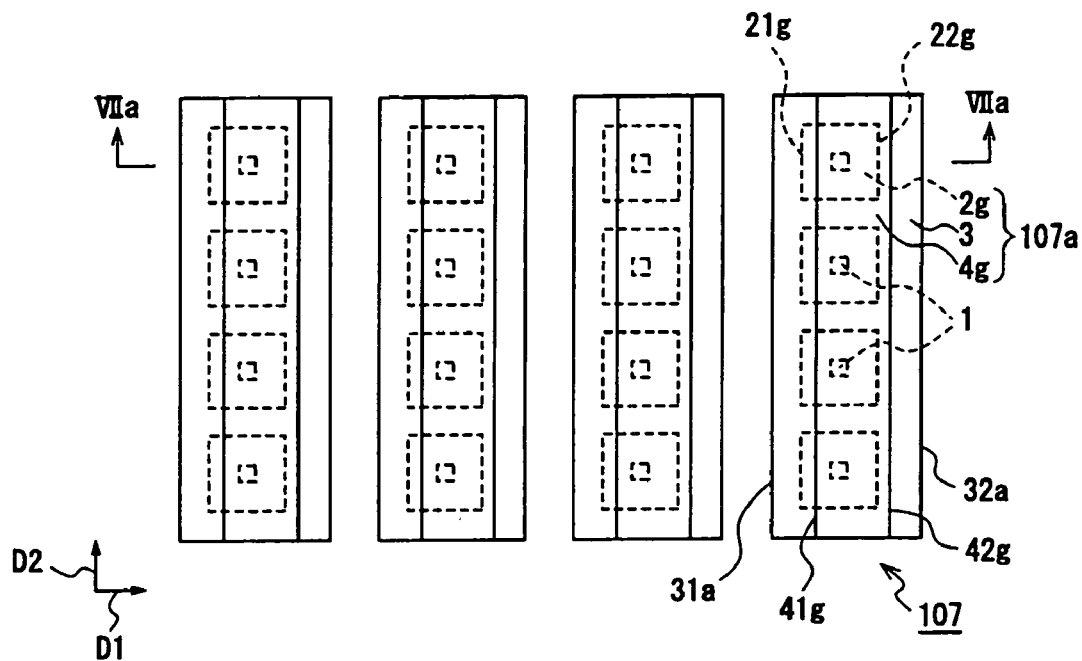
FIG. 7(a) is a diagram for explaining a ferroelectric memory device 107 according to a seventh embodiment of the present invention, and shows a layout of electrodes of ferroelectric capacitors 107a that constitute memory cells.
Figure 7B:
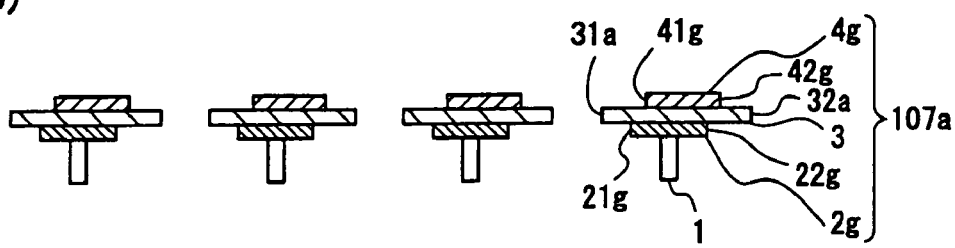

FIG. 7(a) is a diagram for explaining a ferroelectric memory device according to a seventh embodiment of the present invention, and shows a layout of electrodes in ferroelectric capacitors that constitute memory cells. FIG. 7(b) is a cross-sectional view along the line VIIa-VIIa of FIG. 7(a), and shows a cross-sectional structure of the ferroelectric capacitor.

A ferroelectric memory device 107 according to the seventh embodiment has a memory cell structure in which the upper electrode and the lower electrode in the fifth embodiment are shifted to the first direction D1 respectively. The edges of the upper electrode of the memory cell capacitor are located at inner positions relative to the edges of the ferroelectric layer, and the edges of the lower electrode layer are also located at inner positions of the edges of the ferroelectric layer.

To be more specific, on a memory cell array (not shown) of the ferroelectric memory device 107, memory cells (not shown) are arranged in a matrix along the first direction D1 and the second direction D2. A memory cell capacitor 107a, as a constituent of the respective memory cell, consists of a lower electrode 2g that is formed on a substrate (not shown) via an insulating film (not shown), a ferroelectric layer 3 that is formed on the lower electrode 2g, and an upper electrode 4g that is formed on the ferroelectric layer 3.

The lower electrode 2g is obtained by shifting the lower electrode 2c according to the fifth embodiment leftward in the figure along the first direction D1 such that the edges 21c and 22c of the lower electrode are not positioned outside the edges 31a and 32a of the ferroelectric layer 3. The ferroelectric layer 3 is the same as that in the fifth embodiment. The upper electrode 4g is obtained by shifting the upper electrode 4 of the fifth embodiment rightward in the figure along the first direction D1 such that the edges 41a and 42a of the upper electrode are not positioned outside the edges of the 31a and 32a of the ferroelectric layer 3. Here, reference numerals 21g and 22g denote the left and right edges of the lower electrode 2g, and numerals 41g and 42g denote the left and right edges of the upper electrode 4g, respectively.

Next, a method of processing the lower electrode 2g, the ferroelectric layer 3, and the upper electrode 4g of the memory cell capacitor 107a will be briefly described.

Initially, a memory cell transistor, an insulating film, and a contact are formed in the same manner as in the first embodiment.

Next, a lower electrode layer is formed on the entire surface, and the lower electrode layer is processed to form the lower electrode 2g that is independent for each of the memory cell capacitors.

Thereafter, a ferroelectric layer and an upper electrode layer are successively formed on the entire surface, and the ferroelectric layer and the upper electrode layer are processed using different masks, respectively.

At this time, the upper electrode layer is processed using a mask having a width that is narrower than that of a mask that is used in the processing of the ferroelectric layer and has substantially the same width as that of the lower electrode.

Regarding the practicability of manufacturing, as described in the third embodiment, the ferroelectric layer can be processed after the upper electrode is processed, or otherwise, the upper electrode can be processed after the ferroelectric layer is processed.

As described above, according to the seventh embodiment, the memory cell is constructed to have a memory cell structure in which the edges of the upper electrode are located at inner positions relative to the ferroelectric layer, and the edges of the lower electrode are located at inner positions relative to the ferroelectric layer. Therefore, no current leakage occurs between the upper electrode and the lower electrode.

Further, since the upper electrode and the lower electrode are arranged with shifting to each other along the first direction D1, only a portion which is stable in this film quality in the vicinity of electrode center, expect for the vicinity of the electrode edges, is employed for a ferroelectric capacitor area, thereby realizing a capacitance element having stable characteristics.

Embodiment 8

Figure 8A:
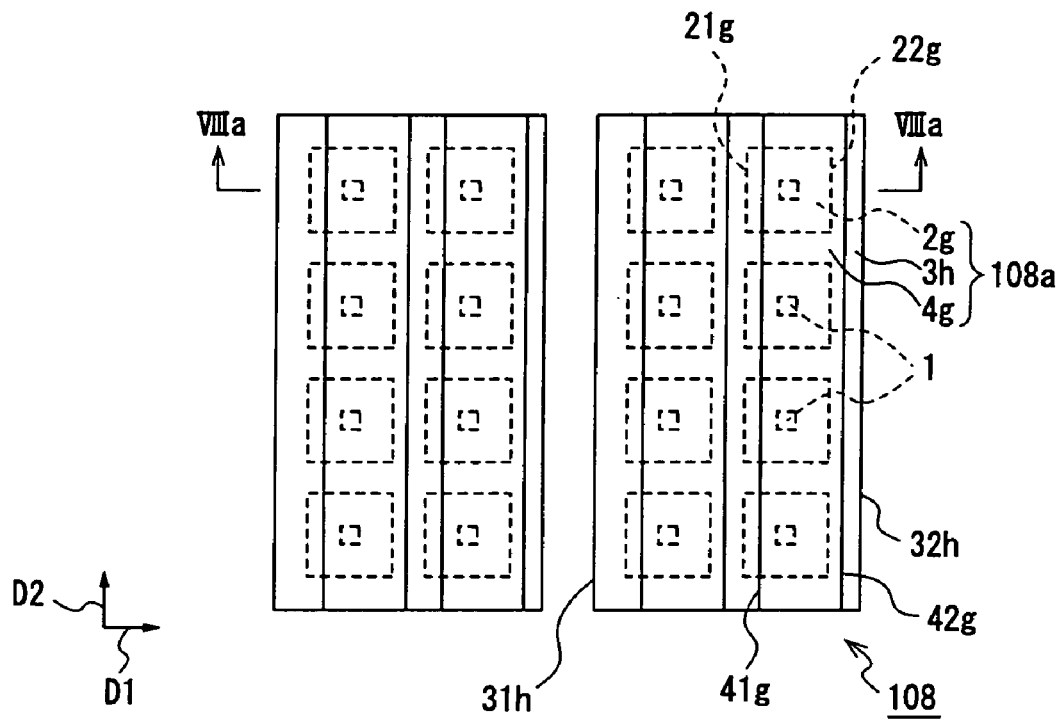
FIG. 8(a) is a diagram for explaining a ferroelectric memory device 108 according to an eighth embodiment of the present invention, and shows a layout of electrodes of ferroelectric capacitors 108a that constitute memory cells.
Figure 8B:
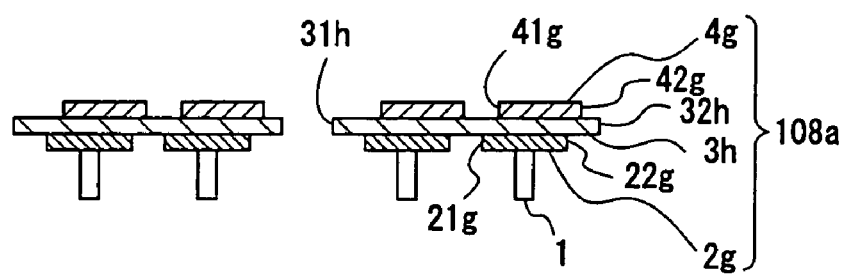

FIG. 8(a) is a diagram for explaining a ferroelectric memory device according to an eighth embodiment of the present invention, and shows a layout of electrodes in ferroelectric capacitors that constitute memory cells. FIG. 8(b) is a cross-sectional view along the line VIIIa-VIIIa of FIG. 8(a), and shows a cross-sectional view of the ferroelectric capacitor.

The eighth embodiment is a variation of the seventh embodiment, in which one ferroelectric layer is made to correspond to two adjacent plate electrodes (i.e., upper electrodes) in the seventh embodiment. The ferroelectric layers that are placed for each of the lower electrode columns which are arranged along the second direction D2 according to the seventh embodiment is replaced with a ferroelectric layer 3h that is common to two adjacent lower electrode columns which are arranged along the second direction D2.

Therefore, in this case, a memory cell capacitor 108a consists of the upper electrode 4g, the ferroelectric layer 3h, and the lower electrode 2g. In addition, in the memory cell structure according to the eighth embodiment, the left and right edges 41g and 42g in a line on the vertical direction (second direction) D2 of the upper electrode 4g are located at inner positions relative to left and right edges 31h and 32h in a line on the vertical direction D2 of the ferroelectric layer 3h, and the left and right edges 21g and 22g in the line on the vertical direction (second direction) D2 of the lower electrode 2g are located at inner positions relative to the left and right edges 31h and 32h in a line on the vertical direction D2 of the ferroelectric layer 3h, respectively.

Next, a method of processing the lower electrode 2g, the ferroelectric layer 3h, and the upper electrode 4g of the memory cell capacitor 108a will be briefly described.

Initially, memory cell transistors, insulating films, and contacts 1 are formed in the same manner as in the seventh embodiment.

Then, a lower electrode layer is formed over the entire surface, and the lower electrode layer is processed to form the lower electrode 2g of the respective memory cell capacitor.

Thereafter, a ferroelectric layer and an upper electrode layer are successively formed over the entire surface, and are processed using different masks for each of them.

At this time, the upper electrode is processed using a mask having a width that is narrower than that of the ferroelectric layer processing mask, but substantially the same as the lower electrode processing mask.

Regarding the practicability of manufacturing, like in the fourth embodiment, the ferroelectric layer can be processed after the upper electrode is processed, and the upper electrode can be processed after the ferroelectric layer is processed.

As described above, in the memory cell according to this eighth embodiment, the edges of the upper electrode are located at inner positions relative to the edges of the ferroelectric layer, and the edges of the lower electrode are located at inner positions relative to the edges of the ferroelectric layer. Therefore, no current leakage occurs between the upper electrode and the lower electrode.

Further, since the upper electrode and the lower electrode are arranged with shifting to each other along the first direction D1, only a portion which is stable in this film quality in the vicinity of the electrode center, except for the vicinity of the electrode edges, is employed for a ferroelectric capacitor area, thereby realizing a capacitance element having stable characteristics.

Further, in this eighth embodiment, because the ferroelectric layer has a wide-stripe shape extending over two adjacent columns of the lower electrodes, processing to separate the ferroelectric layer is not performed between these two lower electrode columns. Therefore, it is possible to reduce the memory cell area as compared to the seventh embodiment.

Embodiment 9

Figure 9A:
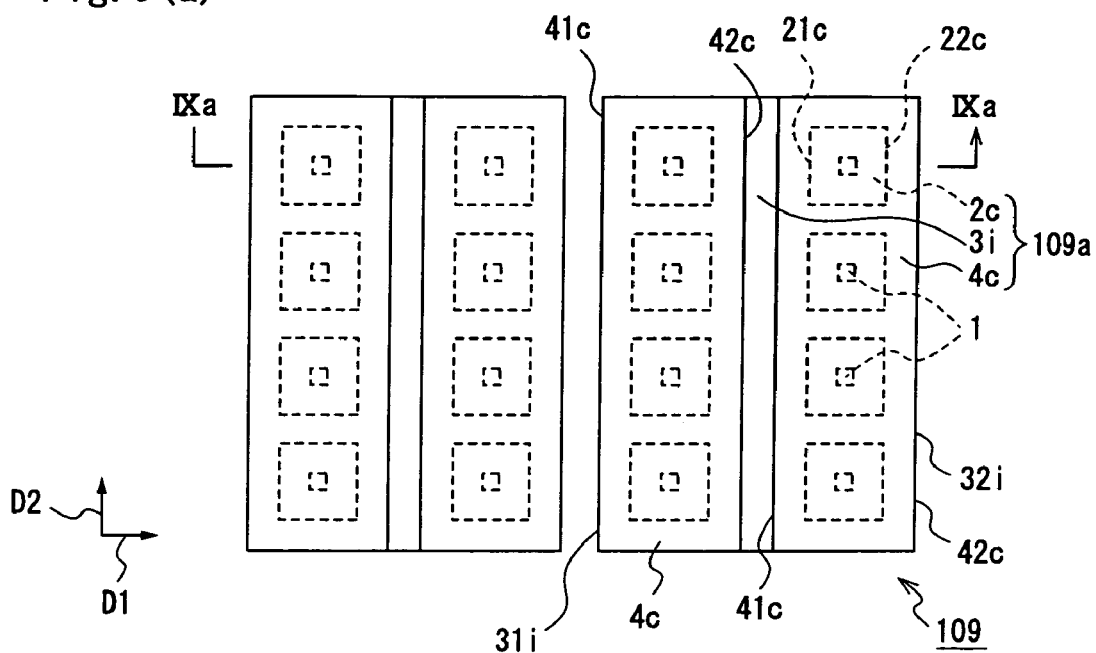
FIG. 9(a) is a diagram for explaining a ferroelectric memory device 109 according to a ninth embodiment of the present invention, and shows a layout of electrodes of ferroelectric capacitors 109a that constitute memory cells.
Figure 9B:
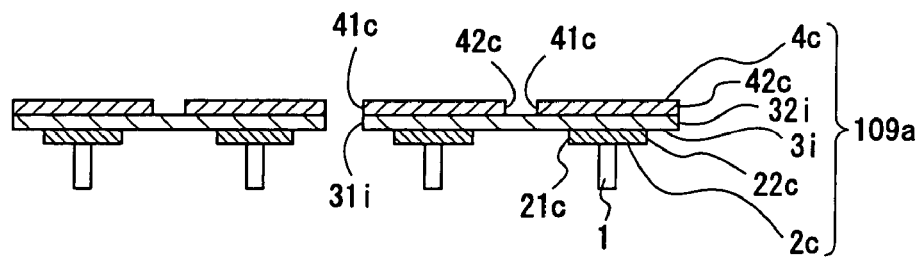

FIG. 9(a) is a diagram for explaining a ferroelectric memory device according to a ninth embodiment of the present invention, and shows a layout of electrodes in ferroelectric capacitors that constitute memory cells. FIG. 9(b) is a cross-sectional view along the line IXa-IXa of FIG. 9(a), and shows a cross-sectional structure of the ferroelectric capacitor.

A ferroelectric memory device 109 according to the ninth embodiment has a memory cell array in which memory cells, each composed of a memory cell transistor and a memory cell capacitor, are arranged, and has a memory cell structure in which some of edges of the upper electrodes of the memory cell capacitor are located at inner positions relative to edges of the ferroelectric layer, and the other edges of the upper electrodes are located to be positioned at the same positions as the edges of the ferroelectric layer of the memory cell capacitor.

More specifically, on the memory cell array (not shown) of the ferroelectric memory device 109 according to the ninth embodiment, memory cells (not shown) are arranged in a matrix along the first direction D1 and the second direction D2. A memory cell capacitor 109a, as a constituent of the respective memory cell, consists of a lower electrode 2c that is formed on a substrate (not shown) via an insulating film (not shown), a ferroelectric layer 3i that is formed on the lower electrode 2c, and an upper electrode 4c that is formed on the ferroelectric layer 3i.

Herein, the lower electrode 2c is connected to an active area (not shown) in the memory cell transistor through a contact 1 similarly as in the third embodiment.

The ferroelectric layer 3i is common to two adjacent memory cell columns along the second direction D2, and has a structure extending over two adjacent columns of the lower electrodes which are arranged along the second direction D2. The left and right edges 21c and 22c parallel to the second direction D2 of the two adjacent columns of the lower electrodes are located at inner positions relative to the left and right edges 31i and 32i parallel to the second direction D2 of the ferroelectric layer 3i.

The left and right edges 41c and 42c parallel to the second direction D2 of the upper electrode 4c, as similarly in the third embodiment, are located at inner positions relative to the left and right edges 31i and 32i of the ferroelectric layer 3i, respectively.

Next, a method of processing the lower electrode 2c, the ferroelectric layer 3i, and the upper electrode 4c of the memory cell capacitor 109a will be briefly described.

Initially, memory cell transistors, insulating films, and contacts 1 are formed in the same manner as in the third embodiment.

Next, a lower electrode layer is formed over the entire surface, and the lower electrode layer is processed so as to form the lower electrode 2c of the respective memory cell capacitor.

Thereafter, a ferroelectric layer and an upper electrode layer are successively formed over the entire surface, and the ferroelectric layer and the upper electrode layer are processed using different masks, respectively.

At this time, the upper electrode layer is processed using a mask having a width that is narrower than that of a mask used at the processing of the ferroelectric layer.

In the practical manufacturing, the ferroelectric layer can be processed after the upper electrode is processed, and also the upper electrode can be processed after the ferroelectric layer is processed. At portions where the edges of the ferroelectric layer and the edges of the upper electrode are located at the same positions, it is possible to process the upper electrode at the same time as processing the ferroelectric layer.

As described above, according to the ninth embodiment, the memory cell has a structure in which the edges of the lower electrode are located at inner positions relative to the edges of the ferroelectric layer. Therefore, no current leakage occurs between the upper electrode and the lower electrode.

Further, in this ninth embodiment, the ferroelectric layer has a wide-stripe shape extending over two adjacent columns of the lower electrode, like in the eighth embodiment. Therefore, no processing is performed to separate the ferroelectric layer between these two lower electrode columns. Accordingly, like the eight embodiment, it is possible to reduce the memory cell area.

Embodiment 10

Figure 10A:
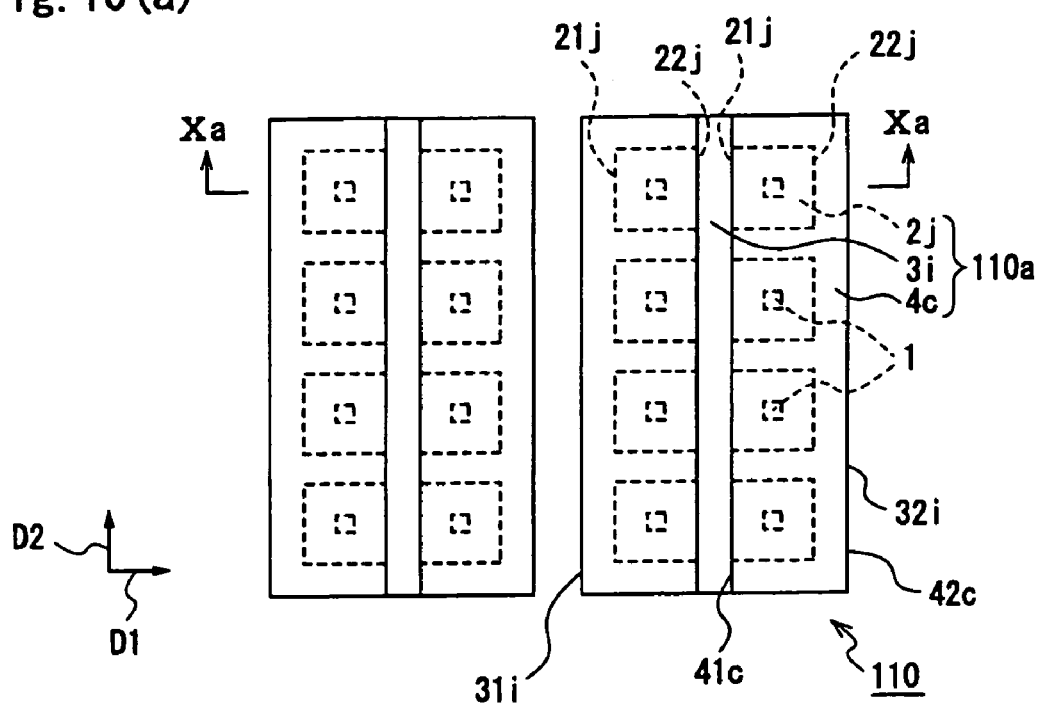
FIG. 10(a) is a diagram for explaining a ferroelectric memory device 110 according to a tenth embodiment of the present invention, and shows a layout of electrodes of ferroelectric capacitors 110a that constitute memory cells.
Figure 10B:
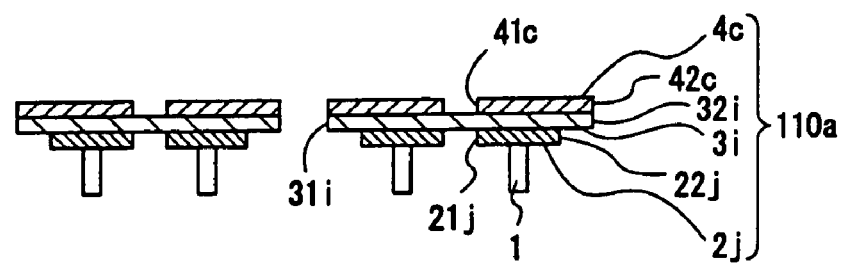

FIG. 10(a) is a diagram for explaining a ferroelectric memory device according to a tenth embodiment of the present invention, and shows a layout of electrodes in ferroelectric capacitors that constitute memory cells. FIG. 10(b) is a cross-sectional view along the line Xa-Xa of FIG. 10(a), and shows a cross-sectional structure of the ferroelectric capacitor.

A ferroelectric memory device 110 according to the tenth embodiment has a memory cell array in which memory cells each composed of a memory cell transistor and a memory cell capacitor are arranged, and has a memory cell structure in which an edge of the upper electrode of the memory cell capacitor is located at an inner position relative to the corresponding edge of the ferroelectric layer of the memory cell capacitor, and is at substantially the same position as the corresponding edge of the lower electrode, and the other edge of the upper electrode is at the same position as that of the corresponding edge of the ferroelectric layer of the memory cell capacitor.

In other words, in the memory structure according to the tenth embodiment, the interval of two columns of the lower electrodes under one ferroelectric layer 3i in the ninth embodiment is narrowed so that the right edge 22j of the lower electrode on the left column and the left edge 21j of the lower electrode on the right column are at the same positions as the right edge 42c of the upper electrode 4c on the left one of two adjacent columns and the left edge 41c of the upper electrode 4c on the right one of the two adjacent columns which are on the ferroelectric layer 3i, respectively.

Here, the memory cell capacitor 110a, as a constituent of the respective memory cells, consists of the lower electrode 2j that is formed on a substrate (not shown) via an insulating film (not shown), the ferroelectric layer 3i that is formed on the lower electrode 2j, and the upper electrode 4c that is formed on the ferroelectric layer 3i.

Next, a method of processing the lower electrode 2j, the ferroelectric layer 3i, and the upper electrode 4c of the memory cell capacitor 110a will be briefly described.

Initially, memory cell transistors, insulating films, and contacts 1 are formed in the same manner as in the first embodiment.

Next, a lower electrode layer is formed over the entire surface, and then the lower electrode layer is processed so as to form the lower electrode 2j that is independent for each of the memory cell capacitors.

Thereafter, a ferroelectric layer and an upper electrode layer are successively formed over the entire surface, and the ferroelectric layer and the upper electrode layer are processed using different masks, respectively.

At this time, the upper electrode layer is processed using a mask having a width that is narrower than that of a mask used at the processing of the ferroelectric layer.

Regarding the practicability of manufacturing, the ferroelectric layer can be processed after the upper electrode is processed, and the upper electrode can be processed after the ferroelectric layer is processed.

Further, the edges of the upper electrode that are at the same positions as the edges of the ferroelectric layer can be processed at the same time as processing the ferroelectric layer.

As described above, in this tenth embodiment, the memory cell is constructed to have a memory cell structure in which the edges of the lower electrode are located at inner positions relative to the edges of the ferroelectric layer. Therefore, no current leakage occurs between the upper electrode and the lower electrode.

Further, because the positions of the opposed edges of the upper electrodes on the ferroelectric layer substantially aligns with the positions of the opposed edges of the two columns lower electrodes under the ferroelectric layer, it is possible to reduce the memory size.

Embodiment 11

Figure 11A:
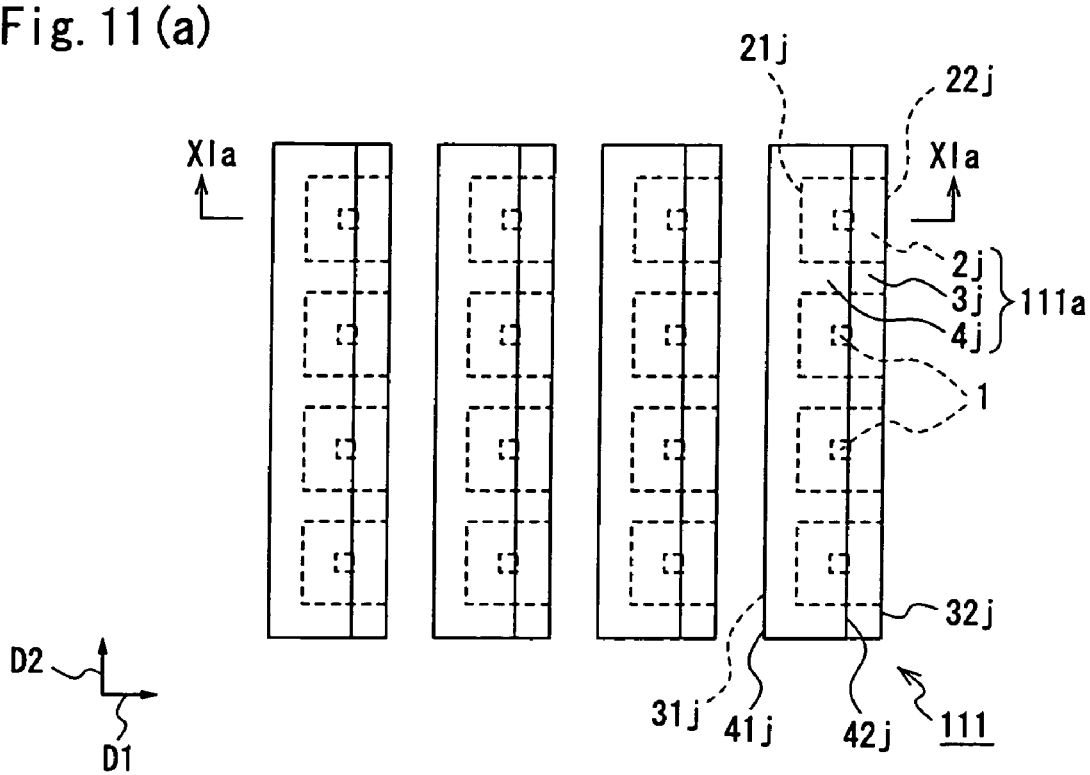
FIG. 11(a) is a diagram for explaining a ferroelectric memory device 111 according to an eleventh embodiment of the present invention, and shows a layout of electrodes of ferroelectric capacitors 111a that constitute memory cells.
Figure 11B:
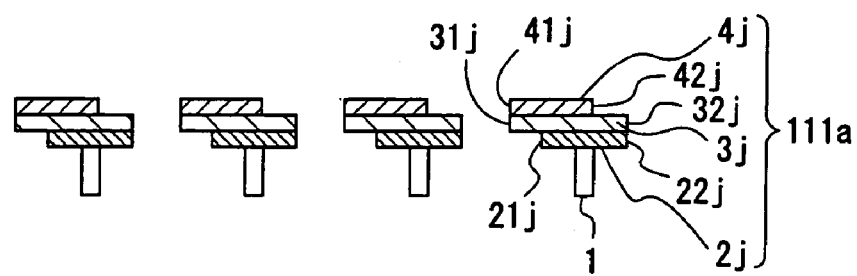

FIG. 11(a) is a diagram for explaining a ferroelectric memory device according to an eleventh embodiment of the present invention, and shows a layout of electrodes of ferroelectric capacitors that constitute memory cells. FIG. 11(b) is a cross-sectional view along the line XIa-XIa of FIG. 11(a), and shows a cross-sectional structure of the ferroelectric capacitor.

A ferroelectric memory device 111 according to the eleventh embodiment has a memory structure in which the upper electrode and the lower electrode in the fifth embodiment are shifted along the first direction (horizontal direction) D1, and the right edge of the upper electrode of the memory cell capacitor is located at an inner position relative to the right edge of the ferroelectric layer, the left edge of the upper electrode is at the same position as the left edge of the ferroelectric layer, the left edge of the lower electrode is located at an inner position relative to the left edge of the ferroelectric layer, and the right edge of the lower electrode is at the same position as the right edge of the ferroelectric layer.

More specifically, on the memory cell array (not shown) of the ferroelectric memory device 111, memory cells (not shown) are arranged in a matrix along the first direction D1 and the second direction D2. A memory cell capacitor 111a, as a constituent of the respective memory cells, consists of a lower electrode 2j that is formed on a substrate (not shown) via an insulating film (not shown), a ferroelectric layer 3j that is formed on the lower electrode 2j, and an upper electrode 4j that is formed on the ferroelectric layer 3j.

The lower electrode 2j is obtained by shifting the lower electrode 2c in the fifth embodiment along the first direction D1 rightward in the drawing so that the right edge 22c thereof coincides with the right edge 32a of the ferroelectric layer 3. The ferroelectric layer 3j is obtained by reducing the width of the ferroelectric layer 3 in the fifth embodiment. The upper electrode 4j is obtained by shifting the upper electrode 4 in the fifth embodiment along the first direction D1 leftward in the drawing so that the left edge 41a thereof coincides with the left edge 31a of the ferroelectric layer 3. Here, reference numerals 21j and 22j denote the left and right edges of the lower electrode 2j, respectively, and numerals 41j and 42j denote the left and right edges of the upper electrode 4j, respectively.

Next, a method of processing the lower electrode 2j, the ferroelectric layer 3j, and the upper electrode 4j of the memory cell capacitor 111a will be briefly described.

Initially, memory cell transistors, insulating films, and contacts 1 are formed in the same manner as in the first embodiment.

Next, a lower electrode layer is formed over the entire surface, and the lower electrode layer is processed to form the lower electrode 2j that is independent for each of the memory cell capacitors.

Thereafter, a ferroelectric layer and an upper electrode layer are successively formed over the entire surface, and the ferroelectric layer and the upper electrode layer are processed using different masks, respectively.

At this time, the upper electrode is processed using a mask having a width that is narrower than that of a mask used at the processing of the ferroelectric layer and is substantially the same as that of a mask for the lower electrode.

Regarding the practicability of manufacturing, the ferroelectric layer can be processed after the upper electrode is processed, and the upper electrode can be processed after the ferroelectric layer is processed.

At a portion in which the edge of the ferroelectric layer and the edge of the upper electrode are at the same position, it is possible to simultaneously process the upper electrode at the time processing the ferroelectric layer.

As described above, according to the eleventh embodiment, the memory cell has a structure in which the edge of the lower electrode is located at an inner position relative to the edge of the ferroelectric layer. Therefore, no current leakage occurs between the upper electrode and the lower electrode.

Further, because the upper electrode and the lower electrode are arranged with shifting to each other along the first direction D1, only a portion which is stable in this film quality in the vicinity of the electrode center, except for the vicinity of the electrode edges, is employed for a ferroelectric capacitor area, thereby realizing a capacitance element of stable characteristics.

Embodiment 12

Figure 12A:
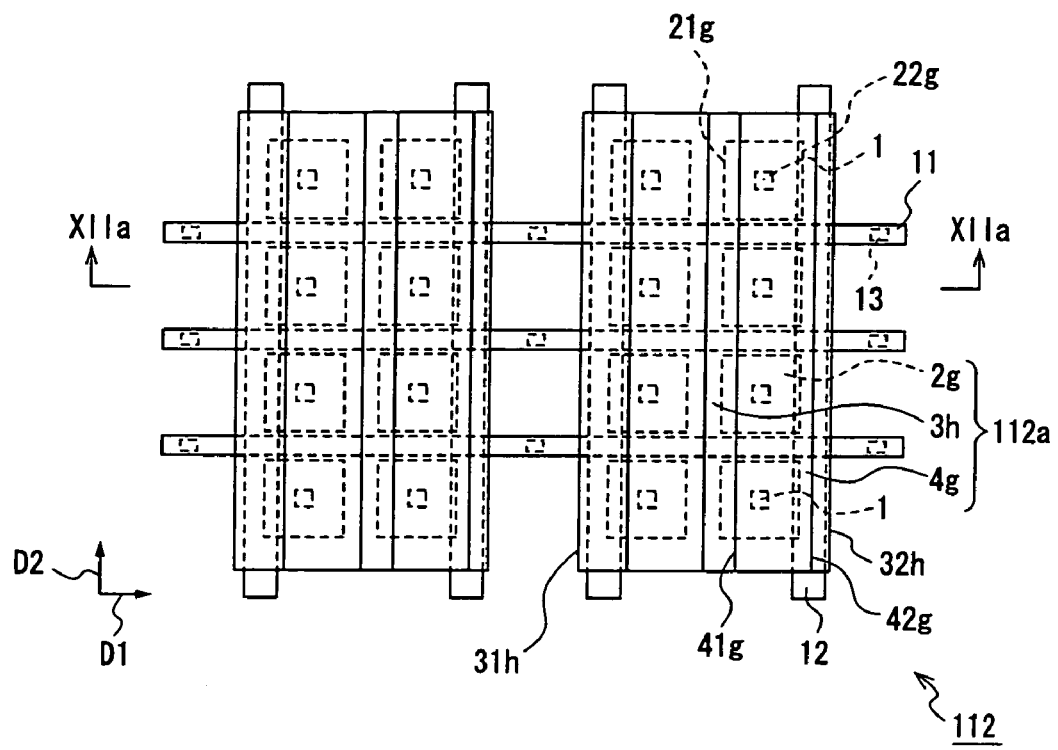
FIG. 12(a) is a diagram for explaining a ferroelectric memory device 112 according to a twelfth embodiment of the present invention, and shows a layout of electrodes of ferroelectric capacitors 112a that constitute memory cell.
Figure 12B:
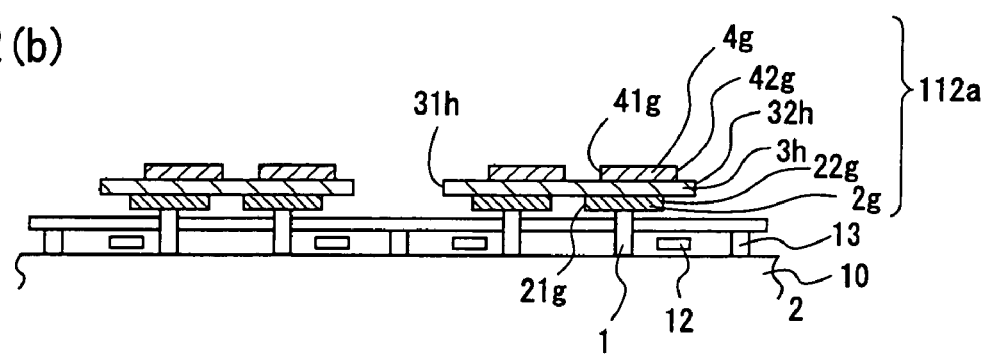

FIG. 12(a) is a diagram for explaining a ferroelectric memory device according to a twelfth embodiment of the present invention, and shows a layout of electrodes in ferroelectric capacitors that constitute memory cells. FIG. 12(b) is a cross-sectional view along the line XIIa-XIIa of FIG. 12(a), and shows a cross-sectional structure of the ferroelectric capacitor.

A ferroelectric memory device 112 according to the twelfth embodiment is one which has specified details of the ferroelectric memory device 108 according to the eighth embodiment. In FIGS. 12(a) and 12(b), the memory cell array, including such as memory cell transistors and bit lines of the ferroelectric memory device 108 according to the eighth embodiment is illustrated.

More specifically, on the memory cell array (not shown) of the ferroelectric memory device 112, memory cells (not shown) are arranged in a matrix along the first direction D1 and the second direction D2. On the memory cell array, plural word lines 12 are arranged along the memory cell arrangement direction D2, and plural bit lines 11 are arranged along the memory cell arrangement direction D1. The portion of the word lines 12 above the active areas of the memory cell transistors are gate electrodes of the memory cell transistors, and the bit lines 11 are connected to the active areas of the memory cell transistors via bit line contacts 13.

A memory cell capacitor 112a, as a constituent of the respective memory cells, consists of a lower electrode 2g that is formed on a substrate 10 via an insulating film (not shown), a ferroelectric layer 3h that is formed on the lower electrode 2g, and an upper electrode 4g that is formed on the ferroelectric layer 3h. Here, the lower electrode 2g, the ferroelectric layer 3h, and the upper electrode 4g are the same as those in the eighth embodiment.

Next, a method of processing the lower electrode 2g, the ferroelectric layer 3h, and the upper electrode 4g of the memory cell capacitor 112a will be briefly described.

Initially, an active area (not shown) of the memory cell transistor is formed on a surface area of the substrate 10, and a word line 12 is formed on the substrate 10 via a gate insulating film (not shown). Further, an inter layer insulating film is formed, then bit line contacts 13 are formed in the inter layer insulating film, and thereafter a bit line 11 is formed so as to be connected to the bit line contacts 13.

Then, after an inter layer insulating film is formed, further, a lower electrode layer is formed on the entire surface, and the lower electrode layer is processed so as to form the lower electrode 2g that is independent for each of the memory cell capacitors.

Thereafter, a ferroelectric layer and an upper electrode layer are successively formed over the entire surface, and the ferroelectric layer and the upper electrode layer are processed using different masks, respectively.

At this time, the upper electrode layer is processed using a mask having a width that is narrower than that of a mask used to process the ferroelectric layer, but substantially the same as a mask for the lower electrode.

Regarding the practicality of manufacturing, the ferroelectric layer can be processed after the upper electrode is processed, and the upper electrode can be processed after the ferroelectric layer is processed.

As described above, according to the twelfth embodiment, the memory cell has a structure in which the edges of the upper electrode are located at inner positions relative to the edges of the ferroelectric layer, and the edges of the lower electrodes are located at inner position relative to the edges of the ferroelectric layer. Therefore, there is no current leakage between the upper electrode and the lower electrode.

Further, since the upper electrode and the lower electrode are arranged with shifting to each other along the first direction D1, only a portion which is stable in this film quality in the vicinity the electrode center, except for the vicinity of the electrode edges, is employed for a ferroelectric capacitor area, thereby realizing a capacitance element of stable characteristics.

Further, according to this twelfth embodiment, because the ferroelectric layer has a wide-stripe shape extending over two adjacent columns of the lower electrodes, like the eighth embodiment, processing to separate the ferroelectric layer is not performed between these two lower electrode columns. Accordingly, like the eighth embodiment, it is possible to further reduce the memory cell area.

In the eighth embodiment, the bit line is located under the memory cell capacitor, while the bit line can be located above the memory cell capacitor.

Embodiment 13

Figure 13A:
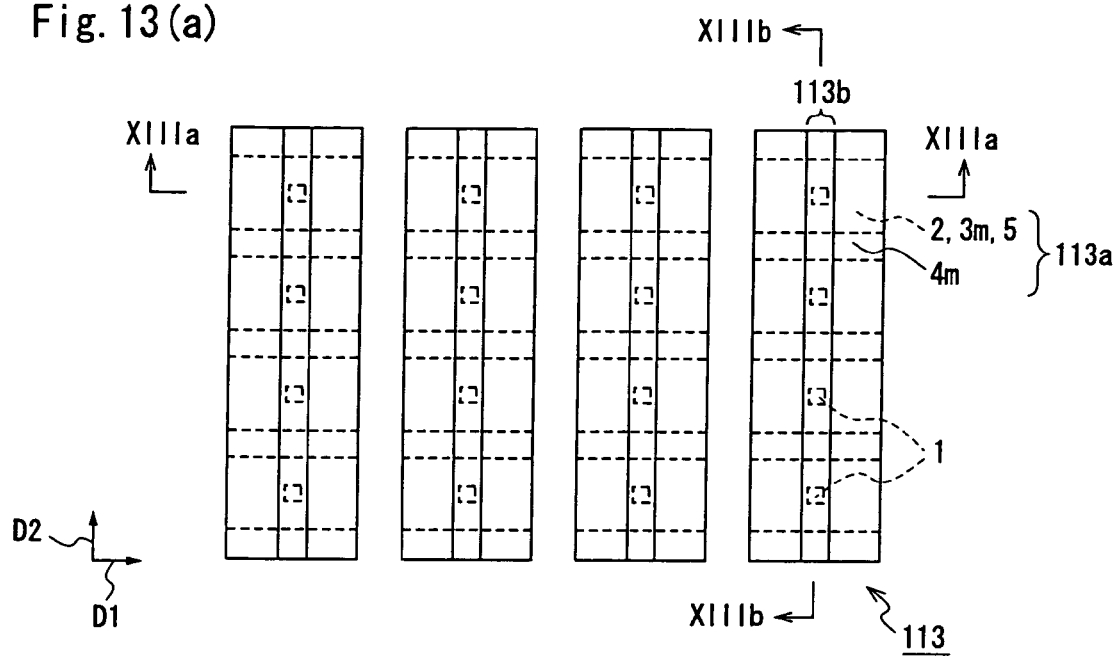
FIG. 13(a) is a diagram for explaining a ferroelectric memory device 113 according to a thirteenth embodiment of the present invention, and shows a layout of electrodes of ferroelectric capacitors 113a that constitute memory cells.
Figure 13B:
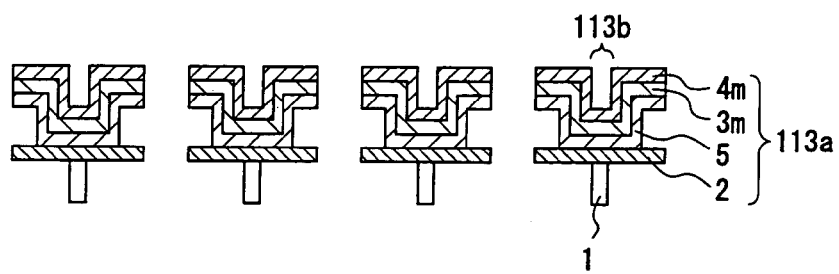
Figure 13C:
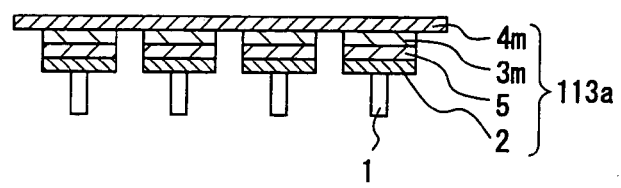

FIG. 13(a) is a diagram for explaining a ferroelectric memory device according to a thirteenth embodiment of the present invention, and shows a layout of electrodes in ferroelectric capacitors that constitute memory cells. FIGS. 13(b) and 13(c) are a cross-sectional view along the line XIIIa-XIIIa of FIG. 13(a) and a cross-sectional view along the line XIIIb-XIIIb of FIG. 13(a), respectively, and show cross-sectional structures of the ferroelectric capacitor. Hereinafter, the ferroelectric capacitor is referred to as a memory cell capacitor.

A ferroelectric memory device 113 according to the thirteenth embodiment has a memory cell array in which memory cells, each composed of a memory cell transistor and a memory cell capacitor, are arranged. Further, according to this thirteenth embodiment, the memory cell of the ferroelectric memory device has a structure in which a groove is formed on plural lower electrodes 2 of the memory cell capacitor along the memory cell arrangement direction D2, so as to extend over these lower electrodes 2, and then a base electrode layer 5, a ferroelectric layer 3m, and an upper electrode 4m are formed in the groove and the circumference area, thereby increasing the capacitance of the memory cell capacitor.

More specifically, on a memory cell array (not shown) of the ferroelectric memory device 113, memory cells (not shown) are arranged along the first direction D1 and the second direction D2. A memory cell capacitor 113a, as a constituent of the respective memory cells, consists of a lower electrode 2 that is formed on a substrate (not shown) via an insulating film (not shown), a base electrode layer 5 that is formed in a stripe-shaped groove across the plural lower electrodes 2 and on the circumference area, a ferroelectric layer 3m that is formed on the base electrode layer 5, and an upper electrode 4m that is formed on the ferroelectric layer 3m.

The lower electrode 2, as a constituent of the memory cell capacitor 113a, is independent for each the memory cell capacitor. That is, the lower electrodes 2 are arranged in a matrix on the memory cell array, and the lower electrode for the respective memory cell capacitors is connected to an active area (not shown) of the corresponding memory cell transistor which is formed on the substrate, via a contact 1 passing through the insulating film. The contact 1 comprises a conductive material in a contact hole that is formed in the insulating film.

In an inter layer insulating film (not shown) formed on the lower electrode, a stripe-shaped opening (herein after, also referred to as a groove) is formed across the plural lower electrodes 2, and the base electrode layer 5 is formed in (i) an area within the stripe-shaped opening where the lower electrode is exposed and (ii) the circumference area. Further, the ferroelectric layer 3m is formed on the base electrode layer 5.

Here, the ferroelectric layer 3m and the base electrode layer 5 are independent for each of the memory cell capacitors, respectively.

The upper electrode 4m is common to a certain number of memory cells which are arranged along the second direction D2, and is formed on the ferroelectric layer 3m in the groove and on the circumference area, so as to extend over the plural lower electrodes 2 which are arranged along the second direction D2.

In this figure, reference numeral 113b denotes a groove extending along the second direction D2, across the plural memory cell capacitors 113a.

Next, a method of processing the lower electrode 2, the base electrode layer 5, the ferroelectric layer 3m, and the upper electrode 4m in the memory cell capacitor 113a will be briefly described.

After memory cell transistors, as constituents of the memory cells, are formed on a substrate (not shown), and an insulating film is formed over the entire surface, contact holes are formed at part, which is the insulating film, corresponding to active areas of the respective memory cell transistors, and then a conductive material is filled in the contact holes to form contacts 1.

After the contacts 1 are formed as described above, a lower electrode layer is formed over the entire surface, and the lower electrode layer is processed to form the lower electrodes 2 of the respective memory cell capacitors.

Then, an inter layer insulating film (not shown) is formed over the entire surface, and a groove is formed in the inter layer insulating film along the second direction D2 so as to reach the lower electrode 2, and the base electrode layer 5 for three-dimensional structure is formed thereon. Further, a ferroelectric layer 3 is formed on the base electrode layer, and in this state of things, the ferroelectric layer and the base electrode layer are processed into stripe shapes that are parallel to the first direction D1 so as to extend over the plural contacts 1 which are arranged along the first direction D1.

Next, an upper electrode layer is formed over the entire surface, and the upper electrode layer is processed into stripe shapes that are parallel to the second direction D2 so as to extend over the plural contacts 1 which are arranged along the second direction D2. At this time, the ferroelectric layer and the base electrode layer, which have previously been processed into stripe shapes, are processed to correspond to the respective memory cell capacitors.

Thus, the memory cell having a memory cell structure according to the thirteenth embodiment is completed.

As described above, according to the thirteenth embodiment, a mask of a stripe shape in the horizontal direction D1 is used to process the lower electrode 2, and a mask of a stripe shape in the vertical direction is used to process the upper electrode 4m. Therefore, it is possible to ensure the dimension of the effective area in the memory cell capacitor, without being affected by mask deviation.

In addition, because the individual memory cell capacitor has a groove-type three-dimensional structure, it is easier to perform the processing for forming recessed portions in the inter layer insulating film, and further, when forming a ferroelectric layer within the recessed portion, the thickness of the layer can be easily made thin, as compared to the conventional memory cell capacitor having a hole-type three-dimensional structure.

Further, since the direction along which the groove formed on the lower electrode of the memory cell capacitor extends is parallel to the direction along which the upper electrode extends, the edges of the upper electrode do not extend over the groove and accordingly it is easy to process the upper electrode.

Consequently, according to the thirteenth embodiment, it is possible to obtain the memory cell capacitor of a three-dimensional structure, which is easy to process and can increase the capacitance of the capacitor.

Embodiment 14

Figure 14A:
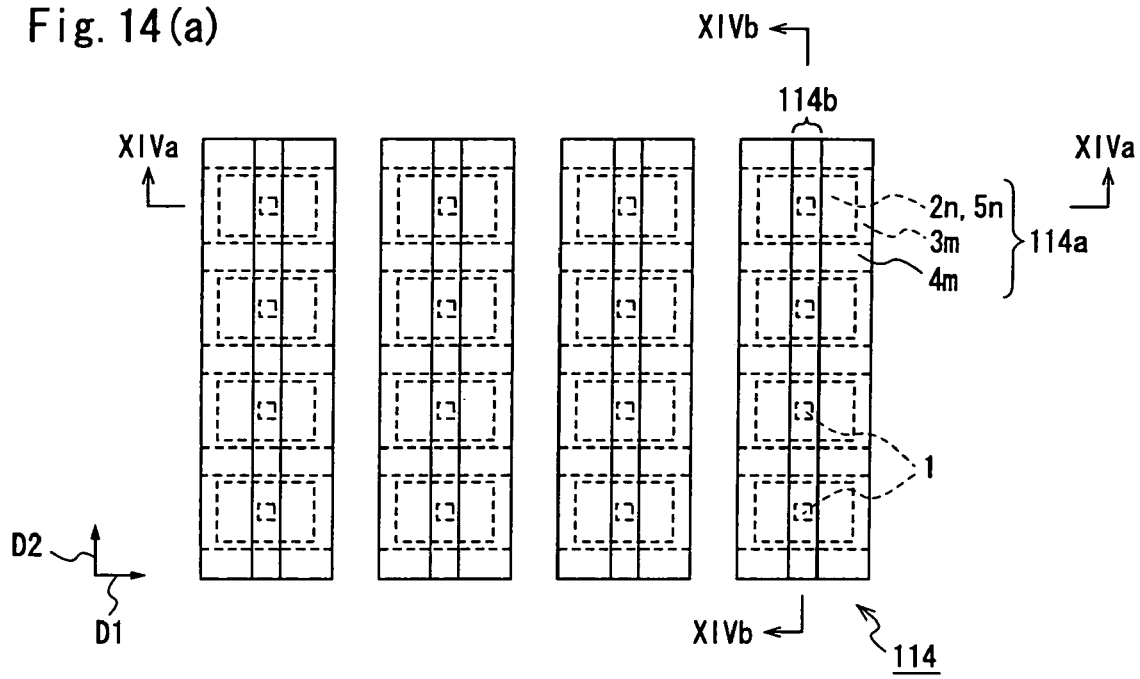
FIG. 14(a) is a diagram for explaining a ferroelectric memory device 114 according to a fourteenth embodiment of the present invention, and shows a layout of electrodes of ferroelectric capacitors 114a that constitute memory cells.
Figure 14B:
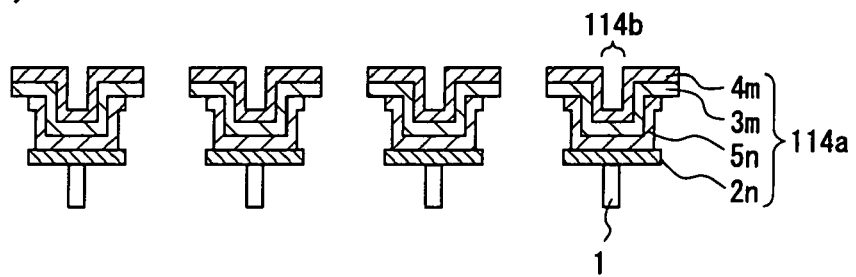
Figure 14C:
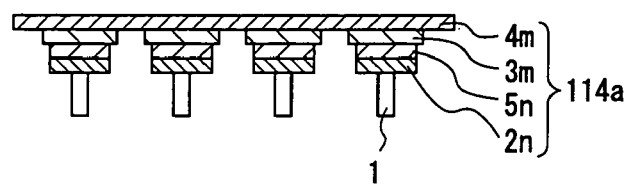

FIG. 14(a) is a diagram for explaining a ferroelectric memory device according to a fourteenth embodiment of the present invention, and shows a layout of electrodes in ferroelectric capacitors that constitute memory cells. FIGS. 14(b) and 14(c) are a cross-sectional view along the line XIVa-XIVa of FIG. 14(a) and a cross-sectional view along the line XIVb-XIVb of FIG. 14(a), respectively, and show cross-sectional structures of the ferroelectric capacitor.

A ferroelectric memory device 114 according to the fourteenth embodiment has a structure in which the dimensions of the upper electrode 4m and the ferroelectric layer 3m in the first direction D1 and the second direction D2 in the ferroelectric memory device 113 according to the thirteenth embodiment are made relatively larger than the dimensions of the lower electrode 2 and the base electrode layer 5 in the first direction D1 and the second direction D2, thereby suppressing current leakage between the upper electrode and the lower electrode.

More specifically, a memory cell capacitor 114a according to the fourteenth embodiment consists of a lower electrode 2n that is formed on a substrate (not shown) via an insulating film (not shown), a base electrode layer 5n that is formed in a stripe-shaped groove across the plural lower electrodes 2n and on the circumference area, a ferroelectric layer 3m that is formed on the base electrode layer 5n, and an upper electrode 4m that is formed on the ferroelectric layer 3m. Here, the dimensions of the lower electrode 2n in the horizontal direction D1 and the vertical direction D2 are the same as dimensions of the base electrode layer 5n in the horizontal direction D1 and the vertical direction D2, and the dimensions of the lower electrode 2n in the horizontal direction D1 and the vertical direction D2 are smaller than the dimensions of the ferroelectric layer 3m in the horizontal direction D1 and the vertical direction D2, respectively. The dimension of the upper electrode 4m in the horizontal direction D1 is the same as the dimension of the ferroelectric layer 3m in the horizontal direction D1.

In this figure, reference numeral 114b denotes a groove along the second direction D2, extending over the plural memory cell capacitors 114a.

Next, a method of processing the lower electrode 2n, the base electrode layer 5n, the ferroelectric layer 3m, and the upper electrode 4m of the memory cell capacitor 114a will be briefly described.

According to this fourteenth embodiment, formation of the memory cell transistors, formation of the insulating film, and formation of the contacts 1 are performed in the same manner as in the thirteenth embodiment.

After the contacts 1 are formed, a lower electrode layer is formed, then an inter layer insulating film is formed thereon, and successively a groove is formed in the inter layer insulating film along the vertical direction D2 so as to reach the lower electrode layer, and then a base electrode layer for three-dimensional structure is formed thereon. Thereafter, the base electrode layer and the lower electrode layer are processed into rectangular shapes so as to correspond to the individual memory cell capacitors, thereby forming the lower electrode 2n and the base electrode layer 5n.

Then, a ferroelectric layer is formed over the entire surface, and the ferroelectric layer is processed into rectangular shapes that are larger than the rectangular shapes of the previously-processed lower electrode 2n, thereby forming the ferroelectric layer 3m.

Thereafter, an upper electrode layer is formed over the entire surface, and the upper electrode layer is processed into a stripe shape that is parallel to the second direction D2 so as to extend over the plural contacts 1 which are arranged along the second direction D2.

Thus, the memory cell 114a of the ferroelectric memory device 114 according to the fourteenth embodiment is completed.

As described above, according to the fourteenth embodiment, since the vertical and horizontal dimensions of the ferroelectric layer 3m are made larger than the vertical and horizontal dimensions of the lower electrode 2n, a memory cell structure in which no current leakage occurs between the upper electrode and the lower electrode can be realized.

In addition, because the individual memory cell capacitor has a groove-type three-dimensional structure like in the thirteenth embodiment, it is easier to perform the processing to form recessed portions in the inter layer insulating film, and further, also when the ferroelectric layer is formed in the recessed portion, the thickness of the layer can be made thin, as compared to the conventional memory cell capacitor having a hole-type three-dimensional structure. As a result, it is possible to obtain a memory cell capacitor of a three-dimensional structure, which is easy to process and can increase the capacitance of the capacitor.

Embodiment 15

Figure 15A:
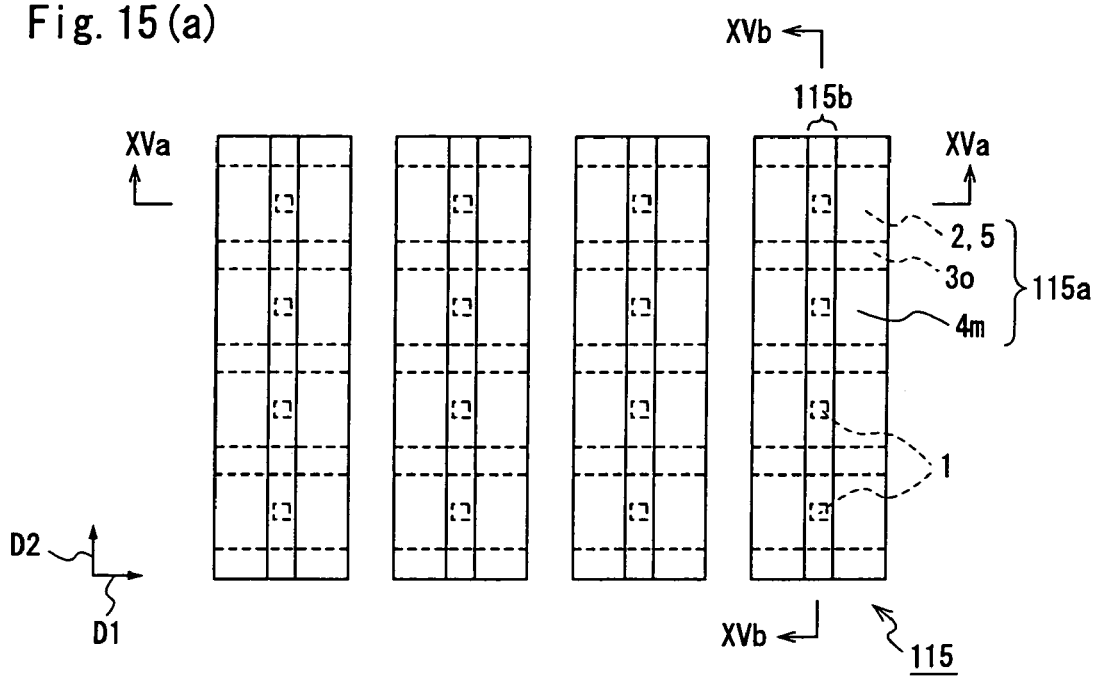
FIG. 15(a) is a diagram for explaining a ferroelectric memory device 115 according to a fifteenth embodiment of the present invention, and shows a layout of electrodes of ferroelectric capacitors 115a that constitute memory cells.
Figure 15B:
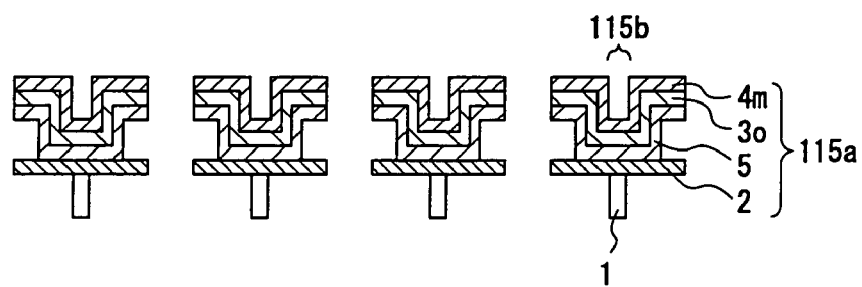
Figure 15C:
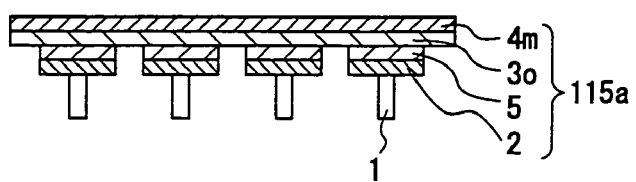

FIG. 15(a) is a diagram for explaining a ferroelectric memory device 115 according to a fifteenth embodiment of the present invention, and shows a layout of electrodes in ferroelectric capacitors that constitute memory cells. FIGS. 15(b) and 15(c) area cross-sectional view along the line XVa-XVa of FIG. 15(a) and a cross-sectional view along the line XVb-XVb of FIG. 15(b), respectively, and show cross-sectional structures of the ferroelectric capacitor.

A ferroelectric memory device 115 according to the fifteenth embodiment is obtained by processing the ferroelectric layer 3m in the ferroelectric memory device 113 according to the thirteenth embodiment at the same time as processing the upper electrode 4m, so that the planar pattern of the ferroelectric layer 3m is made similarly as the planar pattern of the upper electrode 4m. Therefore, in the memory cell structure according to the fifteenth embodiment, the dimension of the ferroelectric layer 3o in the vertical direction D2 is made larger than the vertical dimension of the lower electrode 2, thereby suppressing current leakage between the upper electrode and the lower electrode.

To be more specific, a memory cell capacitor 115a according to the fifteenth embodiment consists of a lower electrode 2 that is formed on a substrate (not shown) via an insulating film (not shown), a base electrode layer 5 that is formed in a groove extending over the plural lower electrodes 2 and on the circumference area, a ferroelectric layer 3o that is formed on the base electrode layer 5, and an upper electrode 4m that is formed on the ferroelectric layer 3o. Here, the dimensions of the lower electrode 2 in the horizontal direction D1 and the vertical direction D2 are the same as those of the base electrode layer 5 in the horizontal direction D1 and the vertical direction D2, and the dimension of the lower electrode 2 in the horizontal direction D1 is the same as the dimension of the ferroelectric layer 3o in the horizontal direction D1, and the dimension of the ferroelectric layer 3o in the vertical direction D2 is larger than the dimension of the lower electrode 2 in the vertical direction D2. Further, the dimensions of the upper electrode 4m in the horizontal direction D1 and the vertical direction D2 are the same as those of the ferroelectric layer 3o in the horizontal direction D1 and the vertical direction D2.

In this figure, reference numeral 115b denotes a groove along the second direction D2, extending over the plural memory cell capacitors 115a.

Next, a method of processing the lower electrode 2, the base electrode layer 5, the ferroelectric layer 3o, and the upper electrode 4m of the memory cell capacitor 115a will be briefly described.

According to the fifteenth embodiment, the formation of the memory cell transistors, the formation of the insulating film, and the formation of the contacts 1 are performed in the same manner as in the thirteenth embodiment.

After the contacts 1 are formed, a lower electrode layer is formed over the entire surface, an inter layer insulating film is formed on the lower electrode layer, and successively a groove is formed in the inter layer insulating film along the vertical direction D2 so as to reach the lower electrode layer, and a base electrode layer for three-dimensional structure is formed thereon. Thereafter, the base electrode layer and the lower electrode layer are processed into rectangular shapes so as to correspond to the individual memory cell capacitors, thereby forming the lower electrode 2 and the base electrode 5.

Then, a ferroelectric layer and an upper electrode layer are formed over the entire surface, and the upper electrode layer and the ferroelectric layer are processed in stripe shapes that are parallel to the second direction D2 so as to extend over the plural contacts 1 which are arranged along the second direction D2, thereby forming the ferroelectric layer 3o and the upper electrode 4m.

Thus, the memory cell 115a of the ferroelectric memory device 115 according to the fifteenth embodiment is completed.

As described above, since the vertical dimension of the ferroelectric layer is made larger than the vertical dimension of the lower electrode according to the fifteenth embodiment, it is possible to realize a memory cell structure in which current leakage between the upper electrode and the lower electrode is hard to occur.

Further, because the individual memory cell capacitor has a groove-type three-dimensional structure as in the thirteenth embodiment, it is easier to perform the processing to form recessed portions in the inter layer insulating film, and further, also when the ferroelectric layer is formed in the recessed portions, the thickness of the layer can be easily made thin, as compared to the memory cell capacitor having a conventional hole-type three-dimensional structure. Consequently, it is possible to obtain a memory cell capacitor of three-dimensional structure, which is easy to process and can increase the capacitance of the capacitor.

Embodiment 16

Figure 16A:
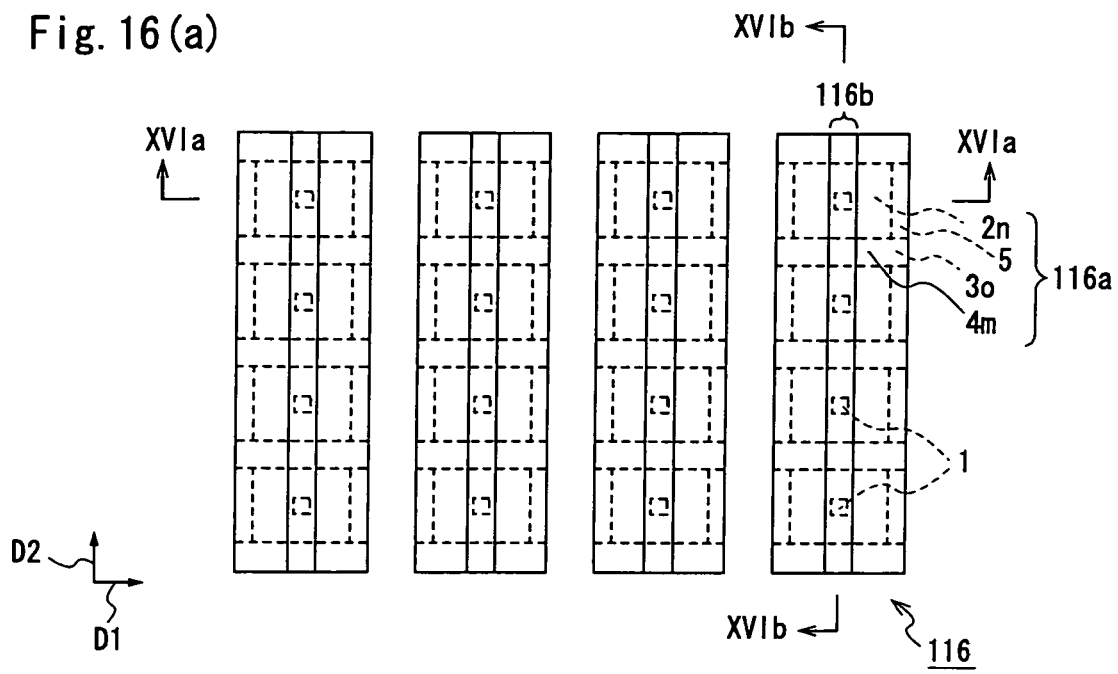
FIG. 16(a) is a diagram for explaining a ferroelectric memory device 116 according to a sixteenth embodiment of the present invention, and shows a layout of electrodes of ferroelectric capacitors 116a that constitute memory cells.
Figure 16B:
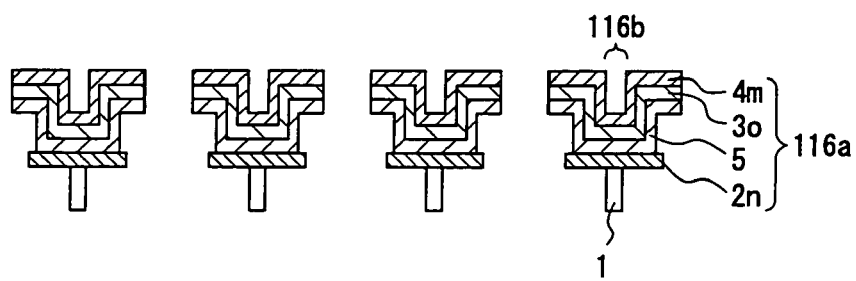
Figure 16C:
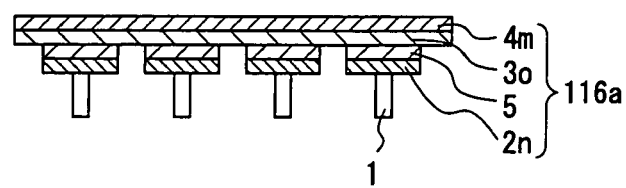

FIG. 16(a) is a diagram for explaining a ferroelectric memory device according to a sixteenth embodiment of the present invention, and shows a layout of electrodes in ferroelectric capacitors that constitute memory cells. FIGS. 16(b) and 16(c) area cross-sectional view along the line XVIa-XVIa of FIG. 16(a) and a cross-sectional view along the line XVIb-XVIb of FIG. 16(a), respectively, and show cross-sectional structures of the ferroelectric capacitor.

A ferroelectric memory device 116 according to the sixteenth embodiment is obtained by making the dimension of the lower electrode 2 in the horizontal direction D1 in the ferroelectric memory device 115 according to the fifteenth embodiment smaller than the dimension of the upper electrode 4m in the horizontal direction D1. The lower electrode 2n in the sixteenth embodiment may be any type so long as it is electrically connected to a base electrode 5 for three-dimensional structure. According to the sixth embodiment, by making the lower electrode 2n smaller, it is possible to overcome problems such as a short circuit between different lower electrodes 2n, in the manufacturing process.

More specifically, a memory cell capacitor 116a according to the sixteenth embodiment consists of a lower electrode 2n that is formed on a substrate (not shown) via an insulating film (not shown), a base electrode layer 5 that is formed in a groove extending over the plural lower electrodes 2n and on the circumference area, a ferroelectric layer 3o that is formed on the base electrode layer 5, and an upper electrode 4m that is formed on the ferroelectric layer 3o. Here, the dimension of the lower electrode 2n in the horizontal direction D1 is smaller than the dimension of the base electrode layer 5 in the horizontal direction D1, and the dimension of the lower electrode 2n in the vertical direction D2 is the same as the dimension of the base electrode layer 5 in the vertical direction D2. The dimension of the lower electrode 2 in the horizontal direction D1 is smaller than the dimension of the ferroelectric layer 3o in the horizontal direction D1. Further, the dimensions of the upper electrode 4m in the horizontal direction D1 and the vertical direction D2 are the same as those of the ferroelectric layer in the horizontal direction D1 and the vertical direction D2, respectively.

In this figure, reference numeral 116b denotes a groove extending along the second direction D2 over the plural memory cell capacitors 116.

Next, a method of processing the lower electrode 2n, the base electrode layer 5, the ferroelectric layer 3o, and the upper electrode 4m of the memory cell capacitor 116a will be briefly described.

According to the sixteenth embodiment, formation of memory cell transistors, formation of an insulating film, and formation of contacts 1 are performed in the same manner as in the thirteenth embodiment.

After the contacts 1 are formed, a lower electrode layer is formed on the entire surface, and the lower electrode layer is once processed into stripe shapes that are parallel to the second direction 2 so as to extend over the plural contacts 1 which are arranged along the second direction D2.

Thereafter, an inter layer insulating film is formed over the entire surface, then a groove is successively formed in the inter layer insulating film along the vertical direction D2 so as to reach the lower electrode layer, and a base electrode layer for three-dimensional structure is formed thereon. Then, the base electrode layer and the lower electrode layer are processed into rectangular shapes so as to correspond to the individual memory cell capacitors, thereby forming the lower electrode 2n and the base electrode layer 5.

Then, a ferroelectric layer and an upper electrode layer are formed over the entire surface, and the upper electrode layer and the ferroelectric layer are processed into stripe shapes that are parallel to the second direction D2 so as to extend over the plural contacts 1, which are arranged along the second direction D2, thereby forming the ferroelectric layer 3o and the upper electrode 4m.

As described above, since the horizontal dimension of the ferroelectric layer is made larger than the horizontal dimension of the lower electrode according to the sixteenth embodiment, a memory cell structure in which current leakage between the upper electrode and the lower electrode is hard to occur can be realized.

In addition, by reducing the dimension of the lower electrode 2n in the horizontal direction D1, the problems such as a short circuit between the different lower electrodes 2 can be overcome or suppressed in the manufacturing process.

Further, because the individual memory cell capacitor has a groove-type three-dimensional structure as in the thirteenth embodiment, it is easier to perform the processing to form recessed portions in the inter layer insulating film, and also when the ferroelectric layer is formed in the recessed portion, the thickness of the layer can be easily made thin, as compared to the conventional memory cell capacitor having a hole-type three-dimensional structure. Consequently, it is possible to obtain a memory cell capacitor of three-dimensional structure, which is easier to be processed and can increase the capacitance.

Embodiment 17

Figure 17A:
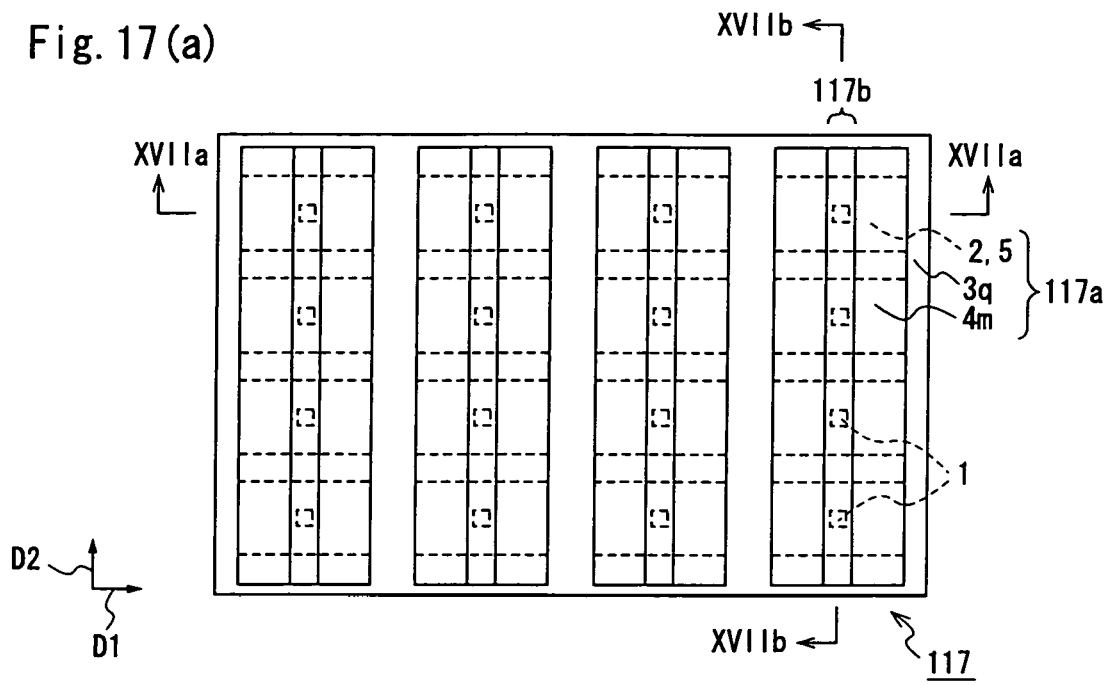
FIG. 17(a) is a diagram for explaining a ferroelectric memory device 117 according to a seventeenth embodiment of the present invention, and shows a layout of electrodes of ferroelectric capacitors 117a that constitute memory cells.
Figure 17B:
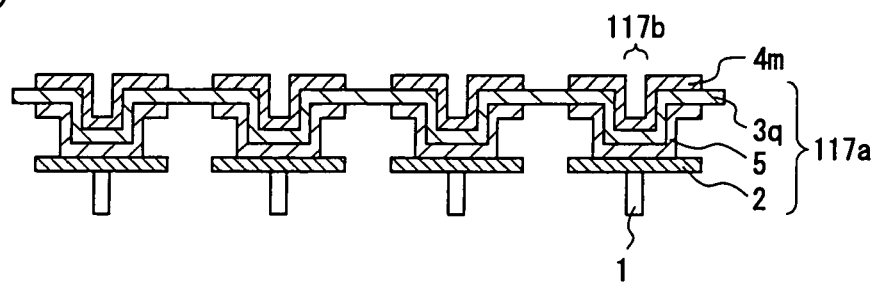
Figure 17C:
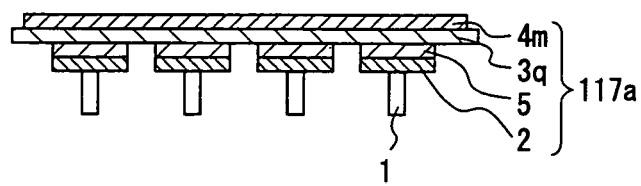

FIG. 17(a) is a diagram for explaining a ferroelectric memory device according to a seventeenth embodiment of the present invention, and shows a layout of electrodes in a ferroelectric capacitor 117a that constitutes memory cells. FIGS. 17(b) and 17(c) are a cross-sectional view along the line XVIIa-XVIIa of FIG. 17(a) and a cross-sectional view along the line XVIIb-XVIIb of FIG. 17(a), respectively, and show cross-sectional structures of the ferroelectric capacitor.

A ferroelectric memory device 117 according to the seventeenth embodiment has a structure in which the ferroelectric layer in the ferroelectric memory device 115 according to the fifteenth embodiment is replaced with a ferroelectric layer extending over the entire memory cell array, thereby suppressing current leakage between the upper electrode and the lower electrode.

To be more specific, a memory cell capacitor 117a according to the seventeenth embodiment consists of a lower electrode 2 that is formed on a substrate (not shown) via an insulating film (not shown), a base electrode layer 5 that is formed in a groove extending over the plural lower electrodes 2 and on the circumference area, a ferroelectric layer 3q that is formed on the base electrode layer 5, and an upper electrode 4m that is formed on the ferroelectric layer 3q. Here, the dimensions of the lower electrode 2 in the horizontal direction D1 and the vertical direction D2 are the same as those of the base electrode layer 5 in the horizontal direction D1 and the vertical direction D2, respectively. Further, the dimension of the upper electrode 4m in the horizontal direction D1 is the same as the dimension of the lower electrode 2 in the horizontal direction D1. The ferroelectric layer 3q extends over the entire memory cell array both in the horizontal direction D1 and the vertical direction D2.

Next, a method of processing the lower electrode 2, the base electrode layer 5, the ferroelectric layer 3q, and the upper electrode 4m of the memory cell capacitor 117a will be briefly described.

According to the seventeenth embodiment, formation of memory cell transistors, formation of an insulating film, and formation of contacts 1 are performed in the same manner as in the thirteenth embodiment.

After the contacts 1 are formed, a lower electrode layer is formed over the entire surface, then an inter layer insulating film is formed thereon, and a groove is formed in the inter layer insulating film along the vertical direction D2 so as to reach the upper electrode layer, and then a base electrode layer for three-dimensional structure is formed thereon. The base electrode layer is processed in rectangular shapes corresponding to the respective memory cells.

Then, a ferroelectric layer 3q and an upper electrode layer are formed over the entire surface, and the upper electrode layer is processed into stripe shapes which are parallel to the second direction D2 so as to extend over the plural contacts 1 that are arranged along the second direction D2, thereby forming the upper electrode 4m.

Thus, the memory cell structure of the ferroelectric memory device 117 according to the seventeenth embodiment is completed.

As described above, since the size of the ferroelectric layer is made larger than the size of the upper electrode in the seventeenth embodiment, the memory cell structure in which current leakage between the upper electrode and the lower electrode hardly occurs can be realized.

In addition, because the individual memory cell capacitor has a groove-type three-dimensional structure as in the thirteenth embodiment, it is easier to perform the processing to form recessed portions in the inter layer insulating film, and when the ferroelectric layer is formed in the recessed portion, the thickness of the layer can be easily made thin, as compared to the conventional memory cell capacitor having a hole-type three-dimensional structure. Consequently, it is possible to obtain a memory cell capacitor of a three-dimensional structure, which is easy to process and can increase the capacitance.

In addition, even when the positional relation between the upper electrode 4m and the base electrode layer 5 is changed in the left or right direction due to mask deviation, the capacitances of the respective memory cells become the same. Further, by preventing the positional relation between the upper electrode 4m and the base electrode layer 5 from being changed, it is also possible to stabilize the capacitance value of the memory cell.

Embodiment 18

Figure 18A:
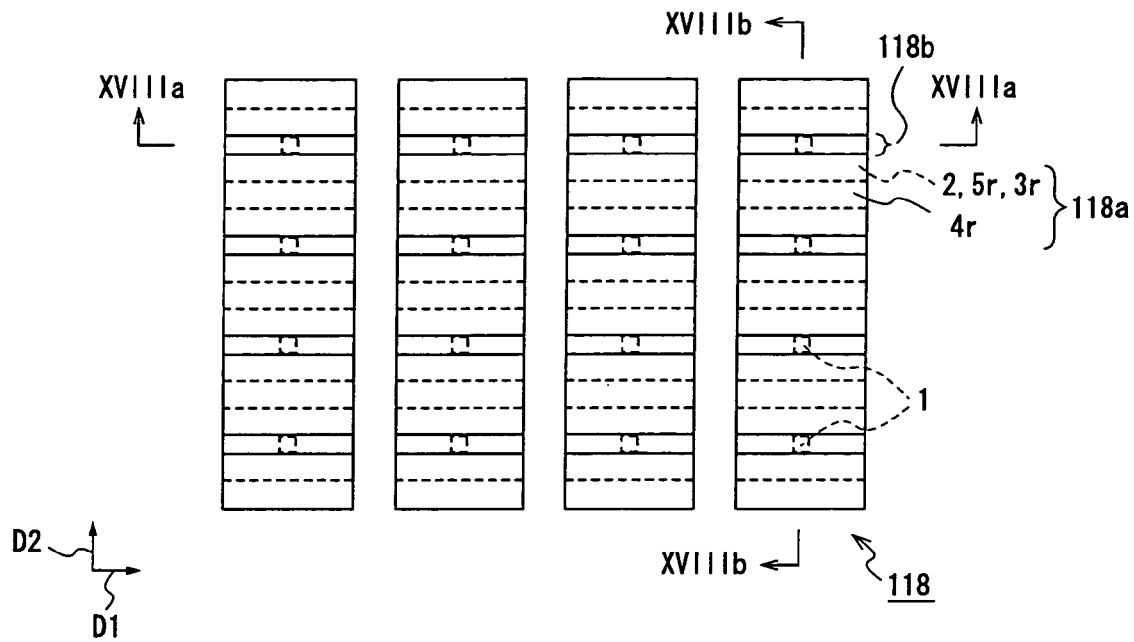
FIG. 18(a) is a diagram for explaining a ferroelectric memory device 118 according to an eighteenth embodiment of the present invention, and shows a layout of electrodes of ferroelectric capacitors 118a that constitute memory cells.
Figure 18B:
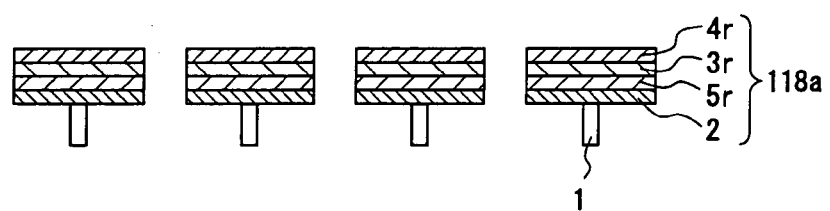
Figure 18C:
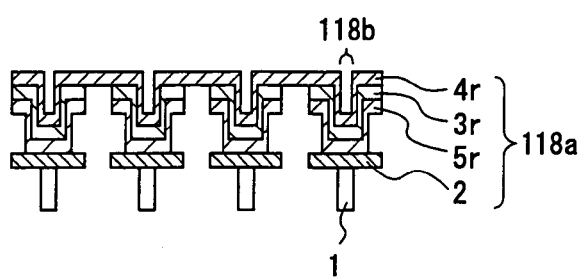

FIG. 18(a) is a diagram for explaining a ferroelectric memory device according to an eighteenth embodiment of the present invention, and shows a layout of electrodes in ferroelectric capacitors that constitute memory cells. FIGS. 18(b) and 18(c) are a cross-sectional view along the line XVIIIa-XVIIIa of FIG. 18(a) and a cross-sectional view along the line XVIIIb-XVIIIb of FIG. 18(a), respectively, and show cross-sectional structures of the ferroelectric capacitor.

A ferroelectric memory device 118 according to the eighteenth embodiment has a memory cell array in which memory cells each composed of a memory cell transistor and a memory cell capacitor are arranged. The ferroelectric memory device 118 according to the eighteenth embodiment has a memory cell structure in which a groove along the horizontal direction D1 is formed on a lower electrode 2 of the memory cell capacitor, and a base electrode layer 5r, a ferroelectric layer 3r, and an upper electrode 4r are formed in the groove and on the circumference area, thereby increasing the capacitance of the memory cell capacitor.

More specifically, on the memory cell array (not shown) of the ferroelectric memory device 118, memory cells (not shown) are arranged in a matrix along the first direction D1 and the second direction D2. A memory cell capacitor 118a, as a constituent of the respective memory cell, consists of a lower electrode 2 that is formed on a substrate (not shown) via an insulating film (not shown), a base electrode layer 5r that is formed in a stripe-shaped groove extending over the plural lower electrodes 2 and on the circumference area, a ferroelectric layer 3r that is formed on the base electrode layer 5r, and an upper electrode 4r that is formed on the ferroelectric layer 3r.

The lower electrode 2, as a constituent of the memory cell capacitor 118a, is independent for each of the memory cell capacitors. That is, the lower electrodes 2 are arranged in a matrix on the memory cell array, and the lower electrode of the respective memory cell capacitor is connected to an active area (not shown) of the corresponding memory cell transistor, which is formed on the substrate, via a contact 1 passing through the insulating film. Here, the contact 1 comprises a conductive material in a contact hole that is formed in the insulating film.

In addition, in an inter layer insulating film (not shown) that is formed on the lower electrode 2, a stripe-shaped opening (groove) is formed along the first direction D1 over the plural lower electrodes 2, and the base electrode layer 5r is formed in an area within the groove where the lower electrode 2 is exposed and the circumference area. Further, the ferroelectric layer 3r is formed on the base electrode layer 5r.

The ferroelectric layer 3r and the base electrode layer 5r are independent for each the memory cell capacitor, respectively.

The upper electrode 4r is common to a certain number of memory cells which are arranged along the second direction D2, and is formed on the ferroelectric layer 3r in the groove and on the circumference area, extending over the plural lower electrodes 2 which are arranged along the second direction D2.

In this figure, reference numeral 118b denotes a groove along the first direction D1 in the respective memory cell capacitor 118a.

Next, a method of processing the lower electrode 2, the base electrode layer 5r, the ferroelectric layer 3r, and the upper electrode 4r of the memory cell capacitor 118a will be briefly described.

After memory cell transistors, as constituents of the memory cells, are formed on a substrate (not shown), and an insulating film is formed on the entire surface, contact holes are formed in the insulating film at parts corresponding to the active areas of the respective memory cell transistors, and contacts 1 are formed by filling a conductive material in the contact holes.

After the contacts 1 are formed as described above, a lower electrode layer is formed on the entire surface, and the lower electrode layer is processed to form the lower electrodes 2 for the respective memory cell capacitors.

An insulating film is formed thereon, then a groove is formed in the insulating film along the first direction D1 so as to reach the lower electrodes 2, and a base electrode layer for three-dimensional structure is formed thereon. Further, a ferroelectric layer is formed on the base electrode layer, and in this state, the ferroelectric layer and the base electrode layer are processed in stripe shapes that are parallel to the first direction D1, extending over the plural contacts 1 which are arranged along the first direction D1.

Next, an upper electrode layer is formed on the entire surface, and the upper electrode layer is processed in stripe shapes that are parallel to the second direction D2 so as to extend over the plural contacts 1 which are arranged along the second direction D2. Thus, the memory cell structure in the ferroelectric memory device 118 according to the eighteenth embodiment is completed.

As described above, according to the eighteenth embodiment, since a mask of a strip shape along the horizontal direction D1 is used to process the lower electrode 2 and a mask of a strip shape along the vertical direction is used to process the lower electrode 4r, it is possible to ensure the dimension of the effective area of the memory cell capacitor without being affected by mask deviation.

In addition, because the individual memory cell capacitor has a groove-type three-dimensional structure, it is easier to perform the processing for forming recessed portions in the inter layer insulating film, and further, when the ferroelectric layer is formed in the groove, the thickness of the layer can be easily made thin, as compared to the conventional memory cell capacitor of a hole-type three-dimensional structure.

Further, according to the eighteenth embodiment, since the direction along which the groove formed on the lower electrode of the memory cell capacitor extends is perpendicular to the direction along which the upper electrode extends, it is possible to make an area in which the upper electrode and the lower electrode oppose each other in a plane shape that is longer in the direction perpendicular to the direction along which the upper electrode extends, thereby effectively increasing the capacitance of the capacitor.

Embodiment 19

Figure 19A:
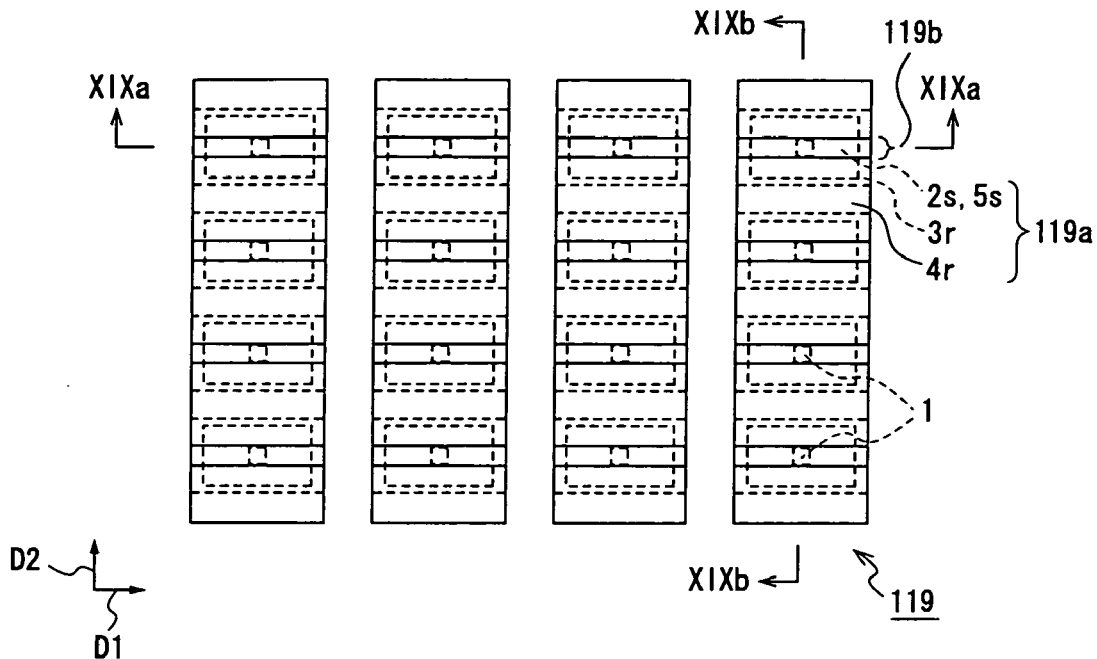
FIG. 19(a) is a diagram for explaining a ferroelectric memory device 119 according to a nineteenth embodiment of the present invention, and shows a layout of electrodes of ferroelectric capacitors 119a that constitute memory cells.
Figure 19B:
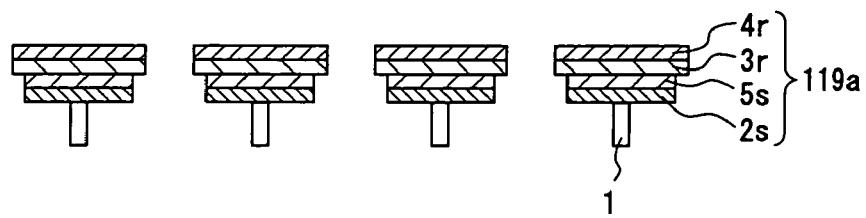
Figure 19C:
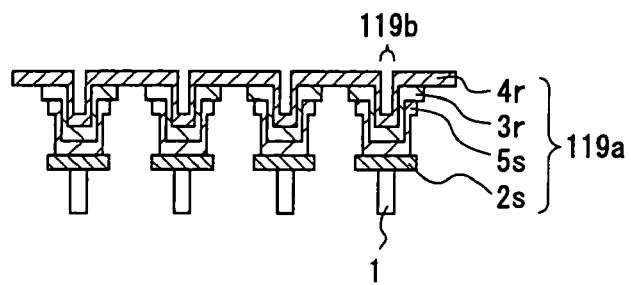

FIG. 19(a) is a diagram for explaining a ferroelectric memory device according to a nineteenth embodiment of the present invention, and shows a layout of electrodes in ferroelectric capacitors that constitute memory cells. FIGS. 19(b) and 19(c) area cross-sectional view along the line XIXa-XIXa of FIG. 19(a) and a cross-sectional view along the line XIXb-XIXb of FIG. 19(a), respectively, and show cross-sectional structures of the ferroelectric capacitor.

A ferroelectric memory device 119 according to a nineteenth embodiment is obtained by making the vertical and horizontal dimensions of the lower electrode 2 and the base electrode layer 5r for three-dimensional structure in the ferroelectric memory device 118 of the eighteenth embodiment smaller than the vertical and horizontal dimensions of the ferroelectric layer 3r, respectively.

To be more specific, a memory cell capacitor 119a according to the nineteenth embodiment consists of a lower electrode 2s that is formed on a substrate (not shown) via an insulating film (not shown), a base electrode layer 5s that is formed in a groove formed in an inter layer insulating film on the lower electrode and on the circumference area, a ferroelectric layer 3r that is formed on the base electrode layer 5s, and an upper electrode 4r that is formed on the ferroelectric layer 3r. Here, the dimensions of the lower electrode 2s in the horizontal direction D1 and the vertical direction D2 are the same as those of the base electrode layer 5s in the horizontal direction D1 and the vertical direction D2, respectively. The dimensions of the lower electrode 2s in the horizontal direction D1 and the vertical direction D2 are smaller than those of the ferroelectric layer 3r in the horizontal direction D1 and the vertical direction D2, respectively.

In this figure, reference numeral 119b denotes a groove along the first direction D1 in the respective memory cell capacitor 119a.

Next, a method of processing the lower electrode 2s, the base electrode layer 5s, the ferroelectric layer 3r, and the upper electrode 4r of the memory cell capacitor 119a will be briefly described.

According to the nineteenth embodiment, formation of memory cell transistors, formation of an insulating film, and the formation of contacts 1 are performed in the same manner as in the thirteenth embodiment.

After the contacts 1 are formed, a lower electrode layer is formed on the entire surface, and the lower electrode layer is processed in rectangular shapes each corresponding to the individual memory cell capacitor, thereby forming the lower electrodes 2s.

An inter layer insulating film is formed thereon, then a groove is formed in the inter layer insulating film along the horizontal direction D1 so as to reach the lower electrodes, and then a base electrode layer for three-dimensional structure is formed thereon. The base electrode layer is processed into the same rectangular shapes as the lower electrode 2s, thereby forming the base electrode layer 5s.

Further, a ferroelectric layer 3 is formed thereon, and the ferroelectric layer is processed in stripe shape that is parallel to the first direction D1, so as to extend over the plural contacts 1 which are arranged along the first direction D1.

Next, an upper electrode layer is formed, and the upper electrode layer and the ferroelectric layer are processed in stripe shape which is parallel to the second direction D2 so as to extend over the plural contacts 1 which are arranged along the second direction D2, thereby forming the ferroelectric layer 3r and the upper electrode 4r.

Thus, the memory cell structure in the ferroelectric memory device 119 according to the nineteenth embodiment is completed.

As described above, since the vertical and horizontal dimensions of the base electrode layer 5s are made smaller than the vertical and horizontal dimensions of the ferroelectric layer 3r in the nineteenth embodiment, it is possible to realize a memory cell structure in which current leakage between the upper electrode and the lower electrode hardly occurs.

In addition, because the individual memory cell capacitor has a groove-type three-dimensional structure, it is easier to perform the processing for forming recessed portions in the inter layer insulating film, and further, when the ferroelectric layer is formed in the recessed portion, the thickness of the layer can be easily made thin, as compared to the conventional memory cell capacitor having a hole-type three-dimensional structure. Consequently, it is possible to obtain a memory cell capacitor of three-dimensional structure, which is easy to process and can increase the capacitance of the capacitor.

Further, according to the nineteenth embodiment, since the direction along which the groove formed on the upper electrode of the memory cell capacitor extends is perpendicular to the direction along which the upper electrode extends, it is possible to make the area in which the upper electrode and the lower electrode oppose to each other in a plane shape that is longer in a direction perpendicular to the direction along which the upper electrode extends, thereby effectively increasing the capacitance of the capacitor.

Embodiment 20

Figure 20A:
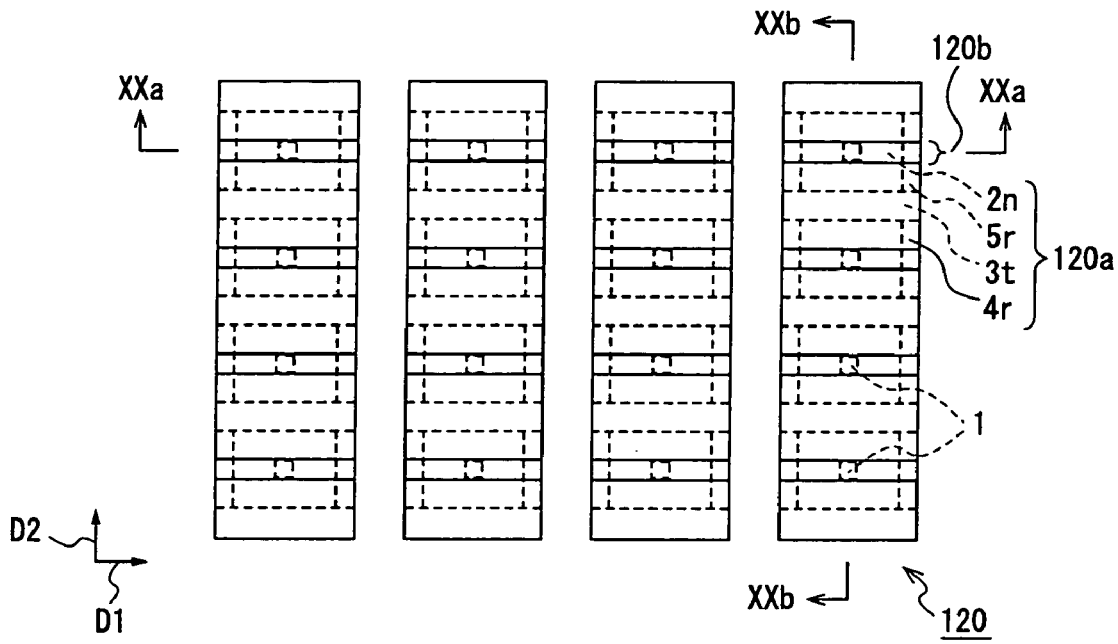
FIG. 20(a) is a diagram for explaining a ferroelectric memory device 120 according to a twentieth embodiment of the present invention, and shows a layout of electrodes of ferroelectric capacitors 120a that constitute memory cells.
Figure 20B:
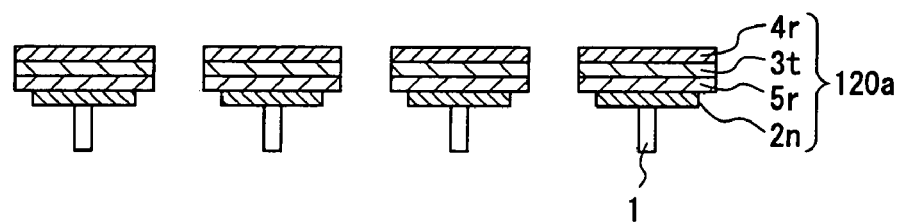
Figure 20C:
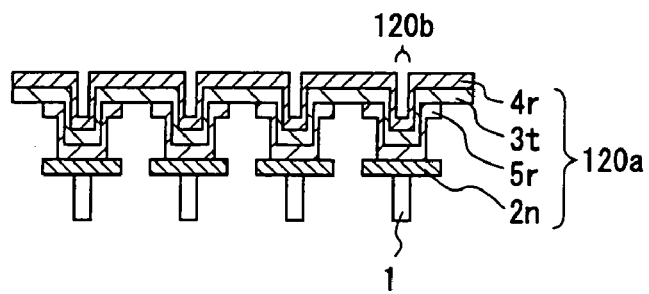

FIG. 20(*a*) is a diagram for explaining a ferroelectric memory device according to a twentieth embodiment of the present invention, and shows a layout of electrodes in ferroelectric capacitors that constitute memory cells. FIGS. 20(*b*) and 20(*c*) are a cross-sectional view along the line XXa-XXa of FIG. 20(*a*), and a cross-sectional view along the line XXb-XXb of FIG. 20(*a*), respectively, and show cross-sectional structures of the ferroelectric capacitor.

A ferroelectric memory device 120 according to the twentieth embodiment is obtained by making the planar pattern of the ferroelectric layer in the ferroelectric memory device 118 according to the eighteenth embodiment the same as that of the upper electrode 4r in the ferroelectric memory device 118. Further, in this twentieth embodiment, the ferroelectric layer and the upper electrode layer are obtained by simultaneous patterning.

More specifically, a memory cell capacitor 120 according to the twentieth embodiment consists of a lower electrode 2n that is formed on a substrate (not shown) via an insulating film (not shown), a base electrode layer 5r that is formed in a groove on the lower electrode 2n and on the circumference area, a ferroelectric layer 3t that is formed on the base electrode layer 5r, and an upper electrode 4r that is formed on the ferroelectric layer 3t. Here, the dimension of the lower electrode 2n in the horizontal direction D1 is smaller than the dimension of the base electrode layer 5r in the horizontal direction D1, and the dimension of the lower electrode 2n in the vertical direction D2 is the same as the dimension of the base electrode layer 5r in the vertical direction D2. The dimension of the lower electrode 2n in the horizontal direction D1 is smaller than the dimension of the ferroelectric layer 3t in the horizontal direction D1.

In this figure, reference numeral 120b denotes a groove along the first direction D1 in the respective memory cell capacitor 120a.

Next, a method of processing the lower electrode 2n, the base electrode layer 5r, the ferroelectric layer 3t, and the upper electrode 4r of the memory cell capacitor 120a will be briefly described.

According to the twentieth embodiment, formation of memory cell transistors, formation of an insulating film, and formation of contacts 1 are performed in the same manner as in the thirteenth embodiment.

After the contacts 1 are formed, a lower electrode layer is formed on the entire surface, and the lower electrode layer is processed into rectangular shapes so as to correspond to the individual memory cell capacitors, thereby forming the lower electrodes 2n.

An inter layer insulating film is formed thereon, then a groove is formed in the inter layer insulating film along the horizontal direction D1 so as to reach the lower electrode, and a base electrode layer for three-dimensional structure is formed thereon. The base electrode layer is processed to form the base electrode 5r for the respective memory cell.

Further, a ferroelectric layer and an upper electrode layer are formed, and the ferroelectric layer and the upper electrode layer are processed into stripe shape that is parallel to the first direction D1, so as to extend over the plural contacts 1 which are arranged along the first direction D1, thereby forming the ferroelectric layer 3r and the upper electrode 4r, respectively.

Thus, a memory cell structure of the ferroelectric memory device 120 according to the twentieth embodiment is completed.

As described above, according to the twentieth embodiment, since the ferroelectric layer and the upper electrode layer according to the eighteenth embodiment are simultaneously patterned to form the ferroelectric layer 3t and the upper electrode 4r of the capacitor, a memory cell capacitor of three-dimensional structure in which current leakage between the upper electrode and the lower electrode hardly occurs, the processing for realizing the memory cell structure can be easily performed, and further the capacitance of the capacitor can be increased, can be obtained in fewer steps.

Embodiment 21

Figure 21:
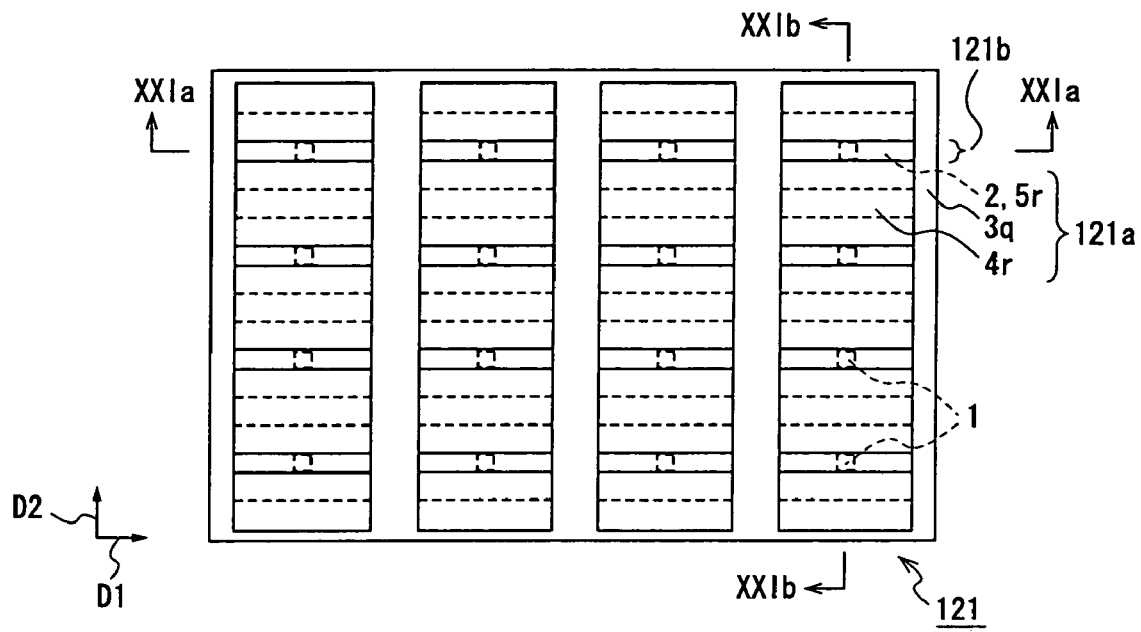
Figure 21:
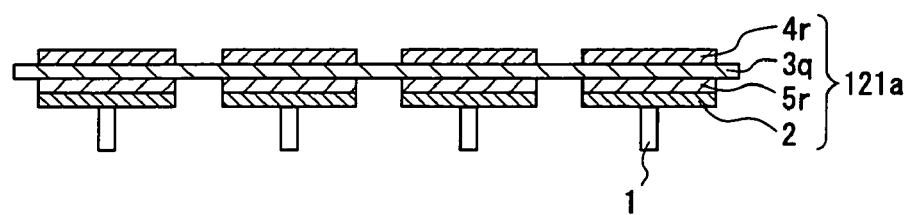
Figure 21:
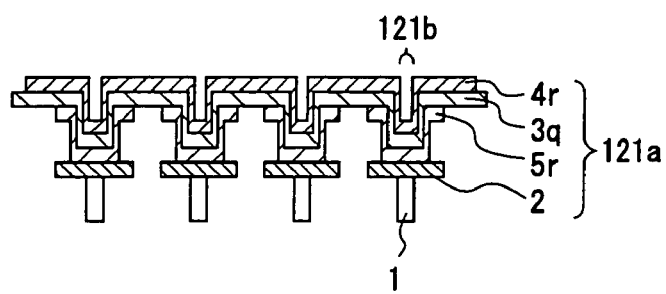

FIG. 21(a) is a diagram for explaining a ferroelectric memory device according to a twenty-first embodiment of the present invention, and shows a layout of electrodes in ferroelectric capacitors that constitute memory cells. FIGS. 21(b) and 21(c) are a cross-sectional view along the line XXIa-XXIa of FIG. 21(a) and a cross-sectional view along the line XXIb-XXIb of FIG. 21(a), respectively, and show cross-sectional structures of the ferroelectric capacitor.

A ferroelectric memory device 121 according to the twenty-first embodiment has a structure in which the ferroelectric layer 3r of the ferroelectric memory device 118 according to the eighteenth embodiment extends all over the memory cell array. Further, in processing steps of the memory cell capacitor according to the twenty-first embodiment, only the upper electrode is patterned after the ferroelectric layer and the upper electrode are formed, not patterning the ferroelectric layer after forming the ferroelectric layer like in the eighteenth embodiment.

To be more specific, a memory cell capacitor 121 according to the twenty-first embodiment consists of a lower electrode 2 that is formed on a substrate (not shown) via an insulating film (not shown), a base electrode layer 5r that is formed in a groove on the lower electrode 2 and on the circumference area of the groove, a ferroelectric layer 3q that is formed on the base electrode layer 5r, and an upper electrode 4r that is formed on the ferroelectric layer 3q. Here, the dimensions of the lower electrode 2 in the horizontal direction D1 and the vertical direction D2 are the same as those of the base electrode layer 5r in the horizontal direction D1 and the vertical direction D2, respectively. The dimension of the lower electrode 2 in the horizontal direction D1 is the same as the dimension of the upper electrode 4r in the horizontal direction D1.

In this figure, reference numeral 121b denotes a groove along the first direction D1 in the respective memory cell capacitor 121a.

Next, a method of processing the lower electrode 2, the base electrode layer 5r, the ferroelectric layer 3q, and the upper electrode 4r of the memory cell capacitor 121a will be briefly described.

In this twenty-first embodiment, formation of memory cell transistors, formation of an insulating film, and formation of contacts 1 are performed in the same manner as in the thirteenth embodiment.

After the contacts 1 are formed, a lower electrode layer is formed on the entire surface, and the lower electrode layer is processed into rectangular shapes so as to each correspond to the individual memory cell capacitor, thereby forming the lower electrodes 2.

An inter layer insulating film is formed thereon, then a groove is formed in the inter layer insulating film along the horizontal direction D1 so as to reach to the lower electrode, and a base electrode layer for three-dimensional structure is formed thereon. Thereafter, the base electrode layer is processed to form the base electrode layers 5r for the respective memory cells.

Further, a ferroelectric layer 3q and an upper electrode layer are formed, and only the upper electrode layer is processed into strip shape that is parallel to the first direction D1 so as to extend over the plural contacts 1 which are arranged along the first direction D1, thereby forming the upper electrode 4r.

Thus, the memory cell structure of the ferroelectric memory device 121 according to the twenty-first embodiment is completed.

As described above, according to the twenty-first embodiment, since the ferroelectric layer is retained all over the entire surface of memory cell, it is possible to realize a memory cell structure in which leakage between the upper electrode and the lower electrode more hardly occurs.

Embodiment 22

Figure 22A:
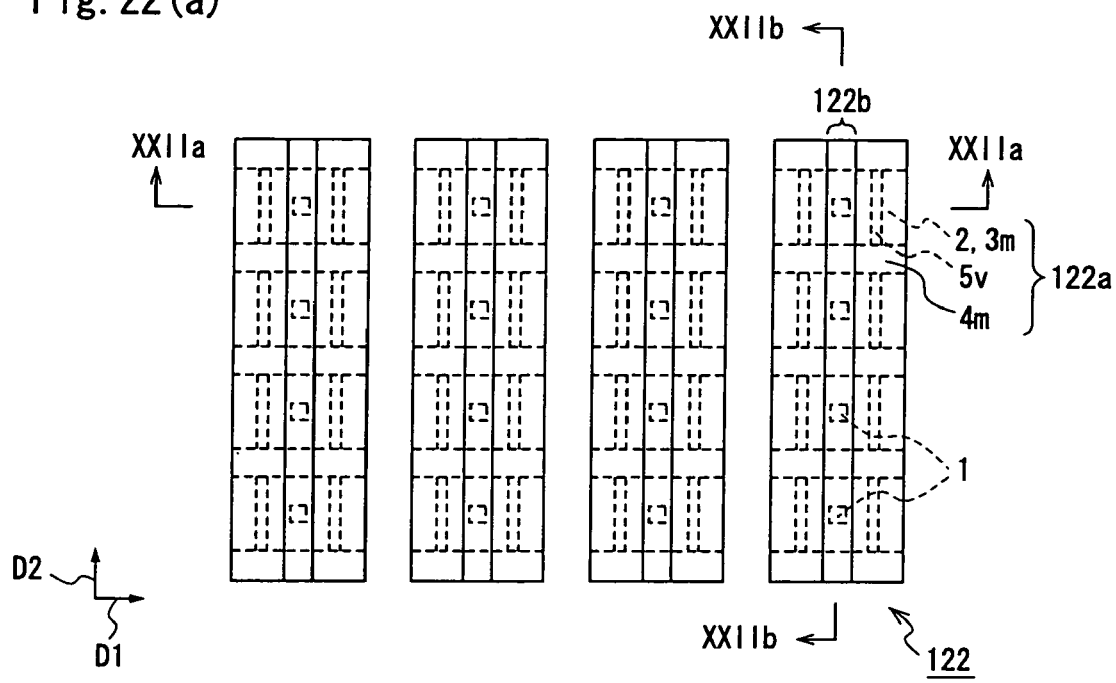
FIG. 22(a) is a diagram for explaining a ferroelectric memory device 122 according to a twenty-second embodiment of the present invention, and shows a layout of electrodes of ferroelectric capacitors 122a that constitute memory cells.
Figure 22B:
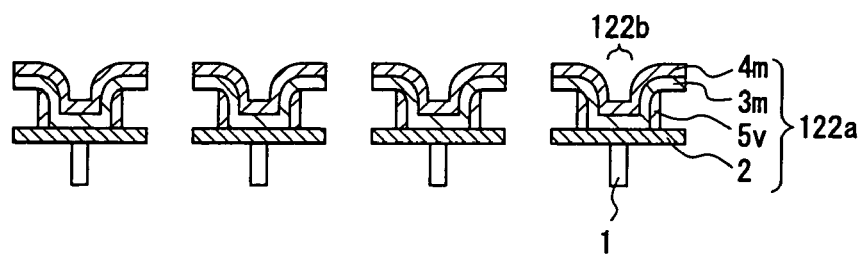
Figure 22C:
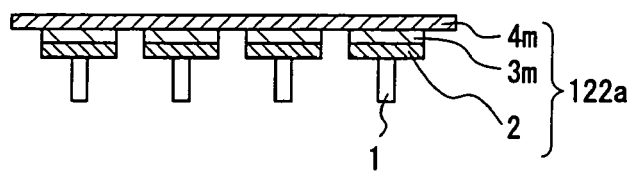

FIG. 22(a) is a diagram for explaining a ferroelectric memory device according to a twenty-second embodiment of the present invention, and shows a layout of electrodes in ferroelectric capacitors that constitutes memory cells. FIGS. 22(b) and 22(c) are a cross-sectional view along the line XXIIa-XXIIa of FIG. 22(a) and a cross-sectional view along the line XXIIb-XXIIb of FIG. 22(a), respectively, and show cross-sectional structures of the ferroelectric capacitor.

A ferroelectric memory device 122 according to the twenty-second embodiment has a side electrode layer 5v, in place of the base electrode layer 5 in the ferroelectric memory device 113 according to the thirteenth embodiment.

That is, in the thirteenth embodiment, the base electrode layer 5 of the capacitor is formed on the inner surfaces of the groove that is formed in the inter layer insulating film on the lower electrode 2 and the circumference area of the groove, while in this twenty-second embodiment, a base electrode is formed only on the side surfaces of a groove that is formed in the inter layer insulating film on the lower electrode 2. It is possible to form the base electrode layer also at the bottom of the groove, while in this embodiment the base electrode layer is formed only on the side surfaces of the groove.

More specifically, a memory cell capacitor 122a according to the twenty-second embodiment consists of a lower electrode 2 that is formed on a substrate (not shown) via an insulating film (not shown), a base electrode layer 5v that is formed on side walls of a groove extending over the plural lower electrodes 2, a ferroelectric layer 3m that is formed in the groove and on the circumference area thereof so as to cover the base electrode layer 5v, and an upper electrode 4m that is formed on the ferroelectric layer 3m. Here, the dimensions of the lower electrode 2 in the horizontal direction D1 and the vertical direction D2 are the same as those of the ferroelectric layer 3m in the horizontal direction D1 and the vertical direction D2, respectively. The dimension of the lower electrode 2 in the horizontal direction D1 is the same as the dimension of the upper electrode 4m in the horizontal direction D1.

In this figure, reference numeral 122b denotes a groove along the second direction D2 in the respective memory cell capacitor 122a.

Next, a method of processing the lower electrode 2, the base electrode layer 5v, the ferroelectric layer 3m, and the upper electrode 4m of the memory cell capacitor 122a will be briefly described.

In this twenty-second embodiment, formation of memory cell transistors, formation of an insulating film, and formation of contacts 1 are performed in the same manner as in the thirteenth embodiment.

After the contacts 1 are formed, a lower electrode layer is formed on the entire surface, and the lower electrode layer is processed into rectangular shapes so as to each correspond to the individual memory cell capacitor, thereby forming the lower electrodes 2.

An inter layer insulating film is formed thereon, then a groove is formed in the inter layer insulating film along the vertical direction D2 so as to reach the lower electrode, and a base electrode layer is formed on side surfaces of the groove along the vertical direction D2.

Further, a ferroelectric layer is formed on the entire surface, and the ferroelectric layer is processed into strip shape that is parallel to the first direction D1 so as to extend over the plural contacts 1 which are arranged along the first direction D1. At this time, the base electrode layer is processed so as to correspond to the individual memory cell capacitor, thereby forming the side electrode layer 5v. Then, an upper electrode layer is formed on the entire surface, and the upper electrode layer is processed into stripe shape that is parallel to the second direction D2 so as to extend over the plural contacts 1 which are arranged along the second direction D2. Further, the ferroelectric layer in the stripe shape that is parallel to the first direction D1 is processed in accordance with a planar pattern of the upper electrode 4m.

Thus, the memory cell structure of the ferroelectric memory device 122 according to the twenty-second embodiment is completed.

As described above, since according to the twenty-second embodiment a mask of a stripe shape along the horizontal direction D1 is used to process the lower electrode 2 and a mask of a stripe shape along the vertical direction D2 is used to process the upper electrode 4m, it is possible to ensure the size of an effective area in the memory cell capacitor without being affected by mask deviation.

In addition, the individual memory cell capacitor has a groove-type three-dimensional structure, it is easier to perform the processing for forming recessed portions in the inter layer insulating film, and when the ferroelectric layer is formed in the recessed portions, the thickness of the layer can be easily made thin, as compared to the conventional memory cell capacitor having a hole-type three-dimensional structure. Consequently, it is possible to realize the memory cell structure which is easy to process and can increase the capacitance of the capacitor.

Further, because the side electrode layer 5v is formed only the side surfaces of the groove, areas that may contact with the upper electrodes and cause current leakage can be reduced when the upper electrode layer is patterned.

Embodiment 23

Figure 23A:
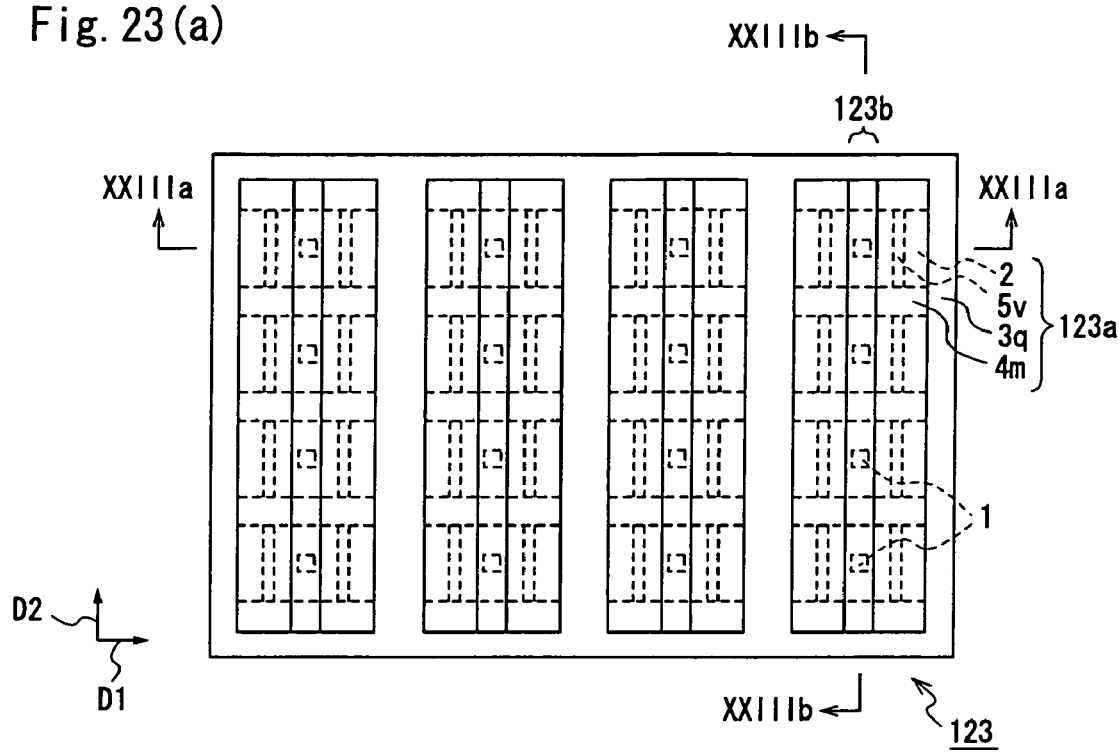
FIG. 23(a) is a diagram for explaining a ferroelectric memory device 123 according to a twenty-third embodiment of the present invention, and shows a layout of electrodes of ferroelectric capacitors 123a that constitute memory cells.
Figure 23B:
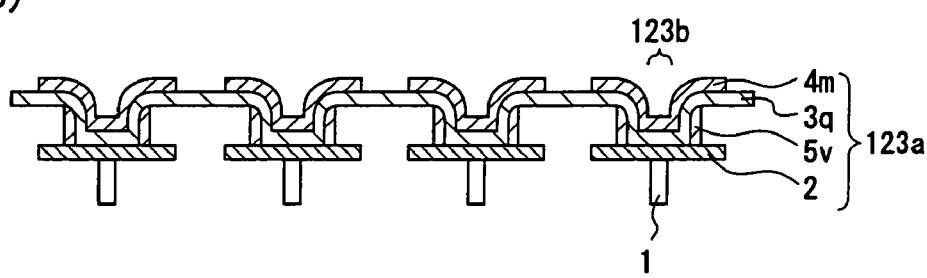
Figure 23C:
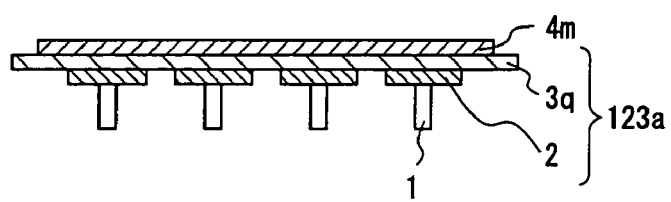

FIG. 23(a) is a diagram for explaining a ferroelectric memory device according to a twenty-third embodiment of the present invention, and shows a layout of electrodes in ferroelectric capacitors that constitutes memory cells. FIGS. 23(b) and 23(c) are a cross-sectional view along the line XXIIIa-XXIIIa of FIG. 23(a) and a cross-sectional view along the line XXIIIb-XXIIIb of FIG. 23(a), respectively, and show cross-sectional structures of the ferroelectric capacitor.

A ferroelectric memory device 123 according to the twenty-third embodiment includes a ferroelectric layer 3q extending over the entire memory cell array, in place of the ferroelectric layer 3m in the ferroelectric memory device 122 according to the twenty-second embodiment.

More specifically, a memory cell capacitor 123a according to the twenty-third embodiment consists of a lower electrode 2 that is formed on a substrate (not shown) via an insulating film (not shown), a side electrode layer 5v that is formed on side walls of a groove over the plural lower electrodes 2 which are arranged along the second direction D2, a ferroelectric layer 3q that is formed so as to extend over the entire memory cell array, and an upper electrode 4m that is formed on the ferroelectric layer 3q. Here, the dimension of the lower electrode 2 in the horizontal direction D1 is the same as the dimension of the upper electrode 4m in the horizontal direction D1.

In this figure, reference numeral 123b denotes a groove along the second direction D2 in the respective memory cell capacitor 123a.

Next, a method of processing the lower electrode 2, the side electrode layer 5v, the ferroelectric layer 3q, and the upper electrode 4m of the memory cell capacitor 123a will be briefly described.

In this twenty-third embodiment, formation of memory cell transistors, formation of an insulating film, and formation of contacts 1 are performed in the same manner as in the thirteenth embodiment.

After the contacts 1 are formed, a lower electrode layer is formed on the entire surface, and the lower electrode layer is processed into rectangular shapes each corresponding to the individual memory cell capacitor, thereby forming the lower electrodes 2.

An inter layer insulating film is formed thereon, then a groove is formed in the inter layer insulating film along the vertical direction D2 so as to reach the lower electrode, and an electrode layer as a side wall is formed on side surfaces of the groove along the vertical direction D2. This electrode layer is processed so as to correspond to the individual memory cell capacitor, thereby forming the side electrode layer 5v.

Thereafter, a ferroelectric layer 3q and an upper electrode layer are formed on the entire surface, and only the upper electrode layer is processed into stripe shape that is parallel to the second direction D2 so as to extend over the plural contacts 1 that are arranged along the second direction D2, thereby forming the upper electrode 4m.

Thus, the memory cell structure of the ferroelectric memory device 123 according to the twenty-third embodiment is completed.

As described above, since according to the twenty-third embodiment the base electrode layer is patterned so as to form the side electrode layer, then the ferroelectric layer and the upper electrode layer are formed thereon, and only the upper electrode layer is patterned before the ferroelectric layer is formed, it is possible to realize the memory cell structure in which there is no contacting portion between the upper electrode 4m and the side electrode 5v, as compared to the twenty-second embodiment in which the base electrode layer is patterned so as to form the side electrode layer after the ferroelectric layer is formed.

Further, because the direction along which the groove formed on the lower electrode of the memory cell capacitor extends is parallel to the direction along which the upper electrode extends, the edges of the upper electrode do not extend over the groove, whereby the upper electrode can be easily processed.

In this twenty-third embodiment, the memory cell has a structure in which the entire ferroelectric layer on the memory cell is retained, while even when the memory cell has a structure that is obtained by processing the ferroelectric layer simultaneously as the upper electrode layer using the same pattern, it is possible to realize the memory cell structure in which there is no contacting portion between the upper electrode 4m and the side electrode 5v.

Embodiment 24

Figure 24A:
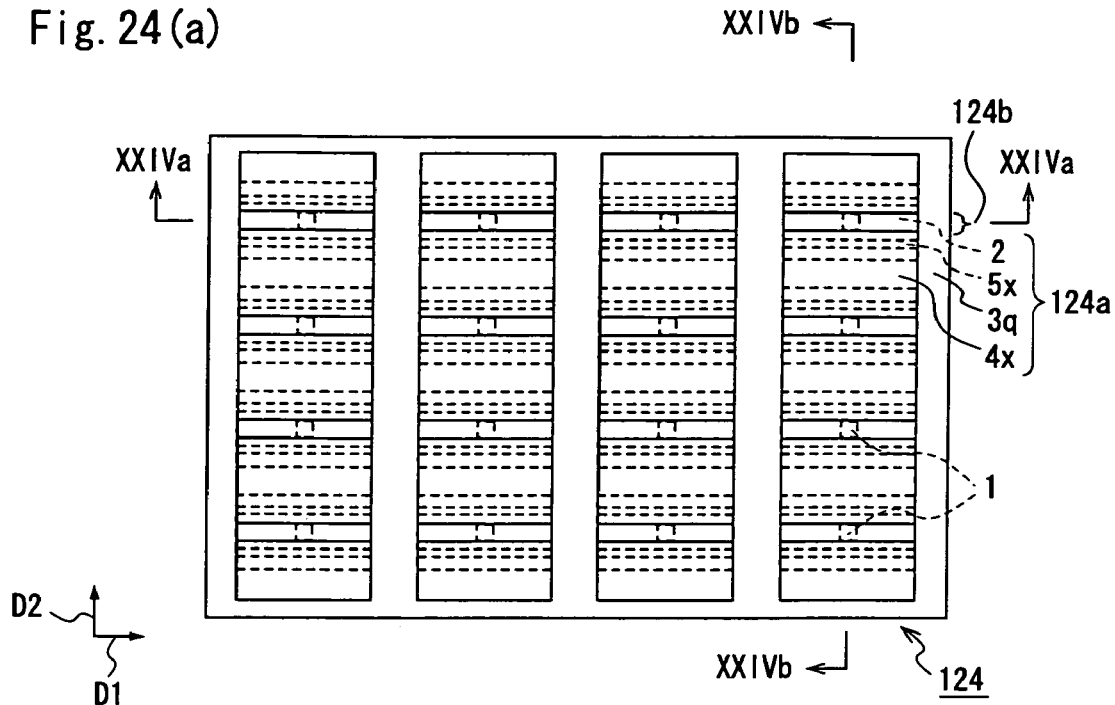
FIG. 24(a) is a diagram for explaining a ferroelectric memory device 124 according to a twenty-fourth embodiment of the present invention, and shows a layout of electrodes of ferroelectric capacitors 124a that constitute memory cells.
Figure 24B:
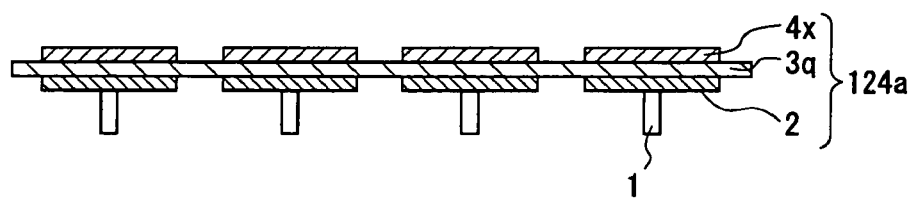
Figure 24C:
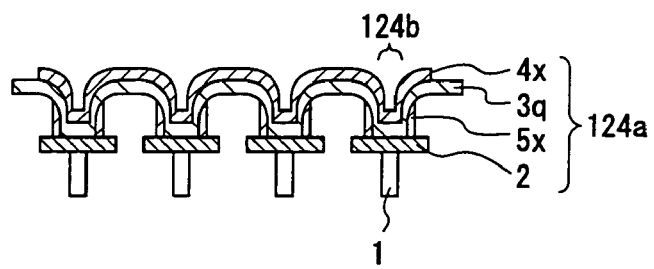
Figure 25A:
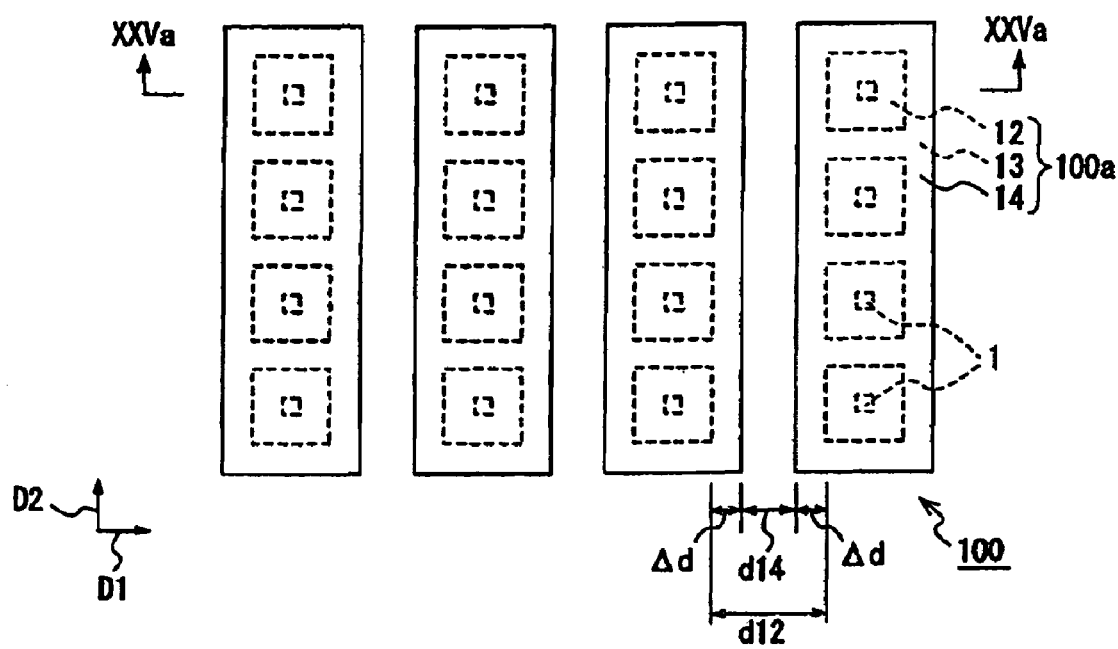
FIG. 25(a) is a diagram for explaining a prior art ferroelectric memory device 100, and shows a layout of electrodes of ferroelectric capacitors 100a that constitute memory cells.
Figure 25B:
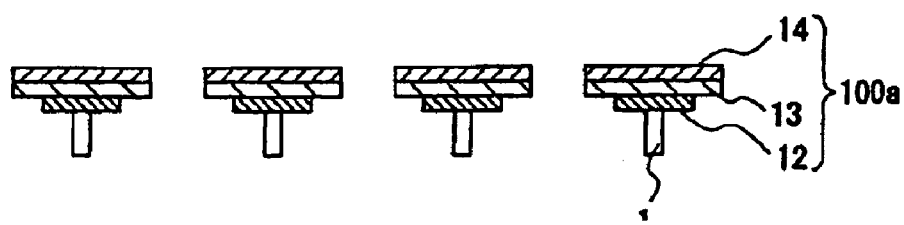
Figure 26A:
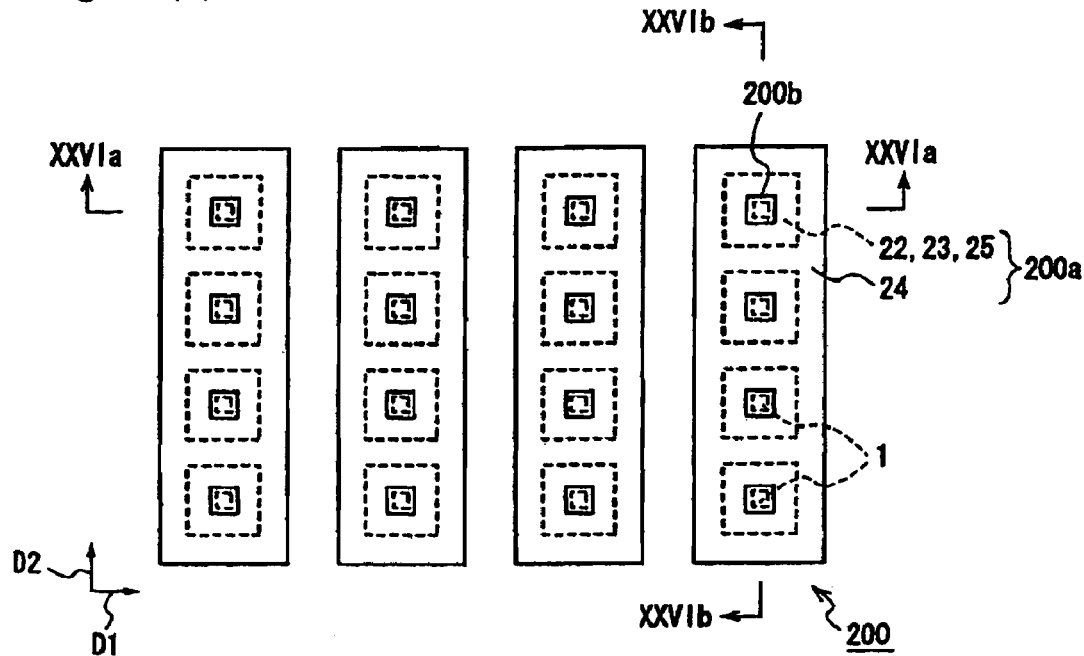
FIG. 26(a) is a diagram for explaining a prior art ferroelectric memory device 200, and shows a layout of electrodes of ferroelectric capacitors 200a that constitute memory cell.
Figure 26B:
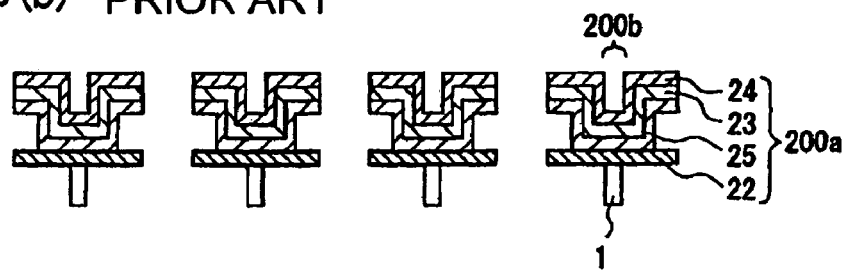
Figure 26C:
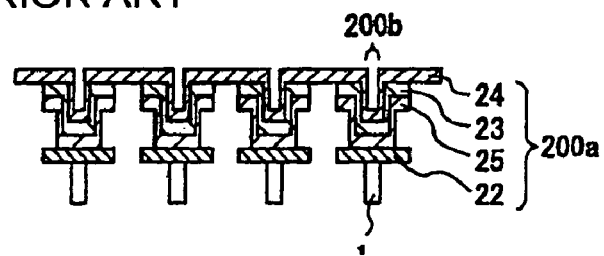

FIG. 24(a) is a diagram for explaining a ferroelectric memory device according to a twenty-fourth embodiment of the present invention, and shows a layout of electrodes in ferroelectric capacitors that constitutes memory cells. FIGS.

24(b) and 24(c) are a cross-sectional view along the line XXIVa-XXIVa of FIG. 24(a) and a cross-sectional view along the line XXIVb-XXIVb of FIG. 24(a), respectively, and show cross-sectional structures of the ferroelectric capacitor.

A ferroelectric memory device 124 according to the twenty-fourth embodiment has a groove-type three-dimension memory cell structure along the first direction D1, in place of the groove-type three-dimension memory cell structure along the second direction D2 in the ferroelectric memory device 122 according to the twenty-second embodiment.

To be more specific, a memory cell capacitor 124a according to the twenty-fourth embodiment consists of a lower electrode 2 that is formed on a substrate (not shown) via an insulating film (not shown), a side electrode layer 5x that is formed on side walls of a groove along the first direction D1, which is formed in the inter layer insulating film on the lower electrode 2, a ferroelectric layer 3q that is formed so as to extend over the entire memory cell array, and an upper electrode 4x that is formed on the ferroelectric layer 3q. Here, the dimension of the lower electrode 2 in the horizontal direction D1 is the same as the dimension of the upper electrode 4x in the horizontal direction D1.

In this figure, reference numeral 124b denotes a groove along the first direction D1 in the respective memory cell capacitor 124a.

Next, a method of processing the lower electrode 2, the base electrode 5x, the ferroelectric layer 3q, and the upper electrode 4x of the memory cell capacitor 124a will be briefly described.

In this twenty-fourth embodiment, the formation of memory cell transistors, the formation of an insulating film, and the formation of contact is are performed in the same manner as in the thirteenth embodiment.

After the contacts 1 are formed, a lower electrode layer is formed on the entire surface, and the lower electrode layer is processed into rectangular shapes each corresponding to the individual memory cell capacitor, thereby forming the lower electrodes 2.

An inter layer insulating film is formed thereon, then a groove is formed in the inter layer insulating film along the horizontal direction D1 so as to reach the lower electrode, and a base electrode layer as a side wall is formed in the groove on the side surfaces along the horizontal direction D1. The base electrode layer is processed so as to correspond to the individual memory cell capacitor, thereby forming the side electrode layer 5x.

Thereafter, a ferroelectric layer 3q and an upper electrode are formed on the entire surface, and only the upper electrode layer is processed in stripe shape that is parallel to the vertical direction D2 so as to extend over the plural contacts 1 that are arranged along the vertical direction D2, thereby forming the upper electrode 4x.

Thus, the memory cell structure of the ferroelectric memory device 124 according to the twenty-fourth embodiment is completed.

As described above, according to the twenty-fourth embodiment, since the base electrode layer is patterned into the side electrode layer before forming the ferroelectric layer, thereafter the ferroelectric layer and the upper electrode layer are formed, and only the upper electrode layer is patterned to form the upper electrode, it is possible to realize the memory cell structure in which there is no contacting portion between the upper electrode layer 4 and the side electrode layer 5x, relative to the structure that is obtained by patterning the base electrode layer into the side electrode layer after forming the ferroelectric layer as in the twenty-second embodiment.

Further, according to the twenty-fourth embodiment, because the direction along which the groove formed on the lower electrode in the memory cell capacitor extends is perpendicular to the direction along which the upper electrode extends, an area in which the upper electrode and the lower electrode oppose to each other has a plane shape that is longer in the direction perpendicular to the direction along which the upper electrode extends, whereby it is possible to effectively increase the capacitance of the capacitor.

In the twenty-second to twenty-fourth embodiments, the base electrode layer is formed as the side electrode layer 5v or 5x only on the side surfaces of the groove that is formed in the inter layer insulating film on the lower electrode 2, while when the side electrode layer is formed, it is possible to form the base electrode layer not only on the side surfaces of the groove but also the surface of the lower electrode exposed at the bottom of the groove. In this case, an electrode layer having the same composition as the side electrode layer is formed also on the exposed surface of the lower electrode within the groove, in the same step as that of forming the side electrode layer, whereby it is possible to uniformalize the characteristics of the ferroelectric layer that is formed on the electrode layer on the side surface and at the bottom of the groove.

Embodiments of the present invention are not limited to the aforementioned first to twenty-fourth embodiments, and it goes without saying that a memory cell structure in which the memory cell structures according to any of these embodiments are combined can be constructed and included in the present invention.

Furthermore, in the above-mentioned embodiments, a plane-type structure or a groove-type three-dimensional structure is described as the structure of the memory cell capacitor, while the present invention can also apply to a hole-type three-dimensional structure or a cylinder-type three-dimensional structure.

The ferroelectric memory device according to the present invention can reduce the size of the memory cell, and it is particularly useful in the capacitor structure of the ferroelectric memory device.

The invention claimed is:

1. A ferroelectric memory device comprising a plurality of memory cells, each memory cell of the plurality of memory cells including a respective memory cell transistor and a respective memory cell capacitor, and the plurality of memory cells being arranged in a matrix along a first direction and along a second direction that is perpendicular to the first direction,
    wherein each respective memory cell capacitor of the plurality of memory cells comprises:
        a lower electrode connected to a bit line via the respective memory cell transistor;
        a ferroelectric layer formed on an upper surface of the lower electrode and having a width direction that is the same as a width direction of the lower electrode; and
        an upper electrode formed on an upper surface of the ferroelectric layer and having a width direction that is the same as the width direction of the lower electrode,
    wherein the lower electrode of each respective memory cell capacitor is independent from the lower electrodes of other memory cell capacitors, such that each respective memory cell capacitor includes a separate lower electrode,
    wherein each respective upper electrode of each respective memory cell capacitor of the plurality of memory cells that are only arranged along the second direction forms a continuous plate electrode covering only the respective independent lower electrodes of each respective memory cell capacitor of the plurality of memory cells that are only arranged along the second direction, and wherein the width of each respective upper electrode in the first direction is narrower than the width of each respective ferroelectric layer in the first direction.

2. The ferroelectric memory device as defined in claim 1 wherein the width of each respective independent lower electrode in the first direction is narrower than the width of each respective ferroelectric layer in the first direction.

3. The ferroelectric memory device as defined in claim 2 wherein the width of each respective upper electrode in the first direction and the width of each respective independent lower electrode in the first direction are substantially the same, and wherein a position of both edges along the second direction of each respective upper electrode and a position of both edges along the second direction of each respective independent lower electrode are substantially the same.

4. The ferroelectric memory device as defined in claim 2 wherein the width of each respective upper electrode in the first direction and the width of each respective independent lower electrode in the first direction are substantially the same, and wherein a position of both edges along the second direction of each respective upper electrode and a position of both edges along the second direction of each respective independent lower electrode are different from each other.

5. The ferroelectric memory device as defined in claim 1 wherein each respective independent lower electrode includes a groove-type structure.

6. The ferroelectric memory device as defined in claim 5 wherein a groove formed in each respective independent lower electrode extends along a direction that is parallel to a direction along which each respective upper electrode extends.

7. The ferroelectric memory device as defined in claim 5 wherein a direction along which a groove formed in each respective independent lower electrode extends is perpendicular to a direction along which each respective upper electrode extends.

8. A ferroelectric memory device comprising a plurality of memory cells, each memory cell of the plurality of memory cells including a respective memory cell transistor and a respective memory cell capacitor, and the plurality of memory cells being arranged in a matrix along a first direction and along a second direction that is perpendicular to the first direction, wherein each respective memory cell capacitor of the plurality of memory cells comprises:
a lower electrode connected to a bit line via the respective memory cell transistor;
a ferroelectric layer formed on an upper surface of the lower electrode; and
an upper electrode formed on an upper surface of the ferroelectric layer, wherein the lower electrode of each respective memory cell capacitor is independent from the lower electrodes of other memory cell capacitors, such that each respective memory cell capacitor includes a separate lower electrode, wherein each respective upper electrode of each respective memory cell capacitor of the plurality of memory cells that are only arranged along the second direction forms a continuous plate electrode covering only the respective independent lower electrodes of each respective memory cell capacitor of the plurality of memory cells that are only arranged along the second direction, wherein a position of one edge along the second direction of each respective upper electrode substantially aligns with a position of one edge along the second direction of each respective ferroelectric layer, and wherein another edge along the second direction of each respective upper electrode is inwardly located at a position relative to another edge along the second direction of each respective ferroelectric layer.

9. The ferroelectric memory device as defined in claim 8 wherein one edge along the second direction of each respective independent lower electrode is inwardly located at a position relative to one edge along the second direction of each respective upper electrode, and a position of another edge along the second direction of each respective independent lower electrode substantially aligns with a position of another edge along the second direction of each respective upper electrode.

10. A ferroelectric memory device comprising a plurality of memory cells, each memory cell of the plurality of memory cells including a respective memory cell transistor and a respective memory cell capacitor, and the plurality of memory cells being arranged in a matrix along a first direction and along a second direction that is perpendicular to the first direction, wherein each respective memory cell capacitor of the plurality of memory cells comprises:
a lower electrode connected to a bit line via the respective memory cell transistor;
a ferroelectric layer formed on an upper surface of the lower electrode; and
an upper electrode formed on an upper surface of the ferroelectric layer, wherein the lower electrode of each respective memory cell capacitor is independent from the lower electrodes of other memory cell capacitors, such that each respective memory cell capacitor includes a separate lower electrode, wherein each respective upper electrode of each respective memory cell capacitor of the plurality of memory cells that are only arranged along the second direction forms a continuous plate electrode covering only the respective independent lower electrodes of each respective memory cell capacitor of the plurality of memory cells that are only arranged along the second direction, wherein a position of one edge along the second direction of each respective upper electrode substantially aligns with a position of one edge along the second direction of each respective ferroelectric layer, wherein another edge along the second direction of each respective upper electrode is inwardly located at a position relative to another edge along the second direction of each respective ferroelectric layer, and wherein one edge along the second direction of each respective independent lower electrode is inwardly located at a position relative to one edge along the second direction of each respective ferroelectric layer, and a position of another edge along the second direction of each respective independent lower electrode substantially aligns with a position of another edge along the second position of each respective ferroelectric layer.

* * * * *

UNITED STATES PATENT AND TRADEMARK OFFICE
CERTIFICATE OF CORRECTION

| | |
|---|---|
| PATENT NO. | : 7,642,583 B2 |
| APPLICATION NO. | : 10/554541 |
| DATED | : January 5, 2010 |
| INVENTOR(S) | : Hiroshige Hirano |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 495 days.

Signed and Sealed this

Twenty-first Day of December, 2010

David J. Kappos
*Director of the United States Patent and Trademark Office*